US012720868B2

(12) United States Patent
Xiao et al.

(10) Patent No.: US 12,720,868 B2
(45) Date of Patent: Aug. 25, 2026

(54) DISPLAY SUBSTRATE, PREPARATION METHOD THEREFOR, AND DISPLAY APPARATUS

(71) Applicant: BOE Technology Group Co., Ltd., Beijing (CN)

(72) Inventors: Li Xiao, Beijing (CN); Haoliang Zheng, Beijing (CN); Minghua Xuan, Beijing (CN); Jiao Zhao, Beijing (CN); Yuzhen Guo, Beijing (CN); Xiaorong Cui, Beijing (CN); Chenyang Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 374 days.

(21) Appl. No.: 18/555,254

(22) PCT Filed: Dec. 22, 2022

(86) PCT No.: PCT/CN2022/141082

§ 371 (c)(1),
(2) Date: Oct. 13, 2023

(87) PCT Pub. No.: WO2024/130652

PCT Pub. Date: Jun. 27, 2024

(65) Prior Publication Data

US 2025/0081609 A1 Mar. 6, 2025

(51) Int. Cl.
*G09G 3/20* (2006.01)
*H10D 86/40* (2025.01)
(Continued)

(52) U.S. Cl.
CPC ........... *H10D 86/60* (2025.01); *H10D 86/441* (2025.01); *H10W 90/00* (2026.01);
(Continued)

(58) Field of Classification Search
CPC .... H10D 86/60; H10D 86/441; H10D 86/481; H01L 25/167; G09G 3/32;
(Continued)

(56) References Cited

U.S. PATENT DOCUMENTS 7,800,557 B2 9/2010 Kim
11,296,171 B2 4/2022 Mou et al.
(Continued)

FOREIGN PATENT DOCUMENTS

CN 103000654 A 3/2013
CN 107393911 A 11/2017
(Continued)

OTHER PUBLICATIONS

Office Action dated Mar. 11, 2024 for TW Patent Application No. 112128600 and English Translation.

*Primary Examiner* — Robert J Michaud

(57) ABSTRACT

A display substrate, a manufacturing method thereof and a display apparatus are provided. The display substrate includes a plurality of circuit units (Q), the plurality of circuit units (Q) includes at least a first circuit unit (Q1), a second circuit unit (Q2) and a third circuit unit (Q3), wherein the first circuit unit (Q1) includes at least a first drive transistor (DTFT1), the second circuit unit (Q2) includes at least a second drive transistor (DTFT2), the third circuit unit (Q3) includes at least a third drive transistor (DTFT3), the channel width of the first drive transistor (DTFT1) is larger than that of the second drive transistor (DTFT2) or the third drive transistor (DTFT3), and the channel length of the first drive transistor (DTFT1) is the same as that of the second drive transistor (DTFT2) or the third drive transistor (DTFT3).

17 Claims, 28 Drawing Sheets

(51) Int. Cl.
*H10D 86/60* (2025.01)
*H10W 90/00* (2026.01)
*G09G 3/32* (2016.01)

(52) U.S. Cl.
CPC ............ *G09G 3/2074* (2013.01); *G09G 3/32* (2013.01); *G09G 2300/0452* (2013.01); *G09G 2300/0819* (2013.01); *G09G 2300/0852* (2013.01); *G09G 2300/0861* (2013.01); *G09G 2320/0247* (2013.01); *H10D 86/481* (2025.01)

(58) Field of Classification Search
CPC ... G09G 2300/0452; G09G 2300/0819; G09G 2300/0852; G09G 2300/0861; G09G 2300/0247
See application file for complete search history.

(56) References Cited

U.S. PATENT DOCUMENTS

| | | | | |
|---|---|---|---|---|
| 2003/0179166 | A1 | 9/2003 | Li | |
| 2013/0063330 | A1 | 3/2013 | Eom | |
| 2019/0189703 | A1 | 6/2019 | Tomida et al. | |
| 2021/0376026 | A1* | 12/2021 | Mou | G09G 3/3233 |
| 2022/0005405 | A1 | 1/2022 | Aoki et al. | |
| 2022/0101781 | A1* | 3/2022 | Baumheinrich | G09G 3/32 |
| 2022/0223101 | A1 | 7/2022 | Wu et al. | |
| 2022/0351683 | A1 | 11/2022 | Xiao et al. | |
| 2022/0392402 | A1 | 12/2022 | Ueda et al. | |
| 2023/0351943 | A1 | 11/2023 | Xiao et al. | |
| 2023/0360586 | A1 | 11/2023 | Xiao et al. | |
| 2024/0038142 | A1 | 2/2024 | Han et al. | |

FOREIGN PATENT DOCUMENTS

| | | | |
|---|---|---|---|
| CN | 107452783 | A | 12/2017 |
| CN | 111429834 | A | 7/2020 |
| CN | 112542126 | A | 3/2021 |
| CN | 113012634 | A | 6/2021 |
| CN | 113327947 | A | 8/2021 |
| CN | 113410279 | A | 9/2021 |
| CN | 114038423 | A | 2/2022 |
| CN | 114299868 | A | 4/2022 |
| CN | 114766048 | B | 8/2023 |
| CN | 115485763 | B | 3/2024 |
| JP | 2008249919 | A | 10/2008 |
| JP | 2012237931 | A | 12/2012 |
| TW | I375942 | B | 11/2012 |
| WO | 2021104428 | A1 | 6/2021 |
| WO | 2022222055 | A1 | 10/2022 |

* cited by examiner

DISPLAY SUBSTRATE, PREPARATION METHOD THEREFOR, AND DISPLAY APPARATUS

CROSS-REFERENCE TO RELATED APPLICATION

The present application is a U.S. National Phase Entry of International Application No. PCT/CN2022/141082 having an international filing date of Dec. 22, 2022. The above-identified application is hereby incorporated by reference.

TECHNICAL FIELD

The present disclosure relates to, but is not limited to, the field of display technologies, and particularly to a display substrate, a method for manufacturing the display substrate, and a display apparatus.

BACKGROUND

A semiconductor Light Emitting Diode (LED) technology has developed for nearly 30 years, from an initial solid-state lighting power supply to a backlight in the display field, and then to an LED display screen, providing a solid foundation for its wider applications. Among them, with the development of chip fabrication and packaging technology, sub-millimeter light-emitting diode (such as Mini Light Emitting Diode, Mini LED) display and Micro Light Emitting Diode (Micro LED) display have gradually become a hot spot for display panels, which can be used in AR/VR, TV and outdoor display fields.

Although the current display market is dominated by two technologies, Liquid Crystal Display (LCD) and Organic Light Emitting Diode (OLED), it is difficult for LCD and OLED to achieve large-size display, especially over 110 inches, due to the limitations of substrate size, preparation equipment and process. In contrast, Micro LED display/Mini LED display may implement large-size display by splicing, which can break the size limitation. As LED has the advantages of self-illumination, a wide viewing angle, fast response, a simple structure, a small volume, lightness and thinness, energy saving, high efficiency, long life, and clear light, etc., it is easier to achieve high resolution (Pixels Per Inch, PPI), so it is considered as the most competitive next generation display technology.

SUMMARY

The following is a summary of subject matter described herein in detail. The summary is not intended to limit the protection scope of claims.

In one aspect, an embodiment of the present disclosure provides a display substrate including a drive circuit layer disposed on a base substrate, the drive circuit layer includes a plurality of circuit units comprising at least a first circuit unit, a second circuit unit and a third circuit unit, the first circuit unit comprises a first pixel drive circuit comprising at least a first drive transistor, the second circuit unit comprises a second pixel drive circuit comprising at least a second drive transistor, the third circuit unit comprises a third pixel drive circuit comprising at least a third drive transistor; a channel width of the first drive transistor is larger than that of the second drive transistor or the third drive transistor, and a channel length of the first drive transistor is the same as that of the second drive transistor or the third drive transistor.

In an exemplary embodiment, a ratio of the channel width of the first drive transistor to the channel width of the second drive transistor or the third drive transistor is 2 to 6.

In an exemplary embodiment, the channel width of the second drive transistor is substantially the same as that of the third drive transistor, and the channel length of the second drive transistor is substantially the same as that of the third drive transistor.

In an exemplary embodiment, the first pixel drive circuit further comprises a first storage capacitor, the second pixel drive circuit further comprises a second storage capacitor, and the third pixel drive circuit further comprises a third storage capacitor; the capacitance value of the first storage capacitor is greater than or equal to the capacitance value of the second storage capacitor or the third storage capacitor.

In an exemplary embodiment, the area of an orthographic projection of the first storage capacitor on the base substrate is larger than the area of an orthographic projection of the second storage capacitor or the third storage capacitor on the base substrate.

In an exemplary embodiment, a first length of an orthographic projection of the first storage capacitor on the base substrate is the same as a first length of an orthographic projection of the second storage capacitor or the third storage capacitor on the base substrate, a second length of an orthographic projection of the first storage capacitor on the base substrate is greater than or equal to a second length of an orthographic projection of the second storage capacitor or the third storage capacitor on the base substrate, the first length is a dimension in a first direction, the second length is a dimension in a second direction, and the first direction intersects the second direction.

In an exemplary embodiment, a ratio of the second length of an orthographic projection of the first storage capacitor on the base substrate to the second length of an orthographic projection of the second storage capacitor or the third storage capacitor on the base substrate is 1 to 2.

In an exemplary embodiment, the first length of an orthographic projection of the second storage capacitor on the base substrate is substantially the same as the first length of an orthographic projection of the third storage capacitor on the base substrate, and the second length of an orthographic projection of the second storage capacitor on the base substrate is substantially the same as the second length of an orthographic projection of the third storage capacitor on the base substrate.

In an exemplary embodiment, the display substrate further comprises a light emitting structure layer disposed on a side of the drive circuit layer away from the base substrate, the light emitting structure layer comprises a plurality of light emitting units, the plurality of light emitting units comprise at least a red light emitting diode emitting red light, a green light emitting diode emitting green light, and a blue light emitting diode emitting blue light, the red light emitting diode is connected to the first pixel drive circuit, the green light emitting diode is connected to the second pixel drive circuit, and the blue light emitting diode is connected to the third pixel drive circuit.

In an exemplary embodiment, at least one circuit unit comprises a high-voltage connection line extending along a first direction and a high-voltage power supply line extending along a second direction, the high-voltage power supply line is connected to the high-voltage connection line through a via to form a net-like connecting structure for transmitting a high-voltage power supply signal, the first direction intersects the second direction.

In an exemplary embodiment, at least one circuit unit comprises a low-voltage connection line extending along a first direction and a low-voltage power supply line extending along a second direction, the low-voltage power supply line is connected to the low-voltage connection line through a via to form a net-like connecting structure for transmitting a low-voltage power supply signal, the first direction intersects the second direction.

In an exemplary embodiment, the low-voltage power supply line comprises a first low-voltage power supply line connected to a red light emitting diode and a second low-voltage power supply line connected to a green light emitting diode and a blue light emitting diode.

In an exemplary embodiment, at least one circuit unit comprises a first low-voltage connection line extending along the first direction, and the first low-voltage power supply line is connected to the first low-voltage connection line through a via to form a net-like connecting structure for transmitting a first low-voltage power supply signal.

In an exemplary embodiment, at least one circuit unit comprises a second low-voltage connection line extending along the first direction, and the second low-voltage power supply line is connected to the second low-voltage connection line through a via to form a net-like connecting structure for transmitting a second low-voltage power supply signal.

In an exemplary embodiment, at least one circuit unit comprises a high-frequency connection line extending in a first direction and a high-frequency signal line extending in a second direction, the high-frequency signal line is connected to the high-frequency connection line through a via to form a net-like connecting structure for transmitting a high-frequency signal, the first direction intersects the second direction.

In an exemplary embodiment, the display substrate further comprises a test circuit and a plurality of data signal lines extending along a direction of a unit column and connected to the pixel drive circuit, the detection circuit comprises at least a plurality of detection units and a plurality of transmission lines, the plurality of detection units are correspondingly connected to the plurality of data signal lines through the plurality of transmission lines, and a shielding line is provided between at least one transmission line and an adjacent transmission line, the shielding line is connected to a constant voltage signal line or a ground signal line.

In an exemplary embodiment, the distance between the at least one transmission line and the shielding line adjacent to the transmission line is 10 μm to 20 μm.

In an exemplary embodiment, the transmission line and the shielding line are disposed on the same layer.

In another aspect, the present disclosure further provides a display apparatus including the display substrate described above.

In another aspect, the present disclosure further provides a method for preparing a display substrate, including: Forming a drive circuit layer on a base substrate, the drive circuit layer includes a plurality of circuit units comprising at least a first circuit unit, a second circuit unit and a third circuit unit, the first circuit unit comprises a first pixel drive circuit comprising at least a first drive transistor, the second circuit unit comprises a second pixel drive circuit comprising at least a second drive transistor, the third circuit unit comprises a third pixel drive circuit comprising at least a third drive transistor; a channel width of the first drive transistor is larger than that of the second drive transistor or the third drive transistor, and a channel length of the first drive transistor is the same as that of the second drive transistor or the third drive transistor.

Other aspects may be understood upon reading and understanding accompanying drawings and detailed description.

BRIEF DESCRIPTION OF DRAWINGS

The accompanying drawings are used for providing further understanding of technical solutions of the present disclosure, constitute a part of the specification, and are used for explaining the technical solutions of the present disclosure together with the embodiments of the present disclosure, but do not constitute limitations on the technical solutions of the present disclosure. Shapes and sizes of one or more components in the drawings do not reflect actual scales, and are only intended to schematically describe contents of the present disclosure.

Figure 1:
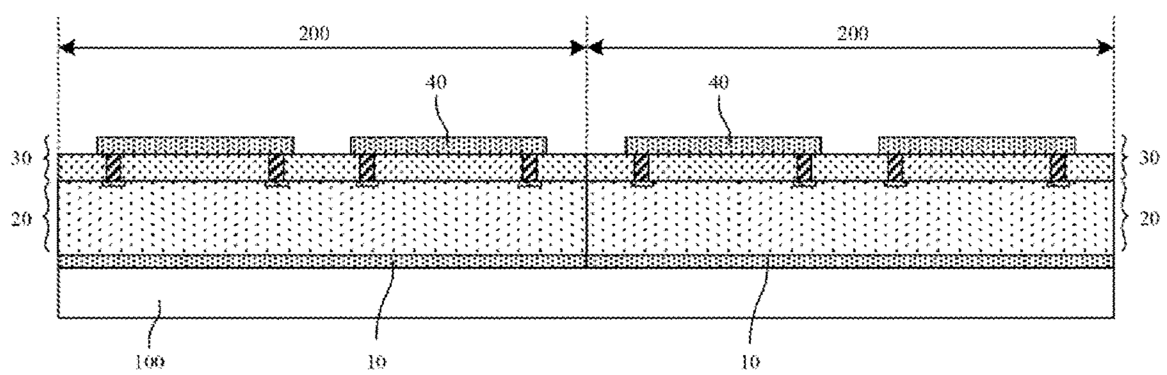
FIG. 1 is a schematic diagram of a structure of a display apparatus.

Reference signs are described as follows.

AA-display region;
AT1- First active layer;
AT2-Second active layer;
AT3-Third active layer;
AT4-Fourth active layer;
AT5-Fifth active layer;
AT6-Sixth active layer;
AT7-Seventh Active Layer;
AT8-Eighth active layer;
AT9-Ninth Active Layer;
AT10-Tenth active layer;
AT11-Eleventh active layer;
AT12-Twelfth active layer;
CF1- First plate;
CF2-Second plate;
CF3-Third plate;
CF4-Fourth plate;
CF5-Fifth plate;
CF6-Sixth plate;
CF7-Seventh plate;
CF8-Eighth plate;
CF9-Ninth plate;
Cs1- First storage capacitor;
Cs2- Second storage capacitor;
Cs3- Third storage capacitor;
CT1-First control line;
CT2-Second control line;
C1- First capacitor;
C2-Second capacitor;
DTFT1-First Drive Transistor;
DTFT2- Second drive transistor;
DTFT3-Third Drive Transistor;
DataI-Data signal line;
DataT-Duration signal line;
EM-Light emitting signal line;
FA-Bonding region;
Gate1- First gate electrode;
Gate2- Second gate electrode;
Gate3-B-Third bottom gate electrode;
Gate3-T-Third top gate electrode;
Gate4-Fourth gate electrode;
Gate 5-Fifth gate electrode;
Gate 6-Sixth gate electrode;
Gate 7-Seventh gate electrode;
Gate 8-Eighth gate electrode;
Gate9-Ninth gate electrode;
Gate 10-Tenth gate electrode;
Gate 11-Eleventh gate electrode;
Gate 12-Twelfth gate electrode;
Hf-High-frequency signal line;
Hf-C-High frequency connection line;
S1- First scan signal line;
S2- Second scan signal line;
VDD- high-voltage power supply line;
VDD-C-High voltage connection line;
VSS-Low voltage power supply line;
VSS-C-Low-voltage connection line;
Vint-Initial signal line;
10- Base substrate;
11-Power supply electrode;
12-Anode connection block;
13- Anode connection electrode;
20-Drive circuit layer;
30- Light emitting structure layer;
40-Light emitting diode;

-continued

100-Motherboard;
200-Display substrate;
210- Detection unit;
220- Control line;
230-Detection line;
240-Transmission line;
250-Shielding line.

DETAILED DESCRIPTION

To make objectives, technical solutions, and advantages of the present disclosure clearer, the embodiments of the present disclosure will be described in detail with reference to the accompanying drawings. It is to be noted that implementations may be practiced in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following embodiments only. The embodiments in the present disclosure and features in the embodiments may be combined randomly with each other if there is no conflict.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. A quantity of pixels in a display substrate and a quantity of sub-pixels in each pixel are not limited to numbers shown in the drawings. The drawings described in the present disclosure are schematic structural diagrams only, and one mode of the present disclosure is not limited to shapes, numerical values, or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand specific meanings of these terms in the present disclosure according to specific situations.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be a source electrode, and the second electrode may be a drain electrode. In a case that transistors with opposite polarities are used, in a case that a direction of a current is changed during operation of a circuit, or the like, functions of the "source electrode" and the "drain electrode" are sometimes interchangeable. Therefore, the "source electrode" and the "drain electrode", as well as the "source terminal" and the "drain terminal" are interchangeable in the specification.

In this specification, a "connection" includes a case where constitute elements are connected together through an element with some electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 850 and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "thickness" and "height" refer to a vertical distance between a surface of a side of a film layer away from the base substrate and a surface of a side the film layer close to the base substrate.

Triangle, rectangle, trapezoid, pentagon and hexagon in this specification are not strictly defined, and they may be approximate triangle, rectangle, trapezoid, pentagon or hexagon, etc.

There may be some small deformation caused by tolerance, and there may be chamfer, arc edge and deformation, etc.

In the present disclosure, "about" refers to that a boundary is defined not so strictly and numerical values within process and measurement error ranges are allowed.

FIG. 1 is a schematic diagram of a structure of a display apparatus. As shown in FIG. 1, a main body structure of a large-size display apparatus may include a plurality of display substrates 200 provided on a motherboard 100, and the plurality of display substrates 100 are tightly spliced together for image display. On a plane perpendicular to the display substrate, at least one display substrate 200 may include at least a drive circuit layer 20 disposed on the base substrate 10 and a light emitting structure layer 30 disposed on a side of the drive circuit layer 20 away from the base substrate. On a plane parallel to the display substrate, the drive circuit layer 20 may include a plurality of circuit units, at least one of which may include a pixel drive circuit and a plurality of signal lines connected to the pixel drive circuit, the pixel drive circuit is configured to receive a data voltage under the control of the signal lines and output a corresponding current. The light emitting structure layer 30 may include a plurality of light emitting units, at least one light emitting unit may include a light emitting diode 40, the light emitting diodes 40 in the plurality of light emitting units are correspondingly connected to pixel drive circuits in the plurality of circuit units, and the light emitting diode 40 is configured to emit light of a corresponding brightness under the drive of the output current from the corresponding pixel drive circuit.

In an exemplary embodiment, the circuit unit in the present disclosure refers to a region divided according to a pixel drive circuit, and the light emitting unit in the present disclosure refers to a region divided according to a light emitting diode. In an exemplary embodiment, the positions of both the light emitting unit and the circuit unit may correspond or the positions of the light emitting unit and the circuit unit may not correspond, which is not limited here in the present disclosure.

In an exemplary embodiment, the light emitting diode 40 may be a sub-millimeter light emitting diode such as a Mini LED or a micro light emitting diode (Micro LED).

Figure 2:
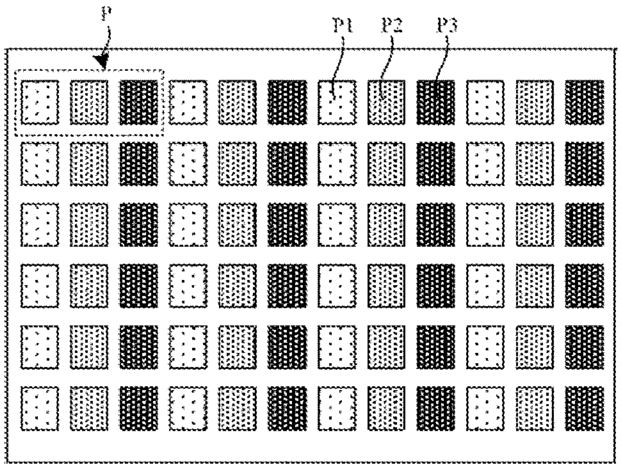
FIG. 2 is a schematic diagram of a planar structure of a display substrate.

FIG. 2 is a schematic diagram of a planar structure of a display substrate. As shown in FIG. 2, in a plane parallel to the display substrate, the display substrate may include a first sub-pixel P1 emitting a first color light, a second sub-pixel P2 emitting a second color light, and a third sub-pixel P3 emitting a third color light. In an exemplary embodiment, each sub-pixel may include a circuit unit and a light emitting unit. The first sub-pixel P1 may include a first circuit unit and a first light emitting unit, the first light emitting unit may include at least a first light emitting diode emitting light of a first color, and the first circuit unit may include at least a first pixel drive circuit connected with the first light emitting diode. The second sub-pixel P2 may include a second circuit unit and a second light emitting unit, the second light emitting unit may include at least a second light emitting diode emitting light of a second color, and the second circuit unit may include at least a second pixel drive circuit connected with the second light emitting diode. The third sub-pixel P3 may include a third circuit unit and a third light emitting unit, the third light emitting unit may include at least a third light emitting diode emitting light of a third color, and the third circuit unit may include at least a third pixel drive circuit connected to the third light emitting diode.

In an exemplary embodiment, the first sub-pixel P1 may be a red (R) sub-pixel emitting red light, the second sub-pixel P2 may be a green sub-pixel (G) emitting green light, the third sub-pixel P3 may be a blue (B) sub-pixel emitting blue light, and the R sub-pixel, G sub-pixel and B sub-pixel may form one pixel unit P. In an exemplary embodiment, the three sub-pixels in the pixel unit P may be arranged side by side horizontally, side by side vertically, or in a manner like a Chinese character "品", etc., and the present disclosure is not limited herein.

In an exemplary implementation, the pixel unit may include four sub-pixels, and the four sub-pixels may be arranged side by side horizontally, side by side vertically, in a square, in a diamond shape, or the like, which is not limited here in the present disclosure.

It is found that a sub-millimeter light emitting diode such as Mini LED and a micro light emitting diode (Micro LED) are limited by materials and processes, and the light output efficiency and yield of red LED (R chip for short) are quite different from those of blue LED and green LED (G/B chip for short). For example, when the white light brightness is 1000 nit, R chip/G chip/B chip of one specification should achieve brightness of 300 nit/600 nit/100 nit respectively. In this case, the driving current of R chip needs to reach about 20 A, while the driving current of G/B chip only needs to reach about 4 $\mu$A. If the driver transistor (DTFT) in the pixel driver circuit is designed according to the current requirements of G/B chip, the required current value of 4 $\mu$A can be reached when the gate-source voltage Vgs is 5V. However, under the same cross-voltage, the driver transistor of R chip cannot be reached the required current value of 20 $\mu$A when the gate-source voltage Vgs is 5V, which makes R chip unable to meet the brightness requirement. If the driver transistor is designed according to the current requirement of R chip, the G/B chip can be reached its required current at a low gate-source voltage Vgs, resulting in a small data range and unable to achieve more grayscales.

The present disclosure provides a display substrate. Pixel drive circuits for driving red light emitting diodes, green light emitting diodes, and blue light emitting diodes use different configurations to avoid disadvantages such as unsatisfactory brightness or inability to achieve more grayscales.

In an exemplary embodiment, the display substrate includes a drive circuit layer disposed on a base substrate and a light emitting structure layer disposed on a side of the drive circuit layer away from the base substrate, the drive circuit layer includes a plurality of circuit units forming a plurality of unit rows and a plurality of unit columns, the light emitting structure layer includes a plurality of light emitting units, at least a pixel drive circuit is included in the circuit unit, and at least a light emitting diode is included in the light emitting unit; the plurality of circuit units at least include a first circuit unit provided with a first pixel drive circuit, a second circuit unit provided with a second pixel drive circuit and a third circuit unit provided with a third pixel drive circuit, the plurality of light emitting diodes at least include a first light emitting diode emitting light of a first color, a second light emitting diode emitting light of a second color and a third light emitting diode emitting light of a third color, the first pixel drive circuit is connected with the first light emitting diode, the second pixel drive circuit is connected with the second light emitting diode, and the third light emitting diode is connected with the third light emitting diode; the first pixel drive circuit includes at least a first drive transistor and a first storage capacitor, the second pixel drive circuit includes at least a second drive transistor and a second storage capacitor, the third pixel drive circuit includes at least a third drive transistor and a third storage capacitor, the width-length ratio of the first drive transistor is greater than the width-length ratio of the second drive transistor or the third drive transistor, and the capacitance value of the first storage capacitor is greater than or equal to the capacitance value of the second storage capacitor or the third storage capacitor.

In an exemplary embodiment, the channel width of the first drive transistor is greater than that of the second drive transistor or the third drive transistor, and the channel length of the first drive transistor is substantially the same as that of the second drive transistor or the third drive transistor.

In an exemplary embodiment, the area of an orthographic projection of the first storage capacitor on the base substrate is larger than the area of an orthographic projection of the second storage capacitor or the third storage capacitor on the base substrate.

The display substrate of the present disclosure will be described below through several examples.

Figure 3:
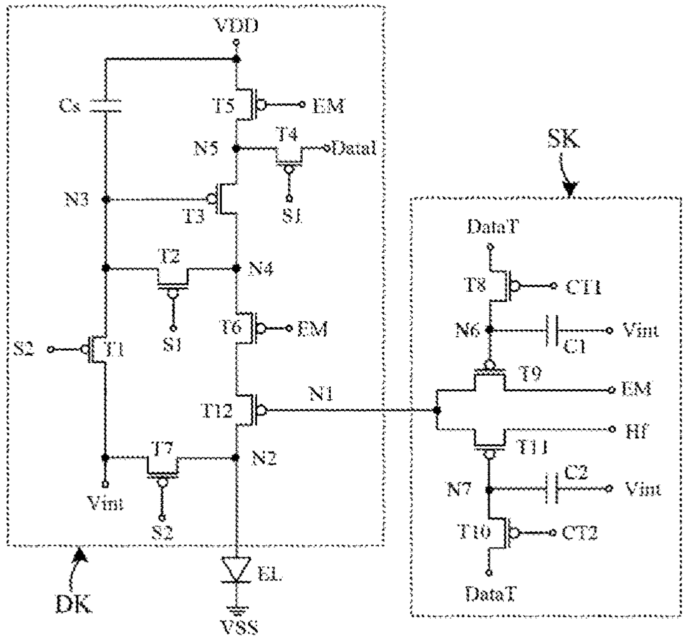
FIG. 3 is an equivalent circuit diagram of a pixel drive circuit in accordance with an exemplary embodiment of the present disclosure.

FIG. 3 is an equivalent circuit diagram of a pixel drive circuit according to an exemplary embodiment of the present disclosure, illustrating a 12T3C structure of a pixel drive circuit. In an exemplary embodiment, a plurality of light emitting diodes in the display substrate may be current-type driven. Due to the color coordinate drift and low external quantum efficiency of current-type light emitting diodes driven by low current density, the brightness uniformity is poor, so it is difficult to accurately represent low grayscale only by controlling the amplitude of current. The pixel drive circuit according to an exemplary embodiment of the present disclosure includes at least two types of data terminals: a current data terminal configured to supply current signals of different magnitude to the light emitting diodes and a duration data terminal configured to supply the duration of the current signals described above to the light emitting diodes.

As shown in FIG. 3, the pixel drive circuit according to the present exemplary embodiment may include at least a current control sub-circuit DK and a duration control sub-circuit SK. The current control sub-circuit DK may include at least a first transistor T1, a second transistor T2, a third transistor T3, a fourth transistor T4, a fifth transistor T5, a sixth transistor T6, a seventh transistor T7, a twelfth transistor T12 and a storage capacitor Cs, and the duration control sub-circuit SK may include at least an eighth transistor T8, a ninth transistor T9, a tenth transistor T10, an eleventh transistor T11, a first capacitor C1 and a second capacitor C2.

In an exemplary embodiment, the pixel drive circuit may include at least a first Node N1, a second Node N2, a third Node N3, a fourth Node N4, a fifth Node N5, a sixth Node N6, and a seventh Node N7. The first node N1 is respectively connected to a second electrode of the ninth transistor T9, a second electrode of the eleventh transistor T11 and a gate electrode of the twelfth transistor T12, the second node N2 is respectively connected to a second electrode of the seventh transistor T7, a second electrode of the twelfth transistor T12 and an anode of the light emitting diode EL, the third node N3 is respectively connected to a second electrode of the first transistor T1, a first electrode of the second transistor T2, a gate electrode of the third transistor T3 and a first end of the storage capacitor Cs, the fourth node N4 is respectively connected to a second electrode of the second transistor T2, a second electrode of the third transistor T3 and a first electrode of the sixth transistor T6, the fifth node N5 is connected to a first electrode of the third transistor T3, a second electrode of the fourth transistor T4 and a second electrode of the fifth transistor T5, respectively, the sixth node N6 is connected to a second electrode of the eighth transistor T8, a gate electrode of the ninth transistor T9 and a first end of the first capacitor C1, respectively, and the seventh node N7 is connected to a second electrode of the tenth transistor T10, a gate electrode of the eleventh transistor T11 and a first end of the second capacitor C2, respectively.

In an exemplary embodiment, a gate electrode of the first transistor T1 is connected to a second scan signal line S2, a first electrode of the first transistor T1 is connected to an initial signal line Vint, and a second electrode of the first transistor T1 is connected to the third node N3.

In an exemplary embodiment, a gate electrode of the second transistor T2 is connected to a first scan signal line S1, the first electrode of the second transistor T2 is connected to the third node N3, and the second electrode of the second transistor T2 is connected to the fourth node N4.

In an exemplary embodiment, the gate electrode of the third transistor T3 is connected to the third node N3, the first electrode of the third transistor T3 is connected to the fifth node N5, and the second electrode of the third transistor T3 is connected to the fourth node N4.

In an exemplary embodiment, a gate electrode of the fourth transistor T4 is connected with the first scan signal line S1, a first electrode of the fourth transistor T4 is connected with the data signal line DataI, and the second electrode of the fourth transistor T4 is connected with the fifth node N5.

In an exemplary embodiment, a gate electrode of the fifth transistor T5 is connected to a light emitting signal line EM, a first electrode of the fifth transistor T5 is connected to a first power supply line VDD, and a second electrode of the fifth transistor T5 is connected to the fifth node N5.

In an exemplary embodiment, a gate electrode of the sixth transistor T6 is connected to the light emitting signal line EM, a first electrode of the sixth transistor T6 is connected to the fourth node N4, and a second electrode of the sixth transistor T6 is connected to a first electrode of the twelfth transistor T12.

In an exemplary embodiment, a gate electrode of the seventh transistor T7 is connected to the second scan signal line S2, a first electrode of the seventh transistor T7 is connected to the initial signal line Vint, and the second electrode of the seventh transistor T7 is connected to the second node N2.

In an exemplary embodiment, a gate electrode of the eighth transistor T8 is connected to a first control line CT1, a first electrode of the eighth transistor T8 is connected to a duration signal line DataT, and a second electrode of the eighth transistor T8 is connected to the sixth node N6.

In an exemplary embodiment, the gate electrode of the ninth transistor T9 is connected to the sixth node N6, a first electrode of the ninth transistor T9 is connected to the light emitting signal line EM, and the second electrode of the ninth transistor T9 is connected to the first node N1.

In an exemplary embodiment, a gate electrode of the tenth transistor T10 is connected to a second control line CT2, a first electrode of the tenth transistor T10 is connected to the duration signal line DataT, and the second electrode of the tenth transistor T10 is connected to the seventh node N7.

In an exemplary embodiment, the gate electrode of the eleventh transistor T11 is connected to the seventh node N7, a first electrode of the eleventh transistor T11 is connected to a high-frequency signal line Hf, and the second electrode of the eleventh transistor T11 is connected to the first node N1.

In an exemplary embodiment, the gate electrode of the twelfth transistor T12 is connected to the first node N1, the first electrode of the twelfth transistor T12 is electrically connected to the second electrode of the sixth transistor T6, and the second electrode of the twelfth transistor T12 is connected to the second node N2.

In an exemplary embodiment, a first end of the storage capacitor Cs is connected to the third node N3, and a second end of the storage capacitor Cs is connected to the first power supply line VDD.

In an exemplary embodiment, a first end of the first capacitor C1 is connected to the sixth node N6, and a second end of the first capacitor C1 is connected to the initial signal line Vint.

In an exemplary embodiment, a first end of the second capacitor C2 is connected to the seventh node N7, and a second end of the second capacitor C2 is connected to the initial signal line Vint.

In an exemplary embodiment, the first transistor T1, the second transistor T2, the fourth transistor T4 to the twelfth transistor T12 may be switching transistors, and the third transistor T3 may be a drive transistor.

In an exemplary embodiment, the light emitting diode EL may be a Mini LED or a Micro LED. A first electrode of the light emitting diode EL is connected to the second node N2, and a second electrode of the light emitting diode EL is connected to a second power supply line VSS, the signal of which is a continuously supplied low-level signal, such as a DC low voltage. The signal of the first power supply line VDD is a continuously supplied high-level signal, such as a DC high voltage.

In an exemplary embodiment, the first to twelfth transistors T1 to T12 may be P-type transistors or may be N-type transistors. Use of the same type of transistors in the pixel drive circuit may simplify a process flow, reduce the process difficulty of a display panel, and improve the product yield. In some possible embodiments, the first transistor T1 to the twelfth transistor T12 may include P-type transistors and N-type transistors.

In an exemplary embodiment, the first transistor T1 to the twelfth transistor T12 may be low temperature poly-silicon transistors, or may be oxide transistors, or may be low temperature poly-silicon transistors and metal oxide transistors. An active layer of a low-temperature poly silicon transistor may be made of Low Temperature Poly Silicon (LTPS for short), and an active layer of a metal oxide transistor may be made of a metal oxide semiconductor (Oxide). A low-temperature poly silicon transistor has advantages such as a high migration rate and fast charging, and an oxide transistor has advantages such as low drain current. The low-temperature poly silicon transistor and the metal oxide transistor are integrated on one display substrate to form a Low Temperature Polycrystalline Oxide (LTPO for short) display substrate, so that advantages of the low-temperature poly silicon transistor and the metal oxide transistor may be utilized, low-frequency drive may be achieved, power consumption may be reduced, and display quality may be improved.

In an exemplary embodiment, taking the first transistor T1 and the twelfth transistor T12 in the pixel drive circuit shown in FIG. 3 as all P-type transistors as an example, the working process of the pixel drive circuit may include following operations.

In an exemplary embodiment, when a grayscale displayed by a light emitting diode to which the pixel drive circuit is connected is greater than a threshold grayscale, the working process of the pixel drive circuit may include an initialization stage, a writing stage, and a light emitting stage, and the initialization stage may include a first sub-stage and a second sub-stage. In the first and second sub-stages, the signals of the first scan signal line S1 and the light emitting signal line EM are high-level signals, the signal of the second scan signal line S2 is a low-level signal, and the first transistor T1 and the seventh transistor T7 are turned on. The first transistor T1 is turned on, so that the signal of the initial signal line Vint is written into the third node N3, the storage capacitor Cs is initialized (reset), and the original charge in the storage capacitor Cs is cleared. Because the first end of the storage capacitor C is at a low level, the third transistor T3 is turned on. The seventh transistor T7 is turned on, so that the signal of the initial signal line Vint is written into the second node N2, the first electrode of the light emitting diode EL is initialized (reset), a pre-stored voltage inside the first electrode is cleared, and initialization is completed to ensure that the light emitting diode EL does not emit light.

In the first sub-stage, the signal of the duration signal line DataT is a high-level signal, the signal of the second control line CT2 is a low-level signal, the tenth transistor T10 is turned on, the signal of the duration signal line DataT is written into the seventh node N7, and the second capacitor C2 is charged. Because the signal of the duration signal line DataT is a high-level signal at this time, the eleventh transistor T11 is turned off and the signal of the high-frequency signal line Hf cannot be written into the first node N1.

In the second sub-stage, the signal of the duration signal line DataT is a low-level signal, the signal of the first control line CT1 is a low-level signal, the eighth transistor T8 is turned on, so that the signal of the duration signal line DataT is written into the sixth node N6, and the first capacitor C1 is charged. Because the signal of the duration signal line DataT is a low-level signal at this time, the ninth transistor T9 is turned on, and the signal of the light emitting signal line EM is written into the first node N1.

In the writing stage, the data signal line DataI outputs a data voltage, the signals of the second scan signal line S2 and the light emitting signal line E are high-level signals, the signal of the first scan signal line S1 is a low-level signal, and the second transistor T2 and the fourth transistor T4 are turned on. The second transistor T2 and the fourth transistor T4 are turned on, so that the data voltage output from the data signal line DataI is supplied to the third node N3 through the fifth node N5, the turned-on third transistor T3, the fourth node N4 and the turned-on second transistor T2, and the difference between the data voltage Vd output from the data signal line DataI and the threshold voltage Vth of the third transistor T3 is charged into the storage capacitor Cs, the voltage of the first end (the third node N3) of the storage capacitor Cs is Vd−|Vth|. The first capacitor C1 keeps the potential of the signal of the sixth node N6 unchanged, the ninth transistor T9 remains turned-on, and the signal of the light emitting signal line EM is written to the first node N1.

In the light emitting stage, the signal of the light emitting signal line EM is a low-level signal, the fifth transistor T5 and the sixth transistor T6 are turned on, the first capacitor C1 holds the potential of the signal of the sixth node N6, the ninth transistor T9 remains turned on, the signal of the light emitting signal line EM is written into the first node N1, and the twelfth transistor T12 is turned on. The power supply voltage output by the first power supply line VDD supplies a driving voltage to the first electrode of the light emitting diode EL through the fifth transistor T5, the third transistor T3, the sixth transistor T6 and the twelfth transistor T12 which are all turned on, and drives the light emitting diode EL to emit light.

In an exemplary embodiment, when a grayscale displayed by a light emitting diode to which the pixel drive circuit is connected is less than a threshold grayscale, the working process of the pixel drive circuit includes an initialization stage, a writing stage and a light emitting stage, and the initialization stage may include a first sub-stage and a second sub-stage.

In the first and second sub-stages, the signals of the first scan signal line S1 and the light emitting signal line EM are high-level signals, the signal of the second scan signal line S2 is a low-level signal, and the first transistor T1 and the seventh transistor T7 are turned on. The first transistor T1 is turned on, so that the signal of the initial signal line Vint is written into the third node N3, the storage capacitor Cs is initialized (reset), and the original charge in the storage capacitor Cs is cleared. Because the first end of the storage capacitor C is at a low level, the third transistor T3 is turned on. The seventh transistor T7 is turned on, so that the signal of the initial signal line Vint is written into the second node N2, the first electrode of the light emitting diode EL is initialized (reset), the pre-stored voltage inside the first electrode is cleared, and initialization is completed to ensure that the light emitting diode EL does not emit light.

In the first sub-stage, the signal of the duration signal line DataT is a low-level signal, the signal of the second control line CT2 is a low-level signal, the tenth transistor T10 is turned on, so that the signal of the duration signal line DataT is written into the seventh node N7, and the second capacitor C2 is charged. Because the signal of the duration signal line DataT is a low-level signal at this time, the eleventh transistor T11 is turned on, and the signal of the high-frequency signal line Hf is written into the first node N1.

In the second sub-stage, the signal of the duration signal line DataT is a high-level signal, the signal of the first control line CT1 is a low-level signal, the eighth transistor T8 is turned on, so that the signal of the duration signal line DataT is written into the sixth node N6, and the first capacitor C1 is charged. Because the signal of the duration signal line DataT is a high-level signal at this time, the ninth transistor T9 is turned off, and the signal of the light emitting signal line EM cannot be written into the first node N1.

In the writing stage, the data signal line DataI outputs a data voltage, the signals of the second scan signal line S2 and the light emitting signal line E are high-level signals, the signal of the first scan signal line S1 is a low-level signal, and the second transistor T2 and the fourth transistor T4 are turned on. The second transistor T2 and the fourth transistor T4 are turned on, so that the data voltage output from the data signal line DataI is supplied to the third node N3 through the fifth node N5, the turned-on third transistor T3, the fourth node N4 and the turned-on second transistor T2, and the difference between the data voltage Vd output from the data signal line DataI and the threshold voltage Vth of the third transistor T3 is charged into the storage capacitor Cs, the voltage of the first end (the third node N3) of the storage capacitor Cs is $Vd-|Vth|$. The second capacitor C2 keeps the potential of the signal of the seventh node N7 unchanged, the eleventh transistor T11 is always turned on, and the signal of the high-frequency signal line Hf is written to the first node N1.

In the light emitting stage, the signal of the light emitting signal line EM is a low-level signal, the fifth transistor T5 and the sixth transistor T6 are turned on, the second capacitor C2 keeps the potential of the signal of the seventh node N7 unchanged, the eleventh transistor T11 is always turned on, the signal of the high-frequency signal line Hf is written into the first node N1, and the twelfth transistor T12 is turned on. The power supply voltage output by the first power supply line VDD supplies a driving voltage to the first electrode of the light emitting diode EL through the fifth transistor T5, the third transistor T3, the sixth transistor T6 and the twelfth transistor T12 which are all turned on to drive the light emitting diode EL to emit light.

In an exemplary embodiment, in the light emitting stage, the driving current outputted by the third transistor T3 in the pixel drive circuit is not affected by the threshold voltage of the third transistor T3, but only related to the voltage of the data signal line and the voltage of the first power supply line, thereby eliminating the influence of the threshold voltage of the drive transistor on the driving current, ensuring uniform display brightness of the display product and improving the display effect.

In an exemplary embodiment, when a grayscale displayed by a light emitting diode to which the pixel drive circuit is connected is greater than a threshold grayscale, a control signal is provided to the first node N1 through the light emitting signal line such that the grayscale of the light emitting diode is controlled by a driving current. When the grayscale displayed by the light-emitting diode connected to the pixel drive circuit is smaller than the threshold grayscale, a control signal is provided to the first node N1 through the high-frequency signal line, so that the grayscale of the light-emitting diode is controlled by a driving current and a light-emitting duration.

In an exemplary embodiment, the signal of the high-frequency signal line Hf is a pulse signal, and the signal of the high-frequency signal line Hf has a plurality of pulses within an image frame. In an exemplary embodiment, the frequency of the signal of the high-frequency signal line Hf may be greater than the frequency of the signal of the light emitting signal line EM. For example, the frequency of the signal of the high-frequency signal line Hf may be between 3000 Hz and 60000 Hz, and the frequency of the light emitting signal line EM may be between 60 Hz and 120 Hz. The present disclosure controls the light emitting duration by the high-frequency pulse signal of the high-frequency signal line, spreads the short light emitting duration into one frame time, reduces the flickering that occurs when the grayscale displayed by the light emitting diode connected to the pixel drive circuit is less than the threshold grayscale, and improves the display effect of the display product.

Figure 4:
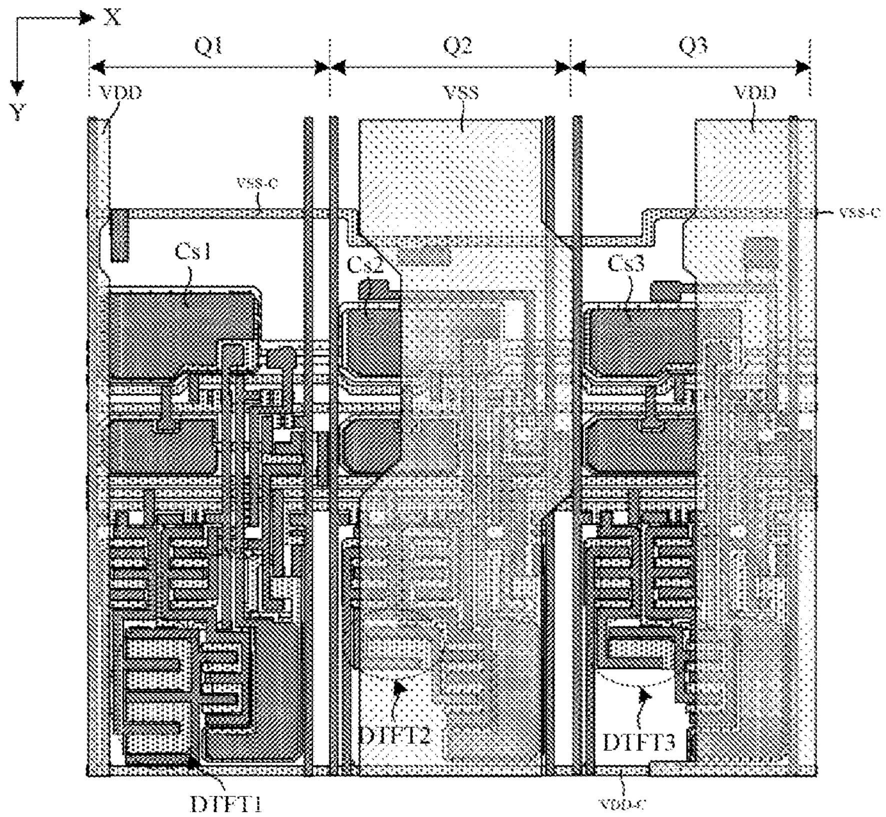
FIG. 4 is a schematic diagram of a structure of a display substrate according to an exemplary embodiment of the present disclosure.

FIG. 4 is a schematic diagram of a structure of a display substrate according to an exemplary embodiment of the present disclosure illustrating a structure of three circuit units including a pixel drive circuit shown in FIG. 3. In an exemplary embodiment, on a plane perpendicular to the display substrate, the display substrate may include at least a drive circuit layer disposed on the base substrate and a light emitting structure layer disposed on a side of the drive circuit layer away from the base substrate. On a plane parallel to the display substrate, the drive circuit layer may include at least a plurality of circuit units forming a plurality of unit rows and a plurality of unit columns, the circuit units may include at least pixel drive circuits, the light emitting structure layer may include a plurality of light emitting units, the light-emitting units may include at least light-emitting diodes, and the light emitting diodes in the plurality of light emitting units are correspondingly connected with the pixel drive circuits in the plurality of circuit units, so that the light emitting diodes emit light of corresponding brightness under the drive of output currents of the corresponding pixel drive circuits.

As shown in FIG. 4, the plurality of circuit units may include at least a first circuit unit Q1, a second circuit unit Q2, and a third circuit unit Q3 arranged sequentially along a first direction X, and the plurality of light emitting units may include at least a first light emitting unit, a second light emitting unit, and a third light emitting unit. The first circuit unit Q1 may include at least a first pixel drive circuit, the second circuit unit Q2 may include at least a second pixel drive circuit, the third circuit unit Q3 may include at least a third pixel drive circuit, the first light emitting unit may include at least a first light emitting diode, the second light emitting unit may include at least a second light emitting diode, and the third light emitting unit may include at least a third light emitting diode. In an exemplary embodiment, the first pixel drive circuit is configured to be connected to the first light emitting diode, the second pixel drive circuit is configured to be connected to the second light emitting diode, and the third pixel drive circuit is configured to be connected to the third light emitting diode.

In an exemplary embodiment, the first light emitting diode may be a red light emitting diode, the second light emitting diode may be a green light emitting diode, and the third light emitting diode may be a blue light emitting diode.

In an exemplary embodiment, the first pixel drive circuit in the first circuit unit Q1 may include at least a first drive transistor DTFT1 and a first storage capacitor Cs1, the second pixel drive circuit in the second circuit unit Q2 may include at least a second drive transistor DTFT2 and a second storage capacitor Cs2, and the third pixel drive circuit in the third circuit unit Q3 may include at least a third drive transistor DTFT3 and a third storage capacitor Cs3.

In an exemplary embodiment, the width-length ratio (W/L) of the first drive transistor DTFT1 may be greater than the width-length ratio of the second drive transistor DTFT2, and the width-length ratio of the first drive transistor DTFT1 may be greater than the width-length ratio of the third drive transistor DTFT3.

In an exemplary embodiment, the capacitance value of the first storage capacitor Cs1 may be greater than the capacitance value of the second storage capacitor Cs2, and the capacitance value of the first storage capacitor Cs1 may be greater than the capacitance value of the third storage capacitor Cs3.

In an exemplary embodiment, at least one circuit unit may include a high-voltage connection line VDD-C extending along a first direction X (unit row direction) and a high-voltage power supply line VDD extending along a second direction Y (unit column direction), the high-voltage connection line VDD is connected to a corresponding pixel drive circuit, the high-voltage power supply line VDD may be connected to the high-voltage connection line VDD-C through a via to form a net-like connecting structure for transmitting a high-voltage power supply signal, and the first direction X and the second direction Y may intersect with each other.

In an exemplary embodiment, at least one circuit unit may include a low-voltage connection line VSS-C extending along the first direction X, and a low-voltage power supply line VSS extending along the second direction Y, the low-voltage power supply line VSS is connected to a corresponding light emitting diode, the low-voltage power supply line VSS is connected to the low-voltage connection line VSS-C through a via, forming a net-like connecting structure for transmitting a low-voltage power supply signal.

In the present disclosure, structure A extends in a direction B means that structure A may include a main body portion and a secondary portion connected to the main body portion, the main body portion is substantially in the shape of a strip extending in a direction, the secondary portion is of any shape, the main body portion is at least 60% of structure A; the main body portion extends in the direction B, and a size of the main body portion extending in the direction B is larger than that of the secondary portion extending in another direction. In the following description, the expression "structure A extends in a direction B" means that the main body portion of structure A extends in the direction B.

Figure 5A:
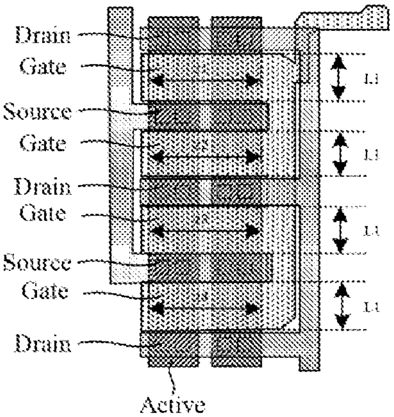
FIG. 5A is a schematic diagram of a structure of a first drive transistor according to the present disclosure.
Figure 5B:
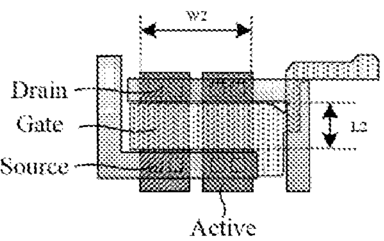
FIG. 5B is a schematic diagram of a structure of a second drive transistor according to the present disclosure.

FIG. 5A is a schematic diagram of a structure of a first drive transistor according to the present disclosure, and FIG. 5B is a schematic diagram of a structure of a second drive transistor according to the present disclosure. In an exemplary embodiment, both the first drive transistor DTFT1 and the second drive transistor DTFT2 may include an active layer (Active), a gate electrode (Gate), a first electrode (Source), and a second electrode (Drain), wherein the active layer (Active) includes a channel region and a source connection region and a drain connection region located on two sides of the channel region, the overlapping region of the gate electrode (Gate) and the active layer (Active) forms the channel region, the first electrode (Source) is connected to the source connection region, and the second electrode (Drain) is connected to the drain connection region. The first drive transistor DTFT1 has a first width-length ratio and the second drive transistor DTFT2 has a second width-length ratio, the first width-length ratio may be greater than the second width-length ratio.

As shown in FIGS. 5A and 5B, the gate electrode (Gate), the first electrode (Source) and the second electrode (Drain) of the first drive transistor DTFT1 are all comb-shaped, and the second electrode (Drain), the gate electrode (Gate) and the first electrode (Source) are alternately arranged along the extension direction of the active layer (Active) to form four sub-transistors, the first sub-transistor has a first channel length L1 and a first sub-width z1, the second sub-transistor has the first channel length L1 and a second sub-width z2, the third sub-transistor has the first channel length L1 and a third sub-width z3, and the fourth sub-transistor has the first channel length L1 and a fourth sub-width z4, thus the first drive transistor DTFT1 has the first channel length L1 and a first channel width W1 which is the sum of the first sub-width z1, the second sub-width z2, the third sub-width z3 and the fourth sub-width z4. In an exemplary embodiment, the gate electrode Gate, the first electrode Source, and the second electrode Drain of the second drive transistor DTFT2 are all in a shape of a strip, thus the second drive transistor DTFT2 has a second channel length L2 and a second channel width W2.

In an exemplary embodiment, the first channel length L1 and the second channel length L2 may be substantially the same and the first channel width W1 may be greater than the second channel width W2.

In an exemplary embodiment, the ratio of the first channel width W1 to the second channel width W2 may be about 2 to 6.

In an exemplary embodiment, z1=z2=z3=z4=W2, and W1/W2 may be about 4.

In an exemplary embodiment, the second channel width of the second drive transistor DTFT2 may be substantially the same as a third channel width of the third drive transistor DTFT3, and the second channel length of the second drive transistor DTFT2 may be substantially the same as a third channel length of the third drive transistor DTFT3.

Figure 6A:
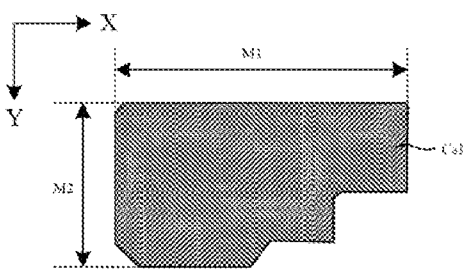
FIG. 6A is a schematic diagram of a structure of a first storage capacitor according to the present disclosure.
Figure 6B:
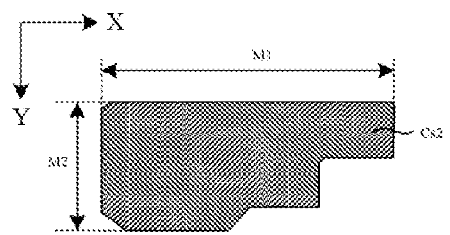
FIG. 6B is a schematic diagram of a structure of a second storage capacitor according to the present disclosure.

FIG. 6A is a schematic diagram of a structure of a first storage capacitor according to the present disclosure, and FIG. 6B is a schematic diagram of a structure of a second storage capacitor according to the present disclosure. As shown in FIGS. 6A and 6B, the first storage capacitor Cs1 has a first area and the second storage capacitor Cs2 has a second area, and the first area may be larger than the second area.

In an exemplary embodiment, the first area and the second area may be areas of orthographic projections of the first storage capacitor Cs1 and the second storage capacitors Cs2 on the plane of the display substrate. The first storage capacitor Cs1 and the second storage capacitor Cs2 may include a plurality of plates stacked, the first area may be a minimum area of the orthographic projections of the plurality of plates in the first storage capacitor Cs1 on the plane of the display substrate, and the second area may be a minimum area of the orthographic projections of the plurality of plates in the second storage capacitor Cs2 on the plane of the display substrate.

In an exemplary embodiment, the shapes of the first storage capacitor Cs1 and the second storage capacitor Cs2 may be multilateral shapes, the first storage capacitor Cs1 and the second storage capacitor Cs2 have a first length M1 and a second length M2, respectively, the first length M1 may be the largest size of the first storage capacitor Cs1 and the second storage capacitor Cs2 in the first direction X, the second length M2 may be the largest size of the first storage capacitor Cs1 and the second storage capacitor Cs2 in the second direction Y, and the first and second lengths M1 and M2 may be projection lengths of the orthographic projections of the first storage capacitor Cs1 and the second storage capacitor Cs2 on the plane of the display substrate.

In an exemplary embodiment, the first length M1 of the first storage capacitor Cs1 may be substantially the same as the first length M1 of the second storage capacitor Cs2, and the second length M2 of the first storage capacitor Cs1 may be greater than the second length M2 of the second storage capacitor Cs2.

In an exemplary embodiment, the ratio of the second length M2 of the first storage capacitor Cs1 to the second length M2 of the second storage capacitor Cs2 may be about 1 to 2.

For example, the ratio of the second length M2 of the first storage capacitor Cs1 to the second length M2 of the second storage capacitor Cs2 may be about 1.3.

In an exemplary embodiment, the first length M1 of the second storage capacitor Cs2 may be substantially the same as the first length M1 of the third storage capacitor Cs3, and the second length M2 of the second storage capacitor Cs2 may be substantially the same as the second length M2 of the third storage capacitor Cs3.

In an exemplary embodiment, the first circuit unit Q1, the second circuit unit Q2, and the third circuit unit Q3 may be arranged sequentially along the first direction X, and the positions of the first, second, and third light emitting diodes may or may not correspond to the positions of the first, second, and third circuit units Q1, Q2, and Q3, which is not limited here in the present disclosure.

Exemplary description is made below through a preparation process for a display substrate. "Patterning processes" mentioned in the present disclosure include photoresist coating, mask exposure, development, etching, photoresist stripping, etc., for metal materials, inorganic materials or transparent conductive materials, and include organic material coating, mask exposure, development, etc., for organic materials. Deposition may be any one or more of sputtering, evaporation, and chemical vapor deposition, coating may be any one or more of spray coating, spin coating, and inkjet printing, and etching may be any one or more of dry etching and wet etching, which is not limited in the present disclosure. "Film" refers to a layer of film formed from a certain material on a base substrate using deposition, coating or other processes. If the "thin film" does not need a patterning process in an entire manufacturing process, the "thin film" may also be called a "layer". If the "thin film" needs the patterning process in the entire manufacturing process, the "thin film" is called a "thin film" before the patterning process and is called a "layer" after the patterning process. The "layer" after the patterning process contains at least one "pattern". "A and B are disposed on the same layer" in the present disclosure means that A and B are formed simultaneously through the running of the same patterning process, and the"thickness" of the film layer is a size of the film layer in a direction perpendicular to the display substrate. In an exemplary implementation of the present disclosure, "an orthographic projection of B is within a range of an orthographic projection of A" or "an orthographic projection of A includes an orthographic projection of B" refers to that a boundary of an orthographic projection of B falls within a range of a boundary of an orthographic projection of A, or the boundary of an orthographic projection of A is overlapped with the boundary of an orthographic projection of B.

In an exemplary embodiment, taking three circuit units (the first circuit unit Q1, the second circuit unit Q2, and the third circuit unit Q3) as an example, the preparation process of the drive circuit layer may include the following operations.

Figure 7:
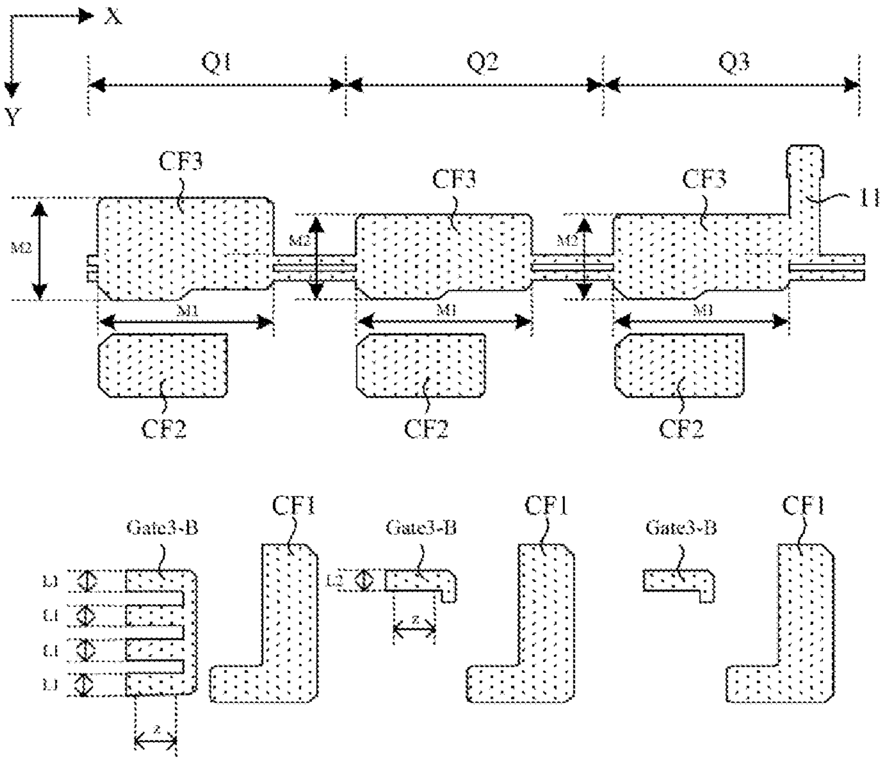
FIG. 7 is a schematic diagram of a display substrate after a pattern of a first conductive layer is formed according to the present disclosure.

(11) A pattern of a first conductive layer is formed. In an exemplary embodiment, forming a pattern of a first conductive layer may include depositing a first conductive film on the base substrate, patterning the first conductive film through a patterning process to form a pattern of the first conductive layer disposed on the base substrate, as shown in FIG. 7. In an exemplary embodiment, the first conductive layer may be referred to as a first gate metal (GATE1) layer.

In an exemplary embodiment, the pattern of the first conductive layer of each circuit unit may include at least a first plate CF1, a second plate CF2, a third plate CF3, and a third bottom gate electrode Gate3-B.

In an exemplary embodiment, the first plate CF1 may be shaped in a "L", and the first plate CF1 may be disposed on a side of the circuit unit in the second direction Y. In an exemplary embodiment, the first plate CF1 may serve as one plate of the first capacitor.

In an exemplary embodiment, the position, shape, and size of the first plate CF1 in the first circuit unit Q1, the second circuit unit Q2, and the third circuit unit Q3 may be substantially the same.

In an exemplary embodiment, the second plate CF2 may be in a shape of rectangular, rectangle corners may be set with chamfer, and the second plate CF2 may be disposed in the middle of the circuit unit in the second direction Y. In an exemplary embodiment, the second plate CF2 may serve as one plate of the second capacitor.

In an exemplary embodiment, the position, shape, and size of the second plate CF2 in the first circuit unit Q1, the second circuit unit Q2, and the third circuit unit Q3 may be substantially the same.

In an exemplary embodiment, the third plate CF3 may be in a shape of rectangular, rectangle corners may be set with chamfer, and the third plate CF3 may be provided on a side of the circuit unit in an opposite direction of the second direction Y. In an exemplary embodiment, the third plate CF3 may serve as one plate of the storage capacitor.

In an exemplary embodiment, the second plate CF2 may be located between the first plate CF1 and the third plate CF3 in the second direction Y.

In an exemplary embodiment, the position, shape and size of the third plate CF3 in the second circuit unit Q2 and the third circuit unit Q3 may be substantially the same, but different from the shape and size of the third plate CF3 in the first circuit unit Q1.

In an exemplary embodiment, the area of the third plate CF3 in the first circuit unit Q1 may be larger than the area of the third plate CF3 in the second circuit unit Q2, and the area of the third plate CF3 in the first circuit unit Q1 may be larger than the area of the third plate CF3 in the third circuit unit Q3, so that the capacitance value of the storage capacitor in the first circuit unit Q1 is larger than the capacitance value of the storage capacitor in the second circuit unit Q2 and the third circuit unit Q3.

In an exemplary embodiment, the first length M1 of the third plate CF3 in the first circuit unit Q1, the second circuit unit Q2, and the third circuit unit Q3 may be substantially the same, and the second length M2 of the third plate CF3 in the first circuit unit Q1 may be larger than the second length M2 of the third plate CF3 in the second circuit unit Q2 and the third circuit unit Q3, so that the area of the third plate CF3 in the first circuit unit Q1 is larger than the area of the third plate CF3 in the second circuit unit Q2 and the third circuit unit Q3. In an exemplary embodiment, the first length M1 may be a maximum size in the first direction X and the second length M2 may be a maximum size in the second direction Y.

In an exemplary embodiment, the ratio of the second length M2 of the third plate CF3 in the first circuit unit Q1 to the second length M2 of the third plate CF3 in the second circuit unit Q2 and the third circuit unit Q3 may be about 1 to 2. For example, the ratio can be about 1.3.

In an exemplary embodiment, edges of the third plate CF3 on a side close to the second plate CF2 in the first circuit unit Q1, the second circuit unit Q2, and the third circuit unit Q3 may be substantially flush, and the distance between an edge of the third plate CF3 on a side close to the second plate CF2 and an edge of the second plate CF2 on a side close to the third plate CF3 in each circuit unit may be substantially the same.

In an exemplary embodiment, the third bottom gate electrode Gate3-B may serve as a bottom gate electrode of the third transistor (the drive transistor). In the first direction X, the third bottom gate electrode Gate3-B may be located on a side of the first plate CF1 in an opposite direction of the first direction X, and in the second direction Y, the third bottom gate electrode Gate3-B may be located on a side of the second plate CF2 in the second direction Y.

In an exemplary embodiment, the third bottom gate electrode Gate3-B in the first circuit unit Q1 may include a plurality of sub-electrodes, each of which may have a shape of a strip extending along the first direction X, and the plurality of sub-electrodes may be arranged at intervals along the second direction Y to form a comb structure. The third bottom gate electrode Gate3-B in the second circuit unit Q2 and the third circuit unit Q3 may include a sub-electrode forming an "L" shaped structure. In an exemplary embodiment, by arranging the third bottom gate electrode Gate3-B in the first circuit unit Q1 into a plurality of sub-electrode structures, it is possible to achieve that the width-length ratio of the drive transistor in the first circuit unit Q1 is greater than that in the second circuit unit Q2 and the third circuit unit Q3.

In an exemplary embodiment, each sub-electrode in the first circuit unit Q1 may form a first channel length L1 of the transistor, and the sub-electrode in the second circuit unit Q2 may form a second channel length L2 of the transistor, the first channel length L1 and the second channel length L2 may be substantially the same.

In an exemplary embodiment, a plurality of sub-electrodes in the first circuit unit Q1 may form a plurality of sub-widths z of the transistor, a sub-electrode in the second circuit unit Q2 may form a sub-width z of the transistor, a first channel width of the third transistor in the first circuit unit Q1 is equal to 4 times the sub-width z, and a second channel width of the third transistor in the second circuit unit Q2 is equal to the sub-width z, so that the width-length ratio of the third transistor in the first circuit unit Q1 is about 4 times that of the third transistor in the second circuit unit Q2.

In an exemplary embodiment, edges of the third bottom gate electrode Gate3-B in the first circuit unit Q1, the second circuit unit Q2, and the third circuit unit Q3 on a side close to the second plate CF2 may be substantially flush, and the distance between an edge of the third bottom gate electrode Gate3-B on a side close to the second plate CF2 and an edge of the second plate CF2 on a side close to the third bottom gate electrode Gate3-B in each circuit unit may be substantially the same.

In an exemplary embodiment, a side of the third plate CF3 in the first direction X or in an opposite direction of the first direction X may be connected with a plate electrode connection line, the plate electrode connection line may be in the shape of a strip extending along the first direction X, a first end of the plate electrode connection line is connected with the third plate CF3 of the circuit unit, and a second end of the plate electrode connection line, after extending in the first direction X or in an opposite direction of the first direction X, is connected with the third plate CF3 of an adjacent circuit unit, so as to connect up the third plates CF3 in a unit row. In an exemplary embodiment, the quantity of the plate electrode connection lines may be 2 or 3 to improve connection reliability.

In an exemplary embodiment, the plurality of third plates CF3 and the plurality of plate electrode connection lines in one unit row may of an interconnected integral structure. In an exemplary embodiment, Because the third plate CF3 in each circuit unit is connected with the high-voltage power supply line subsequently formed, by forming an integral structure in which the third plates CF3 of adjacent circuit units are connected with each other, the third plate CF3 in the integral structure can be reused as a high-voltage power supply signal line, thus ensuring that a plurality of third plates CF3 in a unit row have the same potential, which is beneficial to improving uniformity of the panel, avoiding a poor display of the display substrate and ensuring a display effect of the display substrate.

In an exemplary embodiment, the pattern of the first conductive layer may further include a power supply electrode 11 provided in the third circuit unit Q3, which may have a shape of a strip extending along the second direction Y, and may be provided on a side of the third plate CF3 in the first direction X. In an exemplary embodiment, the power supply electrode 11 is configured to be connected to the high-voltage power supply line subsequently formed, to achieve connection between the third plate and the high-voltage power supply line.

In an exemplary embodiment, the third plate CF3 and the power supply electrode 11 may be of an interconnected integral structure.

Figures 8A, 8B:
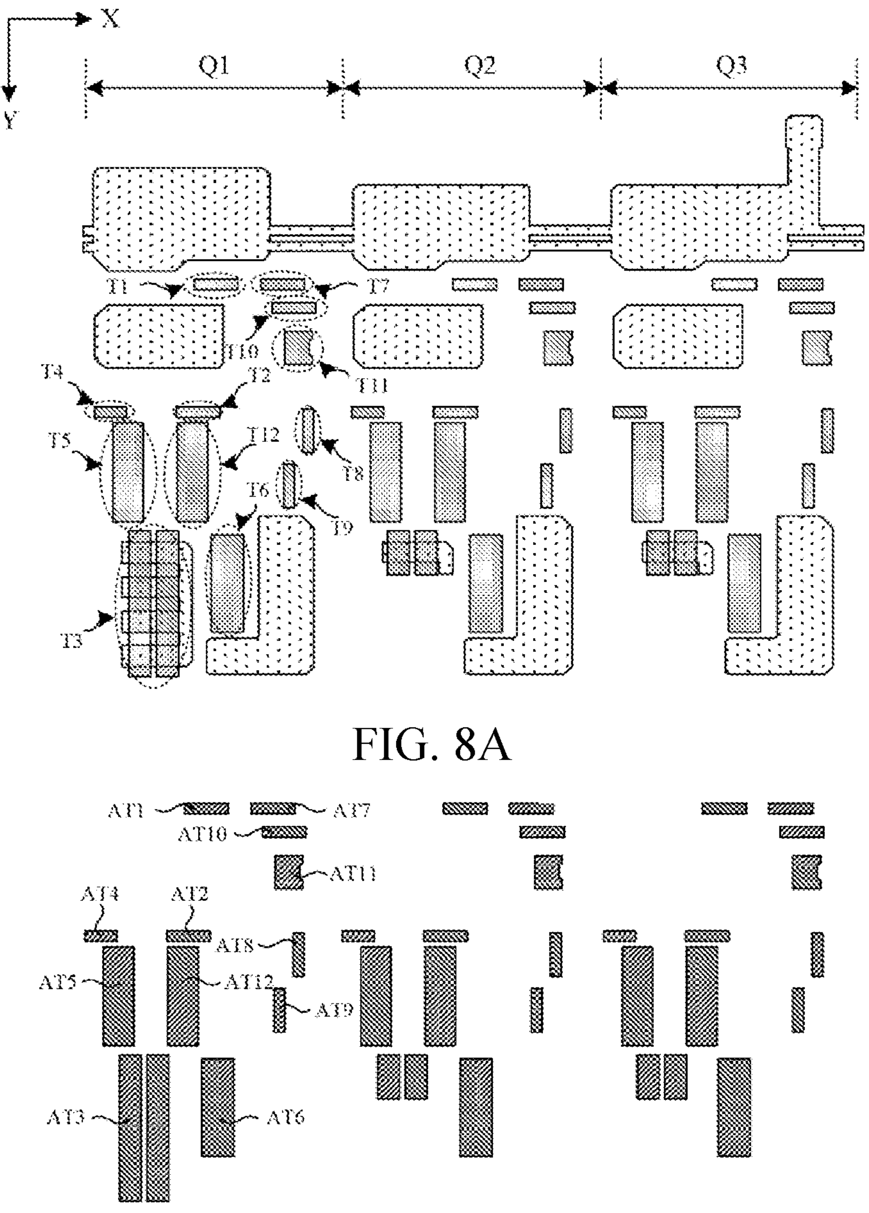
FIG. 8A and FIG. 8B are schematic diagrams of a display substrate after a pattern of a semiconductor layer is formed according to the present disclosure.

(12) A pattern of a semiconductor layer is formed. In an exemplary embodiment, forming a pattern of a semiconductor layer may include sequentially depositing a first insulating film and a first semiconductor film on the base substrate, patterning the first semiconductor film through a patterning process to form a first insulating layer covering the first conductive layer, and to form the pattern of the semiconductor layer disposed on the first insulating layer, as shown in FIGS. 8A and 8B, and FIG. 8B is a schematic plan view of the semiconductor layer in FIG. 8A.

In an exemplary embodiment, the pattern of the semiconductor layer of each circuit unit may include at least a first active layer AT1 of the first transistor T1 to a twelfth active layer AT12 of the twelfth transistor T12.

In an exemplary embodiment, the first active layer AT1, the second active layer AT2, the fourth active layer AT4, the seventh active layer AT7, and the tenth active layer AT10 may have a shape of a strip extending along the first direction X, the third active layer AT3, the fifth active layer AT5, the sixth active layer AT6, the eighth active layer AT8, the ninth active layer AT9, and the twelfth active layer AT12 may have a shape of a strip extending along the second direction Y, and the eleventh active layer AT11 may be in a shape of rectangular.

In an exemplary embodiment, the first active layer AT1 may be located between the second plate CF2 and the third plate CF3, and the first active layer AT1 may serve as an active layer of the first transistor T1. The second active layer AT2 may be located between the second plate CF2 and the third bottom gate electrode Gate3-B, and the second active layer AT2 may serve as an active layer of the second transistor T2. An orthographic projection of the third active layer AT3 on the base substrate at least partially overlaps an orthographic projection of the third bottom gate electrode Gate3-B on the base substrate, and the third active layer AT3 may serve as an active layer of the third transistor T3. The fourth active layer AT4 may be located between the second plate CF2 and the third bottom gate electrode Gate3-B and on a side of the second active layer AT2 in an opposite direction of the first direction X, and may serve as an active layer of the fourth transistor T4. The fifth active layer AT5 may be located between the third active layer AT3 and the fourth active layer AT4, and the fifth active layer AT5 may serve as an active layer of the fifth transistor T5. The sixth active layer AT6 may be located between the first plate CF1 and the third bottom gate electrode Gate3-B, and may serve as an active layer of the sixth transistor T6. The seventh active layer AT7 may be located on a side of the first active layer AT1 in the first direction X, and may serve as an active layer of the seventh transistor T7. The eighth active layer AT8 may be located on a side of the first plate CF1 in an opposite direction of the second direction Y, and may serve as an active layer of the eighth transistor T8. The ninth active layer AT9 may be located between the first plate CF1 and the eighth active layer AT8, and the ninth active layer AT9 may serve as an active layer of the ninth transistor T9. The tenth active layer AT10 may be located on a side of the seventh active layer AT7 in the second direction Y, and the tenth active layer AT10 may serve as an active layer of the tenth transistor T10. The eleventh active layer AT11 may be located on a side of the tenth active layer AT10 in the second direction Y, and the eleventh active layer AT11 may serve as an active layer of the eleventh transistor T11. The twelfth active layer AT12 may be located between the second active layer AT2 and the third active layer AT3 and on a side of the fifth active layer AT5 in the first direction X, and may serve as an active layer of the twelfth transistor T12.

In an exemplary embodiment, the first active layer AT1 and the seventh active layer AT7 may be located on a straight line extending along the first direction X, the second active layer AT2 and the fourth active layer AT4 may be located on a straight line extending along the first direction X, and the fifth active layer AT5 and the twelfth active layer AT12 may be located on a straight line extending along the first direction X.

In an exemplary embodiment, along the second direction Y, the extension length of the third active layer AT3 in the first circuit unit Q1 may be greater than the extension length of the third active layer AT3 in the second circuit unit Q2 and the third circuit unit Q3, so that the width-length ratio of the drive transistor in the first circuit unit Q1 is greater than the width-length ratio of the drive transistor in the second circuit unit Q2 and the third circuit unit Q3.

In an exemplary embodiment, the first active layer AT1 to the twelfth active layer AT12 may each include a first region, a second region, and a channel region located between the first region and the second region, and the first region and the second region of a plurality of active layers may each be individually disposed.

Figure 9:
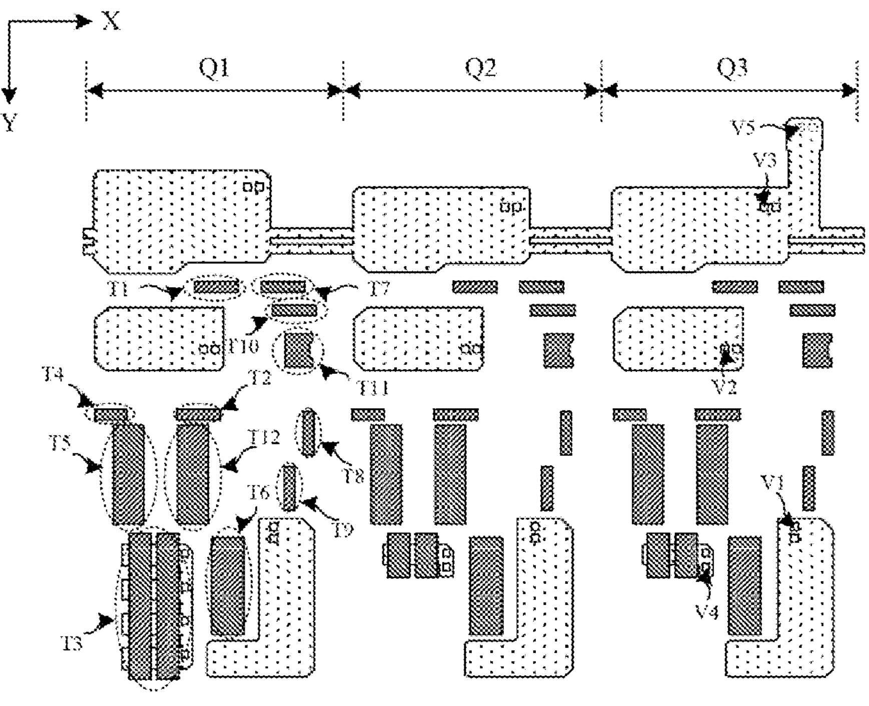
FIG. 9 is a schematic diagram of a display substrate after a pattern of a second insulating layer is formed according to the present disclosure.

(13) A pattern of a second insulation layer is formed. In an exemplary embodiment, forming a pattern of a second insulating layer may include depositing a second insulating film on the base substrate on which the above-mentioned patterns are formed, patterning the second insulating film using a patterning process to form a second insulating layer covering the semiconductor layer, and a plurality of vias are provided on the second insulating layer, as shown in FIG. 9.

In an exemplary embodiment, the plurality of vias on the second insulating layer in each circuit unit may include at least a first via V1, a second via V2, a third via V3, and a fourth via V4.

In an exemplary embodiment, an orthographic projection of the first via V1 on the base substrate is within a range of an orthographic projection of the first plate CF1 on the base substrate, the second insulating layer and the first insulating layer in the first via V1 are etched away to expose a surface of the first plate CF1, and the first via V1 is configured such that the first connection electrode subsequently formed is connected to the first plate CF1 through the via V1.

In an exemplary embodiment, an orthographic projection of the second via V2 on the base substrate is within a range of an orthographic projection of the second plate CF2 on the base substrate, the second insulating layer and the first insulating layer in the second via V2 are etched away to expose a surface of the second plate CF2, and the second via V2 is configured such that the second connection electrode subsequently formed is connected to the second plate CF2 through the via V2.

In an exemplary embodiment, an orthographic projection of the third via V3 on the base substrate is within a range of an orthographic projection of the third plate CF3 on the base substrate, the second insulating layer and the first insulating layer in the third via V3 are etched away to expose a surface of the third plate CF3, and the third via V3 is configured such that the third connection electrode subsequently formed is connected to the third plate CF3 through the via V3.

In an exemplary embodiment, an orthographic projection of the fourth via V4 on the base substrate is within a range of an orthographic projection of the third bottom gate electrode Gate3-B on the base substrate, the second insulating layer and the first insulating layer in the fourth via V4 are etched away to expose a surface of the third bottom gate electrode Gate3-B, and the fourth via V4 is configured such that the third top gate electrode subsequently formed is connected to the third bottom gate electrode Gate3-B through the via.

In an exemplary embodiment, the plurality of vias on the second insulating layer may also include a fifth via V5. An orthographic projection of the fifth via V5 on the base substrate is within a range of an orthographic projection of the power supply electrode 11 on the base substrate, the second insulating layer and the first insulating layer in the fifth via V5 are etched away to expose a surface of the power supply electrode 11, and the fifth via V5 is configured such that the seventh connection electrode subsequently formed is connected to the power supply electrode 11 through the via V5.

In an exemplary embodiment, the first via V1 to the fifth via V5 may be multiple to increase connection reliability.

Figure 10A:
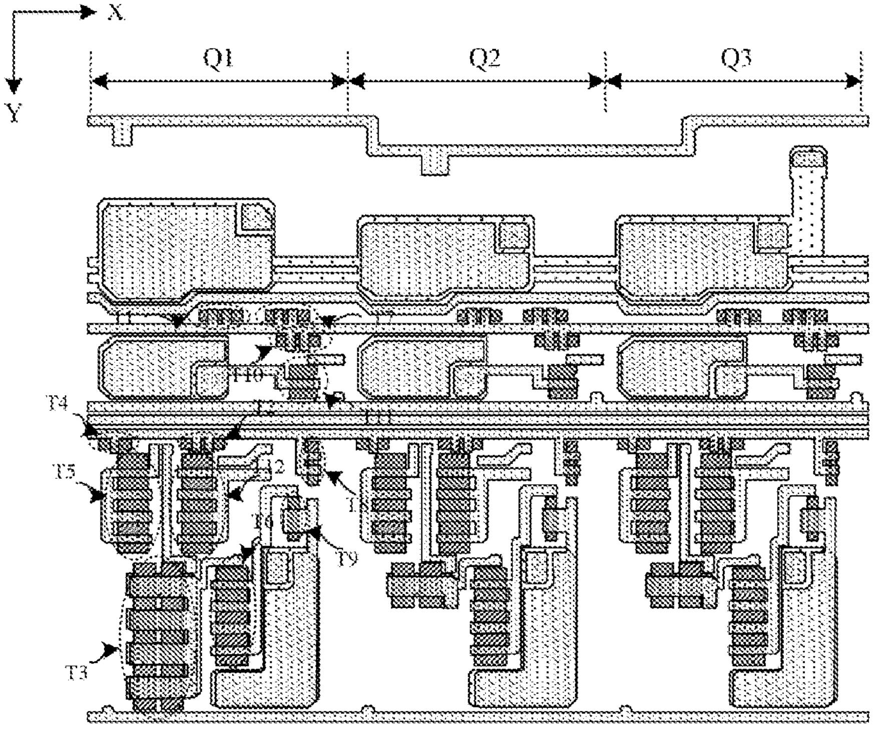
FIG. 10A and FIG. 10B are schematic diagrams of a display substrate after a pattern of a second conductive layer is formed according to the present disclosure.
Figure 10B:
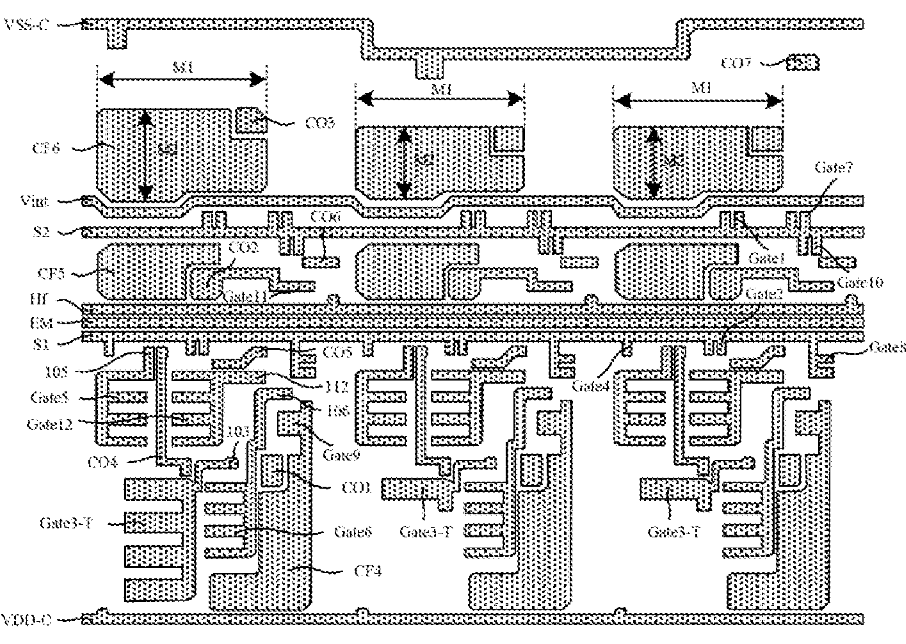

(14) A pattern of a second conductive layer is formed. In an exemplary embodiment, forming a pattern of a second conductive layer may include depositing a second conductive film on the base substrate on which the above-mentioned patterns are formed, patterning the second conductive film using a patterning process to form a pattern of the second conductive layer disposed on the second insulating layer, as shown in FIGS. 10A and 10B, FIG. 10B is a schematic plan view of the second conductive layer in FIG. 10A. In an exemplary embodiment, the second conductive layer may be referred to as a second gate metal (GATE2) layer.

In an exemplary embodiment, the pattern of the second conductive layer of each circuit unit includes at least a fourth plate CF4, a fifth plate CF5, a sixth plate CF6, a first scan signal line S1, a second scan signal line S2, a light emitting signal line EM, an initial signal line Vint, a high-frequency signal line Hf, a high-voltage connection line VDD-C, a low-voltage connection line VSS-C, a plurality of gate electrodes and a plurality of connection electrodes.

In an exemplary embodiment, the fourth plate CF4 may be “L” shaped and a notch is provided at one corner, an orthographic projection of the fourth plate CF4 on the base substrate overlaps at least partially an orthographic projection of the first plate CF1 on the base substrate, the fourth plate CF4 may serve as another plate of the first capacitor, the first plate CF1 and the fourth plate CF4 form a first capacitor of the pixel drive circuit.

In an exemplary embodiment, the position, shape, and size of the fourth plate CF4 in the first circuit unit Q1, the second circuit unit Q2, and the third circuit unit Q3 may be substantially the same.

In an exemplary embodiment, the fifth plate CF5 may be in a shape of a rectangle in which a notch is provided at one corner, an orthographic projection of the fifth plate CF5 on the base substrate overlaps at least partially an orthographic projection of the second plate CF2 on the base substrate, the fifth plate CF5 may serve as another plate of the second capacitor, and the second plate CF2 and the fifth plate CF5 form a second capacitor of the pixel drive circuit.

In an exemplary embodiment, the position, shape, and size of the fifth plate CF5 in the first circuit unit Q1, the second circuit unit Q2, and the third circuit unit Q3 may be substantially the same.

In an exemplary embodiment, the sixth plate CF6 may be in a shape of a rectangle in which a notch is provided at one corner, an orthographic projection of the sixth plate CF6 on the base substrate overlaps at least partially an orthographic projection of the third plate CF3 on the base substrate, the sixth plate CF6 may serve as another plate of the storage capacitor, and the third plate CF3 and the sixth plate CF6 form a storage capacitor of the pixel drive circuit.

In an exemplary embodiment, the position, shape and size of the sixth plate CF6 in the second circuit unit Q2 and the third circuit unit Q3 may be substantially the same, but different from the shape and size of the sixth plate CF6 in the first circuit unit Q1.

In an exemplary embodiment, the area of the sixth plate CF6 in the first circuit unit Q1 may be larger than the area of the sixth plate CF6 in the second circuit unit Q2, and the area of the sixth plate CF6 in the first circuit unit Q1 may be larger than the area of the sixth plate CF6 in the third circuit unit Q3, so that the capacitance value of the storage capacitor in the first circuit unit Q1 is larger than the capacitance value of the storage capacitor in the second circuit unit Q2 and the third circuit unit Q3.

In an exemplary embodiment, the first length M1 of the sixth plate CF6 in the first circuit unit Q1, the second circuit unit Q2, and the third circuit unit Q3 may be substantially the same, and the second length M2 of the sixth plate CF6 in the first circuit unit Q1 may be larger than the second length M2 of the sixth plate CF6 in the second circuit unit Q2 and the third circuit unit Q3, so that the area of the sixth plate CF6 in the first circuit unit Q1 is larger than the area of the sixth plate CF6 in the second circuit unit Q2 and the third circuit unit Q3.

In an exemplary embodiment, the ratio of the second length M2 of the sixth plate CF6 in the first circuit unit Q1 to the second length M2 of the sixth plate CF6 in the second circuit unit Q2 and the third circuit unit Q3 may be about 1 to 2. For example, the ratio can be about 1.3.

In an exemplary embodiment, the first scan signal line S1, the second scan signal line S2, the light emitting signal line EM, the initial signal line Vint, the high-frequency signal line Hf, the high-voltage connection line VDD-C, and the low-voltage connection line VSS-C may have a shape of a straight line or a bending line with a main body portion extending in the first direction X. The first scan signal line S1, the light emitting signal line EM, and the high-frequency signal line Hf may be located between the fourth plate CF4 and the fifth plate CF5, the high-frequency signal line Hf may be located on a side of the fourth plate CF4 in the second direction, the light emitting signal line EM may be located on a side of the high-frequency signal line Hf in the second direction Y, and the first scan signal line S1 may be located on a side of the light emitting signal line EM in the second direction Y. The second scan signal line S2 and the initial signal line Vint may be located between the fifth plate CF5 and the sixth plate CF6, the initial signal line Vint may be located on a side of the sixth plate CF6 in the second direction Y, and the second scan signal line S2 may be located on a side of the initial signal line Vint in the second direction Y. The high-voltage connection line VDD-C may be located on a side of the third plate CF3 away from the fourth plate CF4, and the low-voltage connection line VSS-C may be located on a side of the sixth plate CF6 away from the fifth plate CF5.

In an exemplary embodiment, a side of the high-frequency signal line Hf away from the light emitting signal line EM is provided with a high-frequency connection block configured to be connected with the twenty-sixth connection electrode subsequently formed.

In an exemplary embodiment, a side of the high-voltage connection line VDD-C close to the fourth plate CF4 is provided with a high-voltage connection block configured to be connected with a sixteenth connection electrode formed subsequently.

In an exemplary embodiment, a side of the low-voltage connection line VSS-C close to the sixth plate CF6 is provided with a low-voltage connection block configured to be connected to a thirty-second connection electrode formed subsequently. In an exemplary embodiment, a low-voltage connection block may be provided in the first circuit unit Q1 and the second circuit unit Q2, and the third circuit unit Q3 is not provided with a low-voltage connection block.

In an exemplary embodiment, the first scan signal line S1 may be reused as the first control line to control the eighth transistor T8 to be turned on and turned off, and the second scan signal line S2 may be reused as the second control line to control the tenth transistor T10 to be turned on and turned off.

In an exemplary embodiment, the plurality of gate electrodes of each circuit unit may include at least a first gate electrode Gate1, a second gate electrode Gate2, a third top gate electrode Gate3-T, a fourth gate electrode Gate4, a fifth gate electrode Gate5, a sixth gate electrode Gate6, a seventh gate electrode Gate7, an eighth gate electrode Gate8, a ninth gate electrode Gate9, a tenth gate electrode Gate10, an eleventh gate electrode Gate11, and a twelfth gate electrode Gate12.

In an exemplary embodiment, the second gate electrode Gate2, the fourth gate electrode Gate4, and the eighth gate electrode Gate8 may be disposed on a side of the first scan signal line S1 away from the light emitting signal line EM. The second gate electrode Gate2 serves as a gate electrode of the second transistor T2, an orthographic projection of the second gate electrode Gate2 on the base substrate at least partially overlaps an orthographic projection of the second active layer on the base substrate, the fourth gate electrode Gate4 serves as a gate electrode of the fourth transistor T4, an orthographic projection of the fourth gate electrode Gate4 on the base substrate at least partially overlaps an orthographic projection of the fourth active layer on the base substrate, and the eighth gate electrode Gate8 serves as a gate electrode of the eighth transistor T8, an orthographic projection of the eighth gate electrode Gate8 on the base substrate at least partially overlaps an orthographic projection of the eighth active layer on the base substrate.

In an exemplary embodiment, the first scan signal line S1, the second gate electrode Gate2, the fourth gate electrode Gate4, and the eighth gate electrode Gate8 may be of an interconnected integral structure.

In an exemplary embodiment, the first gate electrode Gate1 and the seventh gate electrode Gate7 may be disposed on a side of the second scan signal line S2 close to the initial signal line Vint, and the tenth gate electrode Gate10 may be disposed on a side of the second scan signal line S2 away from the initial signal line Vint. The first gate electrode Gate1 serves as a gate electrode of the first transistor T1, an orthographic projection of the first gate electrode Gate1 on the base substrate at least partially overlaps an orthographic projection of the first active layer on the base substrate, the seventh gate electrode Gate7 serves as a gate electrode of the seventh transistor T7, an orthographic projection of the seventh gate electrode Gate7 on the base substrate at least partially overlaps an orthographic projection of the seventh active layer on the base substrate, and the tenth gate electrode Gate10 serves as a gate electrode of the tenth transistor T10, an orthographic projection of the tenth gate electrode Gate10 on the base substrate at least partially overlaps an orthographic projection of the tenth active layer on the base substrate.

In an exemplary embodiment, the second scan signal line S2, the first gate electrode Gate1, the seventh gate electrode Gate7, and the tenth gate electrode Gate10 may be of an interconnected integral structure.

In an exemplary embodiment, the quantity of the first gate electrode Gate1, the second gate electrode Gate2, the seventh gate electrode Gate7, the eighth gate electrode Gate8, and the tenth gate electrode Gate10 may be two, to form the first transistor T1, the second transistor T2, the seventh transistor T7, the eighth transistor T8, and the tenth transistor T10 of a double-gate structure, which can enhance the driving capability, improve the current saturation of the light emitting diode, and prevent and reduce the occurrence of leakage current.

In an exemplary embodiment, the third top gate electrode Gate3-T may serve as a top gate electrode of the third transistor T3, an orthographic projection of the third top gate electrode Gate3-T on the base substrate overlaps at least partially an orthographic projection of the third active layer on the base substrate. The shape of the third top gate electrode Gate3-T may be substantially the same as that of the third bottom gate electrode Gate3-B, an orthographic projection of the third top gate electrode Gate3-T on the base substrate overlaps at least partially an orthographic projection of the third bottom gate electrode Gate3-B on the base substrate, and the third top gate electrode Gate3-T is connected to the third bottom gate electrode Gate3-B through the fourth via V4.

In an exemplary embodiment, a side of the third top gate electrode Gate3-T close to the fourth plate CF4 is provided with a third gate block 103, the third gate block 103 may have a shape of a bending line extending in the first direction X, and the third gate block 103 is configured to be connected to a twelfth connection electrode formed subsequently.

In an exemplary embodiment, the fifth gate electrode Gate5 may serve as a gate electrode of the fifth transistor T5, and an orthographic projection of the fifth gate electrode Gate5 on the base substrate at least partially overlaps an orthographic projection of the fifth active layer on the base substrate. The fifth gate electrode Gate5 may be located between the first scan signal line S1 and the third top gate electrode Gate3-T, and the fifth gate electrode Gate5 may be comb-shaped.

In an exemplary embodiment, a side of the fifth gate electrode Gate5 close to the first scan signal line S1 is provided with a fifth gate block 105, which may have a shape of a strip extending along the second direction Y, and the fifth gate block 105 is configured to be connected with the twenty-seventh connection electrode subsequently formed.

In an exemplary embodiment, the sixth gate electrode Gate6 may serve as a gate electrode of the sixth transistor T6, and an orthographic projection of the sixth gate electrode Gate6 on the base substrate at least partially overlaps an orthographic projection of the sixth active layer on the base substrate. The sixth gate electrode Gate6 may be located between the fourth plate CF4 and the third top gate electrode Gate3-T, and the sixth gate electrode Gate6 may be comb-shaped.

In an exemplary embodiment, a side of the sixth gate electrode Gate 6 close to the first scan signal line S1 is provided with a sixth gate block 106, the sixth gate block 106 may have a shape of a bending line extending along the second direction Y, and the sixth gate block 106 is configured to be connected with the twenty-second connection electrode subsequently formed.

In an exemplary embodiment, the ninth gate electrode Gate9 may serve as a gate electrode of the ninth transistor T9, and an orthographic projection of the ninth gate electrode Gate9 on the base substrate at least partially overlaps an orthographic projection of the ninth active layer on the base substrate. The ninth gate electrode Gate 9 may be located on a side of the fourth plate CF4 close to the first scan signal line S1 and connected to the fourth plate CF4.

In an exemplary embodiment, the fourth plate CF4 and the ninth gate electrode Gate 9 may be of an interconnected integral structure.

In an exemplary embodiment, the eleventh gate electrode Gate 11 may serve as a gate electrode of the eleventh transistor T11, and an orthographic projection of the eleventh gate electrode Gate 11 on the base substrate at least partially overlaps an orthographic projection of the eleventh active layer on the base substrate. The eleventh gate electrode Gate 11 may be located on a side of the fifth plate CF5 in the first direction X, and the eleventh gate electrode Gate 11 may have a shape of a bending line extending along the first direction X.

In an exemplary embodiment, the twelfth gate electrode Gate 12 may serve as a gate electrode of the twelfth transistor T12, an orthographic projection of the twelfth gate electrode Gate 12 on the base substrate overlaps at least partially an orthographic projection of the twelfth active layer on the base substrate. The twelfth gate electrode Gate 12 may be located between the first scan signal line S1 and the third top gate electrode Gate 3-T, and the twelfth gate electrode Gate 12 may be comb-shaped.

In an exemplary embodiment, a side of the twelfth gate electrode Gate 12 away from the fifth gate electrode Gate 5 is provided with a twelfth gate block 112, the twelfth gate block 112 has a shape of a strip extending along the first direction X, and the twelfth gate block 112 is configured to be connected with the twenty-third connection electrode subsequently formed.

In an exemplary embodiment, the plurality of connection electrodes of each circuit unit includes at least a first connection electrode CO1, a second connection electrode CO2, a third connection electrode CO3, a fourth connection electrode CO4, a fifth connection electrode CO5, and a sixth connection electrode CO6.

In an exemplary embodiment, the first connection electrode CO1 may be in a shape of rectangular and may be located at a notch of the fourth plate CF4, and the first connection electrode CO1 is connected to the first plate CF1 through the first via V1.

In an exemplary embodiment, the second connection electrode CO2 may be in a shape of rectangular, may be located at a notch of the fifth plate CF5, the second connection electrode CO2 may be connected to the second plate CF2 through the second via V2, and the second connection electrode CO2 may be connected to the eleventh gate electrode Gate 11.

In an exemplary embodiment, the second connection electrode CO2 and the eleventh gate electrode Gate 11 may be of an interconnected integral structure.

In an exemplary embodiment, the third connection electrode CO3 may be in a shape of rectangular and may be located at a notch of the sixth plate CF6, and the third connection electrode CO3 is connected to the third plate CF3 through the third via V3.

In an exemplary embodiment, the fourth connection electrode CO4 may have a shape of a bending line extending along the second direction Y, in the first direction X, the fourth connection electrode CO4 may be disposed between the fifth gate electrode Gate5 and the twelfth gate electrode Gate12 in the first direction X, and in the second direction Y, the fourth connection electrode CO4 may be disposed on a side of the first scan signal line S1 in the second direction Y, and the fourth connection electrode CO4 is configured to be connected with a thirteenth connection electrode and a fifteenth connection electrode formed subsequently.

In an exemplary embodiment, the fifth connection electrode CO5 may have a shape of a bending line extending along the first direction X and may be disposed between the first scan signal line S1 and the twelfth gate electrode Gate 12, the fifth connection electrode CO5 is configured to be connected to the nineteenth connection electrode and the twentieth connection electrode formed subsequently.

In an exemplary embodiment, the sixth connection electrode CO6 may have a shape of a strip extending along the first direction X, may be provided between the second scan signal line S2 and the high-frequency signal line Hf, and the sixth connection electrode CO6 is configured to be connected with the twenty-fifth connection electrode and the twenty-sixth connection electrode formed subsequently.

In an exemplary embodiment, the pattern of the second conductive layer may further include a seventh connection electrode CO7 provided in the third circuit unit Q3, the seventh connection electrode CO7 may have a rectangular shape, the seventh connection electrode CO7 is connected to the power supply electrode 11 through the fifth via V5, and the seventh connection electrode CO7 is configured to be connected to the thirty-third connection electrode formed subsequently.

In an exemplary embodiment, after the pattern of the second conductive layer is formed, the semiconductor layer may be subjected to a conductorization treatment by using the second conductive layer as a shield. A region of the semiconductor layer, which is shielded by the second conductive layer, forms channel regions of the first transistors T1 to the twelfth transistors T12, and a region of the semiconductor layer, which is not shielded by the first conductive layer, is made to be conductorized, that is, first regions and second regions of the first transistors T1 to the twelfth transistors T12 are all made to be conductorized.

Figure 11:
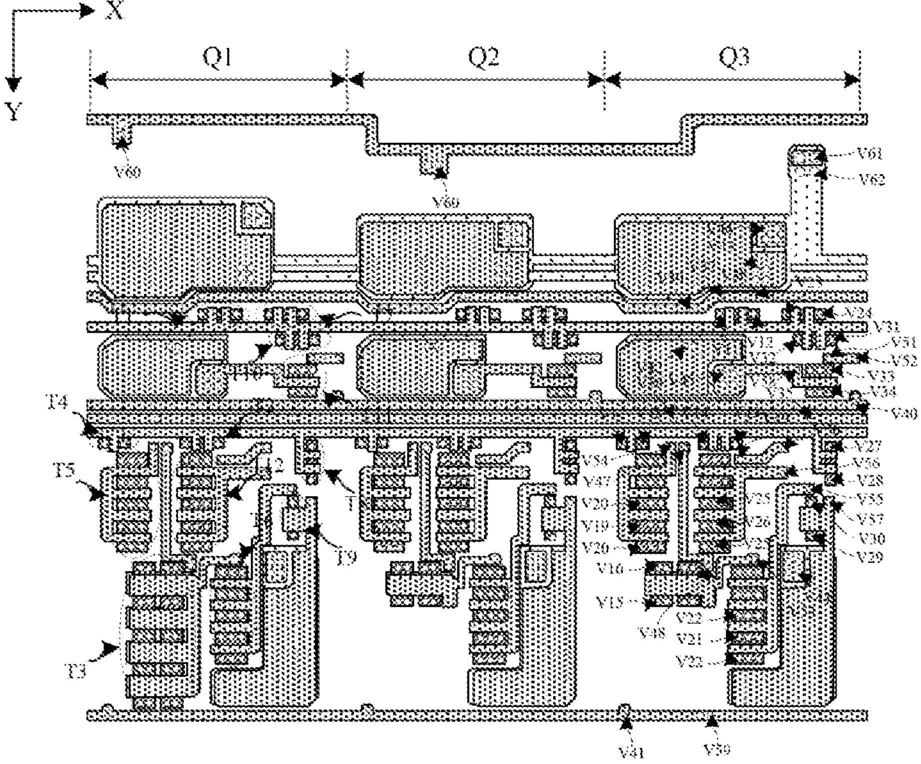
FIG. 11 is a schematic diagram of a display substrate after a pattern of a third insulating layer is formed according to the present disclosure.

(15) A pattern of a third insulation layer is formed. In an exemplary embodiment, forming a pattern of a third insulating layer may include depositing a third insulating film on the base substrate on which the above-mentioned patterns are formed, patterning the third insulating film using a patterning process to form a third insulating layer covering the second conductive layer, and a plurality of vias are provided on the third insulating layer, as shown in FIG. 11.

In an exemplary embodiment, the plurality of vias on the third insulating layer in each circuit unit includes at least an eleventh via V11 to a fifty-eighth via V58.

In an exemplary embodiment, an orthographic projection of the eleventh via V11 on the base substrate is within the range of an orthographic projection of the first region of the first active layer on the base substrate, the third insulating layer and the second insulating layer in the eleventh via V11 are etched away to expose a surface of the first region of the first active layer, and the eleventh via V11 is configured such that the eleventh connection electrode subsequently formed is connected to the first region of the first active layer through the via.

In an exemplary embodiment, an orthographic projection of the twelfth via V12 on the base substrate is within a range of an orthographic projection of the second region of the first active layer on the base substrate, the third insulating layer and the second insulating layer in the twelfth via V12 are etched away to expose a surface of the second region of the first active layer, and the twelfth via V12 is configured such that the twelfth connection electrode subsequently formed is connected to the second region of the first active layer through the via.

In an exemplary embodiment, an orthographic projection of the thirteenth via V13 on the base substrate is within a range of an orthographic projection of the first region of the second active layer on the base substrate, the third insulating layer and the second insulating layer in the thirteenth via V13 are etched away to expose a surface of the first region of the second active layer, and the thirteenth via V13 is configured such that the twelfth connection electrode subsequently formed is connected to the first region of the second active layer through the via.

In an exemplary embodiment, an orthographic projection of the fourteenth via V14 on the base substrate is within a range of an orthographic projection of the second region of the second active layer on the base substrate, the third insulating layer and the second insulating layer in the fourteenth via V14 are etched away to expose a surface of the second region of the second active layer, and the fourteenth via V14 is configured such that a thirteenth connection electrode subsequently formed is connected to the second region of the second active layer through the via.

In an exemplary embodiment, an orthographic projection of the fifteenth via V15 on the base substrate is within a range of an orthographic projection of the first region of the third active layer on the base substrate, the third insulating layer and the second insulating layer within the fifteenth via V15 are etched away to expose a surface of the first region of the third active layer, and the fifteenth via V15 is configured such that the fourteenth connection electrode subsequently formed is connected to the first region of the third active layer through the via.

In an exemplary embodiment, an orthographic projection of the sixteenth via V16 on the base substrate is within a range of an orthographic projection of the second region of the third active layer on the base substrate, the third insulating layer and the second insulating layer within the sixteenth via V16 are etched away to expose a surface of the second region of the third active layer, and the sixteenth via V16 is configured such that the fifteenth connection electrode subsequently formed is connected to the second region of the third active layer through the via.

In an exemplary embodiment, an orthographic projection of the seventeenth via V17 on the base substrate is within a range of an orthographic projection of the first region of the fourth active layer on the base substrate, the third insulating layer and the second insulating layer in the seventeenth via V17 are etched away to expose a surface of the first region of the fourth active layer, and the seventeenth via V17 is configured such that the data signal line subsequently formed is connected to the first region of the fourth active layer through the via.

In an exemplary embodiment, an orthographic projection of the eighteenth via V18 on the base substrate is within a range of an orthographic projection of the second region of the fourth active layer on the base substrate, the third insulating layer and the second insulating layer within the eighteenth via V18 are etched away to expose a surface of the second region of the fourth active layer, and the eighteenth via V18 is configured such that the fourteenth connection electrode subsequently formed is connected to the second region of the fourth active layer through the via.

In an exemplary embodiment, an orthographic projection of the nineteenth via V19 on the base substrate is within a range of an orthographic projection of the first region of the fifth active layer on the base substrate, the third insulating layer and the second insulating layer in the nineteenth via V19 are etched away to expose a surface of the first region of the fifth active layer, and the nineteenth via V19 is configured such that the sixteenth connection electrode subsequently formed is connected to the first region of the fifth active layer through the via.

In an exemplary embodiment, an orthographic projection of the twentieth via V20 on the base substrate is within a range of an orthographic projection of the second region of the fifth active layer on the base substrate, the third insulating layer and the second insulating layer in the twentieth via V20 are etched away to expose a surface of the second region of the fifth active layer, and the twentieth via V20 is configured such that the fourteenth connection electrode subsequently formed is connected to the second region of the fifth active layer through the via.

In an exemplary embodiment, the nineteenth vias V19 and twentieth vias V20 are both plural, and the multiple nineteenth vias V19 and twentieth vias V20 are alternately arranged in the second direction Y.

In an exemplary embodiment, an orthographic projection of the twenty-first via V21 on the base substrate is within a range of an orthographic projection of the first region of the sixth active layer on the base substrate, the third insulating layer and the second insulating layer in the twenty-first via V21 are etched away to expose a surface of the first region of the sixth active layer, and the twenty-first via V21 is configured such that the fifteenth connection electrode subsequently formed is connected to the first region of the sixth active layer through the via.

In an exemplary embodiment, an orthographic projection of the twenty-second via V22 on the base substrate is within an orthographic projection of the second region of the sixth active layer on the base substrate, the third insulating layer and the second insulating layer in the twenty-second via V22 are etched away to expose a surface of the second region of the sixth active layer, and the twenty-second via V22 is configured such that the seventeenth connection electrode subsequently formed is connected to the second region of the sixth active layer through the via.

In an exemplary embodiment, the twenty-first vias V21 and twenty-second vias V22 are both plural, and the plural twenty-first vias V21 and twenty-second vias V22 are alternately arranged in the second direction Y.

In an exemplary embodiment, an orthographic projection of the twenty-third via V23 on the base substrate is within a range of an orthographic projection of the first region of the seventh active layer on the base substrate, the third insulating layer and the second insulating layer in the twenty-third via V23 are etched away to expose a surface of the seventh region of the seventh active layer, and the twenty-third via V23 is configured such that the eighteenth connection electrode subsequently formed is connected to the first region of the seventh active layer through the via.

In an exemplary embodiment, an orthographic projection of the twenty-fourth via V24 on the base substrate is within a range of an orthographic projection of the second region of the seventh active layer on the base substrate, the third insulating layer and the second insulating layer in the twenty-fourth via V24 are etched away to expose a surface of the second region of the seventh active layer, and the twenty-fourth via V24 is configured such that the nineteenth connection electrode subsequently formed is connected to the second region of the seventh active layer through the via.

In an exemplary embodiment, an orthographic projection of the twenty-fifth via V25 on the base substrate is within a range of an orthographic projection of the first region of the twelfth active layer on the base substrate, the third insulating layer and the second insulating layer within the twenty-fifth via V25 are etched away to expose a surface of the first region of the twelfth active layer, and the twenty-fifth via V25 is configured such that the seventeenth connection electrode subsequently formed is connected to the first region of the twelfth active layer through the via.

In an exemplary embodiment, an orthographic projection of the twenty-sixth via V26 on the base substrate is within an orthographic projection of the second region of the twelfth active layer on the base substrate, the third insulating layer and the second insulating layer in the twenty-sixth via V26 are etched away to expose a surface of the second region of the twelfth active layer, and the twenty-sixth via V26 is configured such that the twentieth connection electrode subsequently formed is connected to the second region of the twelfth active layer through the via.

In an exemplary embodiment, the twenty-fifth vias V25 and the twenty-sixth vias V26 are both plural, and the plural twenty-fifth vias V25 and the plural twenty-sixth vias V26 are alternately arranged in the second direction Y.

In an exemplary embodiment, an orthographic projection of the twenty-seventh via V27 on the base substrate is within a range of an orthographic projection of the first region of the eighth active layer on the base substrate, the third insulating layer and the second insulating layer in the twenty-seventh via V27 are etched away to expose a surface of the ninth region of the eighth active layer, and the twenty-seventh via V27 is configured such that the duration signal line subsequently formed is connected to the first region of the eighth active layer through the via.

In an exemplary embodiment, an orthographic projection of the twenty-eighth via V28 on the base substrate is within a range of an orthographic projection of the second region of the eighth active layer on the base substrate, the third insulating layer and the second insulating layer in the twenty-eighth via V28 are etched away to expose a surface of the second region of the eighth active layer, and the twenty-eighth via V28 is configured such that the twenty-first connection electrode subsequently formed is connected to the second region of the eighth active layer through the via.

In an exemplary embodiment, an orthographic projection of the twenty-ninth via V29 on the base substrate is within a range of an orthographic projection of the first region of the ninth active layer on the base substrate, the third insulating layer and the second insulating layer within the twenty-ninth via V29 are etched away to expose a surface of the first region of the ninth active layer, and the twenty-ninth via V29 is configured such that the twenty-second connection electrode subsequently formed is connected to the first region of the ninth active layer through the via.

In an exemplary embodiment, an orthographic projection of the thirtieth via V30 on the base substrate is within a range of an orthographic projection of the second region of the ninth active layer on the base substrate, the third insulating layer and the second insulating layer within the thirtieth via V30 are etched away to expose a surface of the second region of the ninth active layer, and the thirtieth via V30 is configured such that the twenty-third connection electrode subsequently formed is connected to the second region of the ninth active layer through the via.

In an exemplary embodiment, an orthographic projection of the thirty-first via V31 on the base substrate is within a range of an orthographic projection of the first region of the tenth active layer on the base substrate, the third insulating layer and the second insulating layer in the thirty-first via V31 are etched away to expose a surface of the first region of the tenth active layer, and the thirty-first via V31 is configured such that the duration signal line subsequently formed is connected to the first region of the tenth active layer through the via.

In an exemplary embodiment, an orthographic projection of the thirty-second via V32 on the base substrate is within a range of an orthographic projection of the second region of the tenth active layer on the base substrate, the third insulating layer and the second insulating layer within the thirty-second via V32 are etched away to expose a surface of the second region of the tenth active layer, and the thirty-second via V32 is configured such that the twenty-fourth connection electrode subsequently formed is connected to the second region of the tenth active layer through the via.

In an exemplary embodiment, an orthographic projection of the thirty-third via V33 on the base substrate is within a range of an orthographic projection of the first region of the eleventh active layer on the base substrate, the third insulating layer and the second insulating layer in the thirty-third via V33 are etched away to expose a surface of the first region of the eleventh active layer, and the thirty-third via V33 is configured such that the twenty-fifth connection electrode subsequently formed is connected to the first region of the eleventh active layer through the via.

In an exemplary embodiment, an orthographic projection of the thirty-fourth via V34 on the base substrate is within a range of an orthographic projection of the second region of the eleventh active layer on the base substrate, the third insulating layer and the second insulating layer within the thirty-fourth via V34 are etched away to expose a surface of the second region of the eleventh active layer, and the thirty-fourth via V34 is configured such that the twenty-third connection electrode subsequently formed is connected to the second region of the eleventh active layer through the via.

In an exemplary embodiment, the orthographic projections of the thirty-fifth via V35 and the thirty-sixth via V36 on the base substrate are within the range of an orthographic projection of the light-emitting signal line EM on the base substrate, the third insulating layers in the thirty-fifth via V35 and the thirty-sixth via V36 are etched away to expose a surface of the light-emitting signal line EM, respectively, and the thirty-fifth via V35 and the thirty-sixth via V36 are configured such that the twenty-second connection electrode and twenty-seventh connection electrode which are subsequently formed are connected to the light-emitting signal line EM, respectively, through the above-mentioned vias.

In an exemplary embodiment, the orthographic projections of the thirty-seventh, thirty-eighth and thirty-ninth vias V37, V38 and V39 on the base substrate are respectively within the range of an orthographic projection of the initial signal line Vint on the base substrate, the third insulating layers in the thirty-seventh, thirty-eighth and thirty-ninth vias V37, V38 and V39 are etched away to expose a surface of the initial signal line Vint, respectively, and the thirty-seventh, thirty-eighth and thirty-ninth vias V37, V38 and V39 are configured such that the eleventh, eighteenth and twenty-eighth connection electrodes which are subsequently formed are connected to the initial signal line Vint, respectively, through the above-mentioned vias.

In an exemplary embodiment, an orthographic projection of the fortieth via V40 on the base substrate is within a range of an orthographic projection of the high-frequency connection block of the high-frequency signal line Hf on the base substrate, the third insulating layer in the fortieth via V40 is etched away to expose a surface of the high-frequency connection block, and the fortieth via V40 is configured such that the twenty-sixth connection electrode subsequently formed is connected to the high-frequency signal line Hf through the via.

In an exemplary embodiment, an orthographic projection of the forty-first via V41 on the base substrate is within a range of an orthographic projection of the high-voltage connection block of the high-voltage connection line VDD-C on the base substrate, the third insulating layer in the forty-first via V41 is etched away to expose a surface of the high-voltage connection block, and the forty-first via V41 is configured such that the sixteenth connection electrode subsequently formed is connected to the high-voltage connection line VDD-C through the via.

In an exemplary embodiment, an orthographic projection of the forty-second via V42 on the base substrate is within a range of an orthographic projection of the fifth plate CF5 on the base substrate, the third insulating layer in the forty-second via V42 is etched away to expose a surface of the fifth plate CF5, and the forty-second via V42 is configured such that the twenty-eighth connection electrode subsequently formed is connected to the fifth plate CF5 through the via.

In an exemplary embodiment, an orthographic projection of the forty-third via V43 on the base substrate is within a range of an orthographic projection of the sixth plate CF6 on the base substrate, the third insulating layer in the forty-third via V43 is etched away to expose a surface of the sixth plate CF6, and the forty-third via V43 is configured such that the twelfth connection electrode subsequently formed is connected to the sixth plate CF6 through the via.

In an exemplary embodiment, an orthographic projection of the forty-fourth via V44 on the base substrate is within a range of an orthographic projection of the first connection electrode CO1 on the base substrate, the third insulating layer in the forty-fourth via V44 is etched away to expose a surface of the first connection electrode CO1, and the forty-fourth via V44 is configured such that the seventh plate subsequently formed is connected to the first connection electrode CO1 through the via.

In an exemplary embodiment, an orthographic projection of the forty-fifth via V45 on the base substrate is within a range of an orthographic projection of the second connection electrode CO2 on the base substrate, the third insulating layer in the forty-fifth via V45 is etched away to expose a surface of the second connection electrode CO2, and the forty-fifth via V45 is configured such that the eighth plate subsequently formed is connected to the second connection electrode CO2 through the via.

In an exemplary embodiment, an orthographic projection of the forty-sixth via V46 on the base substrate is within a range of an orthographic projection of the third connection electrode CO3 on the base substrate, the third insulating layer in the forty-sixth via V46 is etched away to expose a surface of the third connection electrode CO3, and the forty-sixth via V46 is configured such that the ninth plate subsequently formed is connected to the third connection electrode CO3 through the via.

In an exemplary embodiment, an orthographic projection of the forty-seventh via V47 on the base substrate is within a range of an orthographic projection of a first end of the fourth connection electrode CO4 on the base substrate, the third insulating layer in the forty-seventh via V47 is etched away to expose a surface of a first end of the fourth connection electrode CO4, and the forty-seventh via V47 is configured such that the thirteenth connection electrode subsequently formed is connected to a first end of the fourth connection electrode CO4 through the via.

In an exemplary embodiment, an orthographic projection of the forty-eighth via V48 on the base substrate is within a range of an orthographic projection of a second end of the fourth connection electrode CO4 on the base substrate, the third insulating layer in the forty-eighth via V48 is etched away to expose a surface of a second end of the fourth connection electrode CO4, and the forty-eighth via V48 is configured such that the fifteenth connection electrode subsequently formed is connected to a second end of the fourth connection electrode CO4 through the via.

In an exemplary embodiment, an orthographic projection of the forty-ninth via V49 on the base substrate is within a range of an orthographic projection of a first end of the fifth connection electrode CO5 on the base substrate, the third insulating layer in the forty-ninth via V49 is etched away to expose a surface of a first end of the fifth connection electrode CO5, and the forty-ninth via V49 is configured such that the twentieth connection electrode subsequently formed is connected to a first end of the fifth connection electrode CO5 through the via.

In an exemplary embodiment, an orthographic projection of the fiftieth via V50 on the base substrate is within a range of an orthographic projection of a second end of the fifth connection electrode CO5 on the base substrate, the third insulating layer in the fiftieth via V50 is etched away to expose a surface of a second end of the fifth connection electrode CO5, and the fiftieth via V50 is configured such that the nineteenth connection electrode subsequently formed is connected to a second end of the fifth connection electrode CO5 through the via.

In an exemplary embodiment, an orthographic projection of the fifty-first via V51 on the base substrate is within a range of an orthographic projection of a first end of the sixth connection electrode CO6 on the base substrate, the third insulating layer in the fifty-first via V51 is etched away to expose a surface of a first end of the sixth connection electrode CO6, and the fifty-first via V51 is configured such that the twenty-fifth connection electrode subsequently formed is connected to a first end of the sixth connection electrode CO6 through the via.

In an exemplary embodiment, an orthographic projection of the fifty-second via V52 on the base substrate is within a range of an orthographic projection of a second end of the sixth connection electrode CO6 on the base substrate, the third insulating layer in the fifty-second via V52 is etched away to expose a surface of a second end of the sixth connection electrode CO6, and the fifty-second via V52 is configured such that the twenty-sixth connection electrode subsequently formed is connected to a second end of the sixth connection electrode CO6 through the via.

In an exemplary embodiment, an orthographic projection of the fifty-third via V53 on the base substrate is within a range of an orthographic projection of the third gate block 103 of the third top gate electrode Gate3-T on the base substrate, the third insulating layer in the fifty-third via V53 is etched away to expose a surface of the third gate block 103, and the fifty-third via V53 is configured such that the twelfth connection electrode subsequently formed is connected to the third top gate electrode Gate3-T through the via.

In an exemplary embodiment, an orthographic projection of the fifty-fourth via V54 on the base substrate is within a range of an orthographic projection of the fifth gate block 105 of the fifth gate electrode Gate 5 on the base substrate, the third insulating layer in the fifty-fourth via V54 is etched away to expose a surface of the fifth gate block 105, and the fifty-fourth via V54 is configured such that the twenty-seventh connection electrode subsequently formed is connected to the fifth gate electrode Gate 5 through the via.

In an exemplary embodiment, an orthographic projection of the fifty-fifth via V55 on the base substrate is within a range of an orthographic projection of the sixth gate block 106 of the sixth gate electrode Gate 6 on the base substrate, the third insulating layer in the fifty-fifth via V55 is etched away to expose a surface of the sixth gate block 106, and the fifty-fifth via V55 is configured such that the twenty-second connection electrode subsequently formed is connected to the sixth gate electrode Gate 6 through the via.

In an exemplary embodiment, an orthographic projection of the fifty-sixth via V56 on the base substrate is within a range of an orthographic projection of the twelfth gate block 112 of the twelfth gate electrode Gate 12 on the base substrate, the third insulating layer in the fifty-sixth via V56 is etched away to expose a surface of the twelfth gate block 112, and the fifty-sixth via V56 is configured such that the twenty-third connection electrode subsequently formed is connected to the twelfth gate electrode Gate 12 through the via.

In an exemplary embodiment, an orthographic projection of the fifty-seventh via V57 on the base substrate is within a range of an orthographic projection of the ninth gate electrode Gate 9 on the base substrate, the third insulating layer in the fifty-seventh via V57 is etched away to expose a surface of the ninth gate electrode Gate 9, and the fifty-seventh via V57 is configured such that the twenty-first connection electrode subsequently formed is connected to the ninth gate electrode Gate 9 through the via.

In an exemplary embodiment, an orthographic projection of the fifty-eighth via V58 on the base substrate is within a range of an orthographic projection of the eleventh gate electrode Gate 11 on the base substrate, the third insulating layer in the fifty-eighth via V58 is etched away to expose a surface of the eleventh gate electrode Gate 11, and the fifty-eighth via V58 is configured such that the twenty-fourth connection electrode subsequently formed is connected to the eleventh gate electrode Gate 11 through the via.

In an exemplary embodiment, the plurality of vias on the third insulating layer may also include a fifty-ninth via V59 to a sixty-second via V62.

In an exemplary embodiment, an orthographic projection of the fifty-ninth via V59 on the base substrate is within a range of an orthographic projection of the high-voltage connection line VDD-C in the third circuit unit Q3 on the base substrate, the third insulating layer in the fifty-ninth via V59 is etched away to expose a surface of the high-voltage connection line VDD-C, and the fifty-ninth via V59 is configured such that the thirty-first connection electrode subsequently formed is connected to the high-voltage connection line VDD-C through the via.

In an exemplary embodiment, an orthographic projection of the sixtieth via V60 on the base substrate is within a range of an orthographic projection of the low-voltage connection block of the low-voltage connection line VSS-C in the first circuit unit Q1 and the second circuit unit Q2 on the base substrate, the third insulating layer in the sixtieth via V60 is etched away to expose a surface of the low-voltage connection block, and the sixtieth via V60 is configured such that the thirty-second connection electrode subsequently formed is connected to the low-voltage connection line VSS-C through the via.

In an exemplary embodiment, an orthographic projection of the sixty-first via V61 on the base substrate is within a range of an orthographic projection of the seventh connection electrode CO7 in the third circuit unit Q3 on the base substrate, the third insulating layer in the sixty-first via V61 is etched away to expose a surface of the seventh connection electrode CO7, and the sixty-first via V61 is configured such that the thirty-third connection electrode subsequently formed is connected to the seventh connection electrode CO7 through the via.

In an exemplary embodiment, an orthographic projection of the sixty-second via V62 on the base substrate is within a range of an orthographic projection of the power supply electrode 11 in the third circuit unit Q3 on the base substrate, the third insulating layer, the second insulating layer and the first insulating layer in the sixty-second via V62 are etched away to expose a surface of the power supply electrode 11, and the sixty-second via V62 is configured such that the thirty-third connection electrode subsequently formed is connected to the power supply electrode 11 through the via.

Figure 12A:
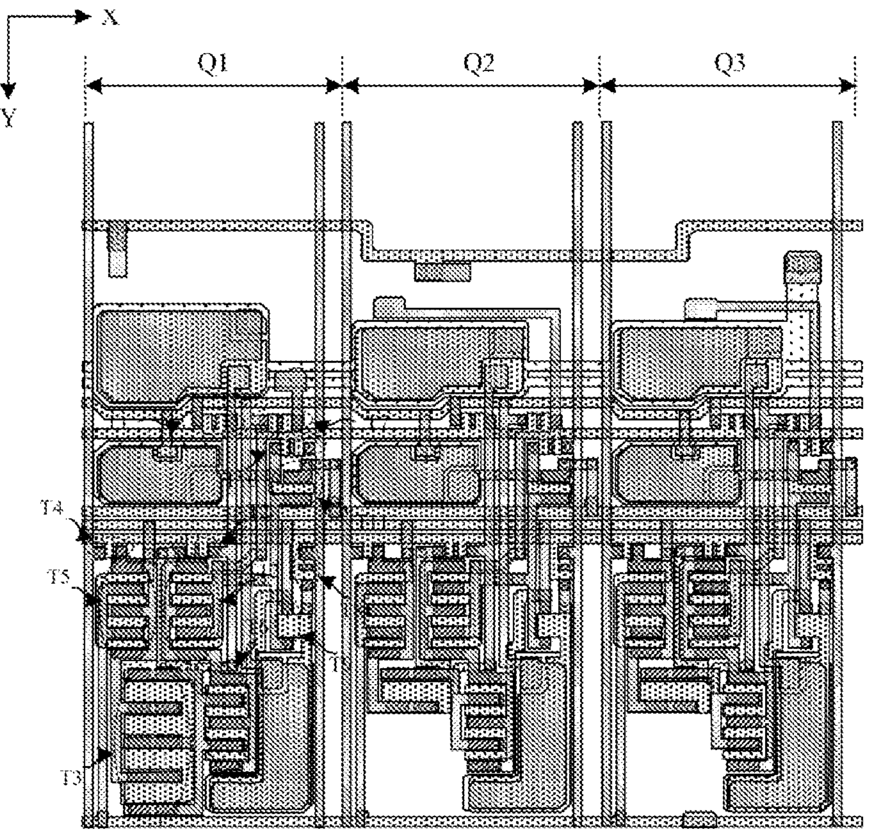
FIG. 12A and FIG. 12B are schematic diagrams of a display substrate after a pattern of a third conductive layer is formed according to the present disclosure.
Figure 12B:
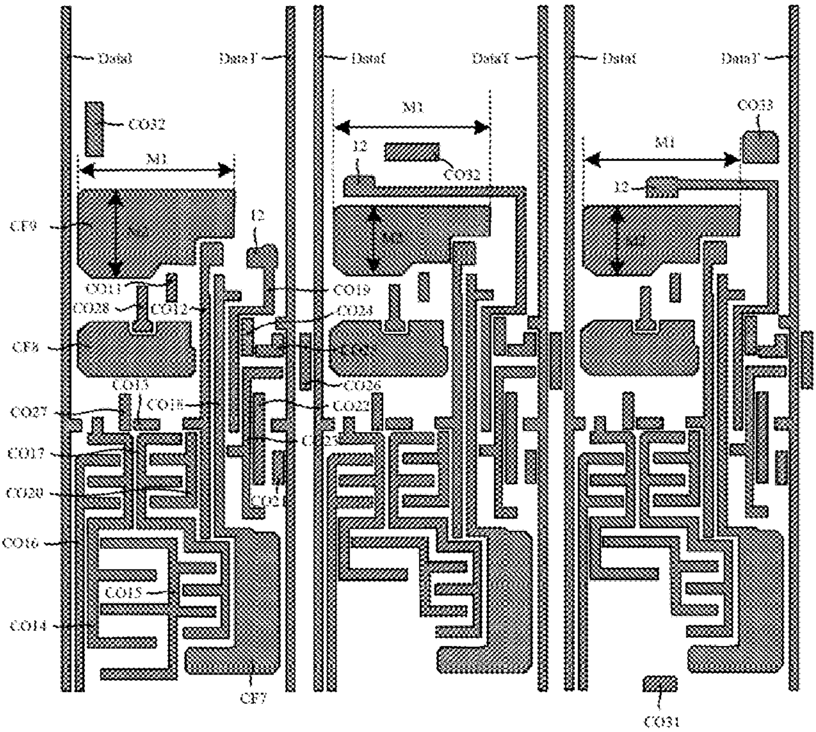

(16) A pattern of a third conductive layer is formed. In an exemplary embodiment, forming a pattern of a third conductive layer may include depositing a third conductive film on the base substrate on which the above-mentioned patterns are formed, patterning the third conductive film using a patterning process to form a pattern of the third conductive layer disposed on the third insulating layer, as shown in FIGS. 12A and 12B, FIG. 12B is a schematic plan view of the third conductive layer in FIG. 12A. In an exemplary implementation, the third conductive layer may be referred to as a first source drain metal (SD1) layer.

In an exemplary embodiment, the pattern of the third conductive layer of each circuit unit includes at least a data signal line DataI, a duration signal line DataT, a seventh plate CF7, an eighth plate CF8, a ninth plate CF9, an anode connection block 12, an eleventh connection electrode CO11 to a twenty-eighth connection electrode CO28.

In an exemplary embodiment, the data signal line DataI may have a shape of a line with a main body portion extending along the second direction Y and may be located on a side of the circuit unit in an opposite direction of the first direction X. The data signal line DataI is connected to the first region of the fourth active layer through the seventeenth via V17, thereby achieving that the data signal line DataI writes a data signal to the first electrode of the fourth transistor T4.

In an exemplary embodiment, the duration signal line DataT may have a shape of a line with a main body portion extending along the second direction Y, and may be located on a side of the circuit unit in the first direction X. On the one hand, the duration signal line DataT is connected to the first region of the eighth active layer through the twenty-seventh via V27, and on the other hand, the duration signal line DataT is connected to the first region of the tenth active layer through the thirty-first via V31, thereby achieving that the duration signal line DataT writes a duration signal to the first electrode of the eighth transistor T8 and the first electrode of the tenth transistor T10, respectively.

In an exemplary embodiment, the seventh plate CF7 may be shaped in a "L" shape, an orthographic projection of the seventh plate CF7 on the base substrate overlaps at least partially an orthographic projection of the fourth plate CF4 on the base substrate, and the seventh plate CF7 is connected to the first connection electrode CO1 through the forty-fourth via V44. The seventh plate CF7 may serve as another plate of the first capacitor, and the fourth plate CF4 and the seventh plate CF7 form another first capacitor of the pixel drive circuit.

In an exemplary embodiment, because the seventh plate CF7 is connected to the first connection electrode CO1 through the forty-fourth via V44, and the first connection electrode CO1 is connected to the first plate CF1 through the via, thus the first plate CF1 and the seventh plate CF7 have the same potential, so that the first plate CF1, the fourth plate CF4 and the third plate 97 form a first capacitor of a parallel structure, the first plate CF1 and the fourth plate CF4 form a first capacitor of the pixel drive circuit, the fourth plate CF4 and the seventh plate CF7 form another first capacitor of the pixel drive circuit, and the two first capacitors are connected in parallel.

In an exemplary embodiment, the eighth plate CF8 may be in a shape of rectangular, an orthographic projection of the eighth plate CF8 on the base substrate overlaps at least partially an orthographic projection of the fifth plate CF5 on the base substrate, and the eighth plate CF8 is connected to the second connection electrode CO2 through the forty-fifth via V45. The eighth plate CF8 may serve as another plate of the second capacitor, and the fifth plate CF5 and the eighth plate CF8 form another second capacitor of the pixel drive circuit.

In an exemplary embodiment, because the eighth plate CF8 is connected to the second connection electrode CO2 through the forty-fifth via V45, and the second connection electrode CO2 is connected to the second plate CF2 through a via, thus the second plate CF2 and the eighth plate CF8 have the same potential such that the second plate CF2, the fifth plate CF5 and the eighth plate CF8 form a second capacitor of a parallel structure, the second plate CF2 and the fifth plate CF5 form a second capacitor of the pixel drive circuit, the fifth plate CF5 and the eighth plate CF8 form another second capacitor of the pixel drive circuit, and the two second capacitors are connected in parallel.

In an exemplary embodiment, the ninth plate CF9 may be in a shape of rectangular, an orthographic projection of the ninth plate CF9 on the base substrate overlaps at least partially an orthographic projection of the sixth plate CF6 on the base substrate, and the ninth plate CF9 is connected to the third connection electrode CO3 through the forty-sixth via V46. The ninth plate CF9 may serve as another plate of the storage capacitor, and the sixth plate CF6 and the ninth plate CF9 form another storage capacitor of the pixel drive circuit.

In an exemplary embodiment, because the ninth plate CF9 is connected to the third connection electrode CO3 through the forty-sixth via V46, and the third connection electrode CO3 is connected to the third plate CF3 through a via, thus the third plate CF3 and the ninth plate CF9 have the same potential, so that the third plate CF3, the sixth plate CF6 and the ninth plate CF9 form a storage capacitor of a parallel structure, the third plate CF3 and the sixth plate CF6 form a storage capacitor of the pixel drive circuit, and the sixth plate CF6 and the ninth plate CF9 form another storage capacitor of the pixel drive circuit, and the two storage capacitors are connected in parallel.

In an exemplary embodiment, the position, shape and size of the ninth plate CF9 in the second circuit unit Q2 and the third circuit unit Q3 may be substantially the same, but different from the shape and size of the ninth plate CF9 in the first circuit unit Q1.

In an exemplary embodiment, the area of the ninth plate CF9 in the first circuit unit Q1 may be larger than the area of the ninth plate CF9 in the second circuit unit Q2, and the area of the ninth plate CF9 in the first circuit unit Q1 may be larger than the area of the ninth plate CF9 in the third circuit unit Q3, so that the capacitance value of the storage capacitor in the first circuit unit Q1 is larger than the capacitance value of the storage capacitor in the second circuit unit Q2 and the third circuit unit Q3.

In an exemplary embodiment, the first length M1 of the ninth plate CF9 in the first circuit unit Q1, the second circuit unit Q2, and the third circuit unit Q3 may be substantially the same, and the second length M2 of the ninth plate CF9 in the first circuit unit Q1 may be larger than the second length M2 of the ninth plate CF9 in the second circuit unit Q2 and the third circuit unit Q3 so that the area of the ninth plate CF9 in the first circuit unit Q1 is larger than the area of the ninth plate CF9 in the second circuit unit Q2 and the third circuit unit Q3.

In an exemplary embodiment, the ratio of the second length M2 of the ninth plate CF9 in the first circuit unit Q1 to the second length M2 of the ninth plate CF9 in the second circuit unit Q2 and the third circuit unit Q3 may be about 1 to 2. For example, the ratio can be about 1.3.

In an exemplary embodiment, the eleventh connection electrode CO11 may have a shape of a strip extending along the second direction Y, a first end of the eleventh connection electrode CO11 is connected to the first region of the first active layer through the eleventh via V11, and a second end of the eleventh connection electrode CO11 is connected to the initial signal line Vint through the thirty-seventh via V37, thereby achieving that the initial signal line Vint writes an initial signal to the first electrode of the first transistor T1.

In an exemplary embodiment, the twelfth connection electrode CO12 may have a shape of a strip extending along the second direction Y, a first end of the twelfth connection electrode CO12 close to the ninth plate CF9 is connected to the sixth plate CF6 through the forty-third via V43, a second end of the twelfth connection electrode CO12 close to the seventh plate CF7 is connected to the third gate block 103 through the fifty-third via V53, and a portion between the first end and a second end of the twelfth connection electrode CO12 is connected to the second region of the first active layer through the twelfth via V12 on the one hand, and is connected to the first region of the second active layer through the thirteenth via V13 on the other hand. In an exemplary embodiment, because the third gate block 103 is connected to the third top gate electrode Gate3-T and the third top gate electrode Gate3-T is connected to the third bottom gate electrode Gate3-B, the twelfth connection electrode CO12 causes the second electrode of the first transistor T1, the first electrode of the second transistor T2, the gate electrode of the third transistor T3 and the sixth plate CF6 to have the same potential (i.e., the third node N3 of the pixel drive circuit), and the twelfth connection electrode CO12 may be referred to as a third node electrode.

In an exemplary embodiment, the thirteenth connection electrode CO13 may have a shape of a strip extending along the first direction X, a first end of the thirteenth connection electrode CO13 is connected to the second region of the second active layer through the fourteenth via V14, and a second end of the thirteenth connection electrode CO13 is connected to a first end of the fourth connection electrode CO4 through the forty-seventh via V47.

In an exemplary embodiment, the fourteenth connection electrode CO14 may have a shape of a bending line extending along the second direction Y, a first end of the fourteenth connection electrode CO14 is connected to the first region of the third active layer through the fifteenth via V15, a second end of the fourteenth connection electrode CO14 is connected to the second region of the fourth active layer through the eighteenth via V18, and a portion between the first and second ends of the fourteenth connection electrode CO14 is connected to the second region of the fifth active layer through the twentieth via V20. In an exemplary embodiment, the fourteenth connection electrode CO14 causes the first electrode of the third transistor T3, the second electrode of the fourth transistor T4 and the second electrode of the fifth transistor T5 to have the same potential (i.e., the fifth node N5 of the pixel drive circuit), and the fourteenth connection electrode CO14 may be referred to as a fifth node electrode.

In an exemplary embodiment, the fifteenth connection electrode CO15 may have a shape of a bending line extending along the first direction X, a first end of the fifteenth connection electrode CO15 is connected to the second region of the third active layer through the sixteenth via V16, a second end of the fifteenth connection electrode CO15 is connected to the first region of the sixth active layer through the twenty-first via V21, and a portion between the first and second ends of the fifteenth connection electrode CO15 is connected to a second end of the fourth connection electrode CO4 through the forty-eighth via V48. In an exemplary embodiment, because the fourth connection electrode CO4 is connected to the thirteenth connection electrode CO13 through a via and the thirteenth connection electrode CO13 is connected to the second region of the second active layer, thus the fifteenth connection electrode CO15 causes the second electrode of the second transistor T2, the second electrode of the third transistor T3 and the first electrode of the sixth transistor T6 to have the same potential (i.e., the fourth node N4 of the pixel drive circuit), and the fifteenth connection electrode CO15 may be referred to as a fourth node electrode.

In an exemplary embodiment, the sixteenth connection electrode CO16 may have a shape of a bending line extending along the second direction Y, a first end of the sixteenth connection electrode CO16 is connected to the first region of the fifth active layer through the nineteenth via V19, and a second end of the sixteenth connection electrode CO16 is connected to the high-voltage connection line VDD-C through the forty-first via V41.

In an exemplary embodiment, the seventeenth connection electrode CO17 may have a shape of a bending line extending along the second direction Y, a first end of the seventeenth connection electrode CO17 is connected to the second region of the sixth active layer through the twenty-second via V22, and a second end of the seventeenth connection electrode CO17 is connected to the first region of the twelfth active layer through the twenty-fifth via V25, thereby achieving the connection between the second electrode of the sixth transistor T6 and the first electrode of the twelfth transistor T12.

In an exemplary embodiment, the eighteenth connection electrode CO18 may have a shape of a bending line extending along the second direction Y, a first end of the eighteenth connection electrode CO18 is connected to the initial signal line Vint through the thirty-eighth via V38, a second end of the eighteenth connection electrode CO18 is connected to the seventh plate CF7, and a portion between the first end and a second end of the eighteenth connection electrode CO18 is connected to the first region of the seventh active layer through the twenty-third via V23, enabling the initial signal line Vint to write an initial signal to the first electrode of the seventh transistor T7 and one plate of the first capacitor.

In an exemplary embodiment, the nineteenth connection electrode CO19 may have a shape of a bending line extending along the second direction Y, a first end of the nineteenth connection electrode CO19 is connected to the second region of the seventh active layer through the twenty-fourth via V24, and a second end of the nineteenth connection electrode CO19 is connected to a second end of the fifth connection electrode CO5 through the fiftieth via V50.

In an exemplary embodiment, the twentieth connection electrode CO20 may have a shape of a bending line extending along the second direction Y, a first end of the twentieth connection electrode CO20 is connected to the second region of the twelfth active layer through the twenty-sixth via V26, and a second end of the twentieth connection electrode CO20 is connected to a first end of the fifth connection electrode CO5 through the forty-ninth via V49.

In an exemplary embodiment, because the twentieth connection electrode CO20 is connected to a first end of the fifth connection electrode CO5 and the nineteenth connection electrode CO19 is connected to a second end of the fifth connection electrode CO5, thus the nineteenth connection electrode CO19, the fifth connection electrode CO5 and the twentieth connection electrode CO20, which are connected to each other, make the second electrode of the seventh transistor T7 and the second electrode of the twelfth transistor T12 have the same potential (i.e., the second node N2 of the pixel drive circuit).

In an exemplary embodiment, the anode connection block 12 may be disposed on a side of the nineteenth connection electrode CO19 away from the seventh plate CF7 and connected to the nineteenth connection electrode CO19 through a connection line, and the anode connection block 12 is configured to be connected to the anode connection electrode formed subsequently.

In an exemplary embodiment, the anode connection block 12 of the first circuit unit Q1 may be located on a side of the ninth plate CF9 in the first direction X, and the anode connection block 12 of the second circuit unit Q2 and the third circuit unit Q3 may be located on a side of the ninth plate CF9 in an opposite direction of the second direction Y.

In an exemplary embodiment, the twenty-first connection electrode CO21 may have a shape of a strip extending along the second direction Y, a first end of the twenty-first connection electrode CO21 is connected to the second region of the eighth active layer through the twenty-eighth via V28, and a second end of the twenty-first connection electrode CO21 is connected to the ninth gate electrode Gate 9 through the fifty-seventh via V57. Because the ninth gate electrode Gate9 is connected to the fourth plate CF4, thus the twenty-first connection electrode CO21 makes the second electrode of the eighth transistor T8, the gate electrode of the ninth transistor T9 and the fourth plate CF4 have the same potential (i.e., the sixth node N6 of the pixel drive circuit).

In an exemplary embodiment, the twenty-second connection electrode CO22 may have a shape of a strip extending along the second direction Y, a first end of the twenty-second connection electrode CO22 is connected to the first region of the ninth active layer through the twenty-ninth via V29, a second end of the twenty-second connection electrode CO22 is connected to the light emitting signal line EM through the thirty-fifth via V35, and a portion between the first end and a second end of the twenty-second connection electrode CO22 is connected to the sixth gate block 106 of the sixth gate electrode Gate6 through the fifty-fifth via V55, thereby achieving that the light emitting signal line EM controls the sixth transistor T6 to be turned on and turned off and writes the light emitting signal to the first electrode of the ninth transistor T9.

In an exemplary embodiment, the twenty-third connection electrode CO23 may have a shape of a strip extending along the second direction Y, a first end of the twenty-third connection electrode CO23 is connected to the second region of the ninth active layer through the thirtieth via V30, a second end of the twenty-third connection electrode CO23 is connected to the second region of the eleventh active layer through the thirty-fourth via V34, and a portion between the first end and a second end of the twenty-third connection electrode CO23 is connected to the twelfth gate block 112 of the twelfth gate electrode Gate 12 through the fifty-sixth via V56, thereby achieving that the second electrode of the ninth transistor T9, the second electrode of the eleventh transistor T11 and the gate electrode of the twelfth transistor T12 have the same potential (i.e., the first node N1 of the pixel drive circuit).

In an exemplary embodiment, the twenty-fourth connection electrode CO24 may have a shape of a strip extending along the second direction Y, a first end of the twenty-fourth connection electrode CO24 is connected to the second region of the tenth active layer through the thirty-second via V32, and a second end of the twenty-fourth connection electrode CO24 is connected to the eleventh gate electrode Gate 11 through the fifty-eighth via V58. Because the eleventh gate electrode Gate 11 is connected to the second connection electrode CO2 and the second connection electrode CO2 is connected to the second plate CF2 through a via, thus the twenty-fourth connection electrode CO24 makes the second electrode of the tenth transistor T10, the gate electrode of the eleventh transistor T11 and the second plate CF2 have the same potential (i.e., the seventh node N7 of the pixel drive circuit).

In an exemplary embodiment, the twenty-fifth connection electrode CO25 may be shaped in "L", a first end of the twenty-fifth connection electrode CO25 is connected to the first region of the eleventh active layer through the thirty-third via V33, and a second end of the twenty-fifth connection electrode CO25 is connected to a first end of the sixth connection electrode CO6 through the fifty-first via V51.

In an exemplary embodiment, the twenty-sixth connection electrode CO26 may have a shape of a strip extending along the second direction Y, a first end of the twenty-sixth connection electrode CO26 is connected to the high-frequency signal line Hf through the fortieth via V40, and a second end of the twenty-sixth connection electrode CO26 is connected to a second end of the sixth connection electrode CO6 through the fifty-second via V52.

Because the high-frequency signal line Hf is connected to the first region of the eleventh active layer through the twenty-sixth connection electrode CO26, the sixth connection electrode CO6, and the twenty-fifth connection electrode CO25, it is achieved that the high-frequency signal line Hf writes a high-frequency signal to the first electrode of the eleventh transistor T11.

In an exemplary embodiment, the twenty-seventh connection electrode CO27 may have a shape of a strip extending along the second direction Y, a first end of the twenty-seventh connection electrode CO27 is connected to the light emitting signal line EM through the thirty-sixth via V36, and a second end of the twenty-seventh connection electrode CO27 is connected to the fifth gate block 105 of the fifth gate electrode Gate5 through the fifty-fourth via V54, thereby achieving that the light emitting signal line EM controls the fifth transistor T5 to be turned on or turned off.

In an exemplary embodiment, the twenty-eighth connection electrode CO28 may have a shape of a strip extending along the second direction Y, a first end of the twenty-eighth connection electrode CO28 is connected to the initial signal line Vint through the thirty-ninth via V39, and a second end of the twenty-eighth connection electrode CO28 is connected to the fifth plate CF5 through the forty-second via V42, thereby achieving that the initial signal line Vint writes an initial signal to one of the plates of the second capacitor.

In an exemplary embodiment, the third conductive layer may also include a thirty-first connection electrode CO31, a thirty-second connection electrode CO32, and a thirty-third connection electrode CO33.

In an exemplary embodiment, the thirty-first connection electrode CO31 may have a rectangular shape and may be provided in the third circuit unit Q3. The thirty-first connection electrode CO31 is connected to a high-voltage connection line VDD-C in the third circuit unit Q3 through the fifty-ninth via V59. In an exemplary embodiment, the thirty-first connection electrode CO31 is configured to be connected to the high-voltage power supply line subsequently formed.

In an exemplary embodiment, the thirty-second connection electrode CO32 may be in a shape of rectangular and may be provided in the first circuit unit Q1 and the second circuit unit Q2, and the thirty-second connection electrode CO32 is connected to the low-voltage connection block of the low-voltage connection line VSS-C in the first circuit unit Q1 and the second circuit unit Q2 through the sixtieth via V60. In an exemplary embodiment, the thirty-second connection electrode CO32 is configured to be connected to the low-voltage power supply line subsequently formed.

In an exemplary embodiment, the thirty-third connection electrode CO33 may be in a shape of rectangular and may be provided in the third circuit unit Q3. On the one hand, the thirty-third connection electrode CO33 is connected to the seventh connection electrode CO7 through the sixty-first via V61, and on the other hand, the thirty-third connection electrode CO33 is connected to the power supply electrode 11 through the sixty-second via V62. In an exemplary embodiment, the thirty-third connection electrode CO33 is configured to be connected to the high-voltage power supply line subsequently formed.

Figure 13:
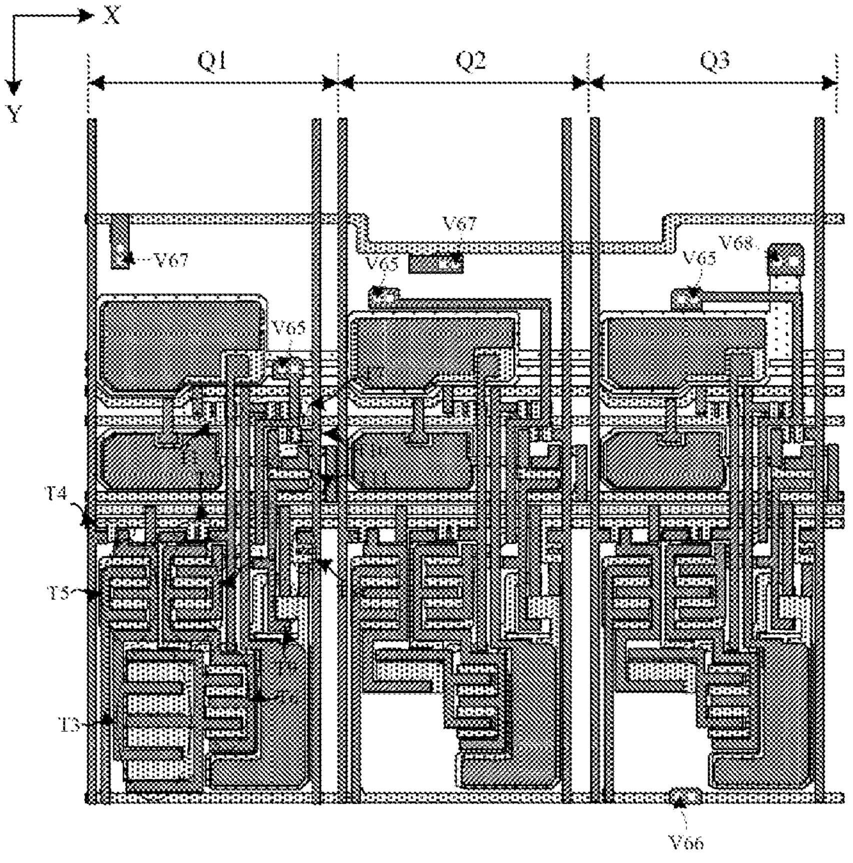
FIG. 13 is a schematic diagram of a display substrate after a pattern of a first planarization layer is formed according to the present disclosure.

(17) Patterns of a fourth insulation layer and a first planarization layer are formed. In an exemplary embodiment, forming patterns of a fourth insulating layer and a first planarization layer may include first coating a first planarization film on the base substrate on which the above-mentioned patterns are formed, patterning the first planarization film using a patterning process, then depositing a fourth insulating film, patterning the first planarization film using a patterning process to form the first planarization layer covering the pattern of the third conductive layer and form the fourth insulating layer disposed on a side of the first planarization layer away from the base substrate, wherein a plurality of vias are disposed on the fourth insulating layer and the first planarization layer, as shown in FIG. 13.

In an exemplary embodiment, the plurality of vias on the fourth insulating layer and the first planarization layer in each circuit unit include at least a sixty-fifth via V65.

In an exemplary embodiment, an orthographic projection of the sixty-fifth via V65 on the base substrate is within a range of an orthographic projection of the anode connection block 12 on the base substrate, the fourth insulating film and the first planarization film in the sixty-fifth via V65 are removed to expose a surface of the anode connection block 12, and the sixty-fifth via V65 is configured such that the anode connection electrode subsequently formed is connected to the anode connection block 12 through the via.

In an exemplary embodiment, the plurality of vias on the fourth insulating layer and the first planar layer may further include a sixty-sixth via V66, a sixty-seventh via V67, and a sixty-eighth via V68.

In an exemplary embodiment, an orthographic projection of the sixty-sixth via V66 on the base substrate is within a range of an orthographic projection of the thirty-first connection electrode CO31 on the base substrate and sixty-sixth via V66 may be provided in the third circuit unit Q3. The fourth insulating film and the first planarization film in the sixty-sixth via V66 are removed to expose a surface of the thirty-first connection electrode CO31, and the sixty-sixth via V66 is configured such that the high-voltage power supply line subsequently formed is connected to the thirty-first connection electrode CO31 through the via.

In an exemplary embodiment, an orthographic projection of the sixty-seventh via V67 on the base substrate is within a range of an orthographic projection of the thirty-second connection electrode CO32 on the base substrate and the sixty-seventh via V67 may be provided in the first circuit unit Q1 and the second circuit unit Q2, respectively. The fourth insulating film and the first planarization film in the sixty-seventh via V67 are removed to expose a surface of the thirty-second connection electrode CO32, and the sixty-seventh via V67 is configured such that the low-voltage power supply line subsequently formed is connected to the thirty-second connection electrode CO32 through the via.

In an exemplary embodiment, an orthographic projection of the sixty-eighth via V68 on the base substrate is within a range of an orthographic projection of the thirty-third connection electrode CO33 on the base substrate and the sixty-eighth via V68 may be provided in the third circuit unit Q3. The fourth insulating film and the first planarization film in the sixty-eighth via V68 are removed to expose a surface of the thirty-third connection electrode CO33, and the sixty-eighth via V68 is configured such that the high-voltage power supply line subsequently formed is connected to the thirty-third connection electrode CO33 through the via.

Figure 14A:
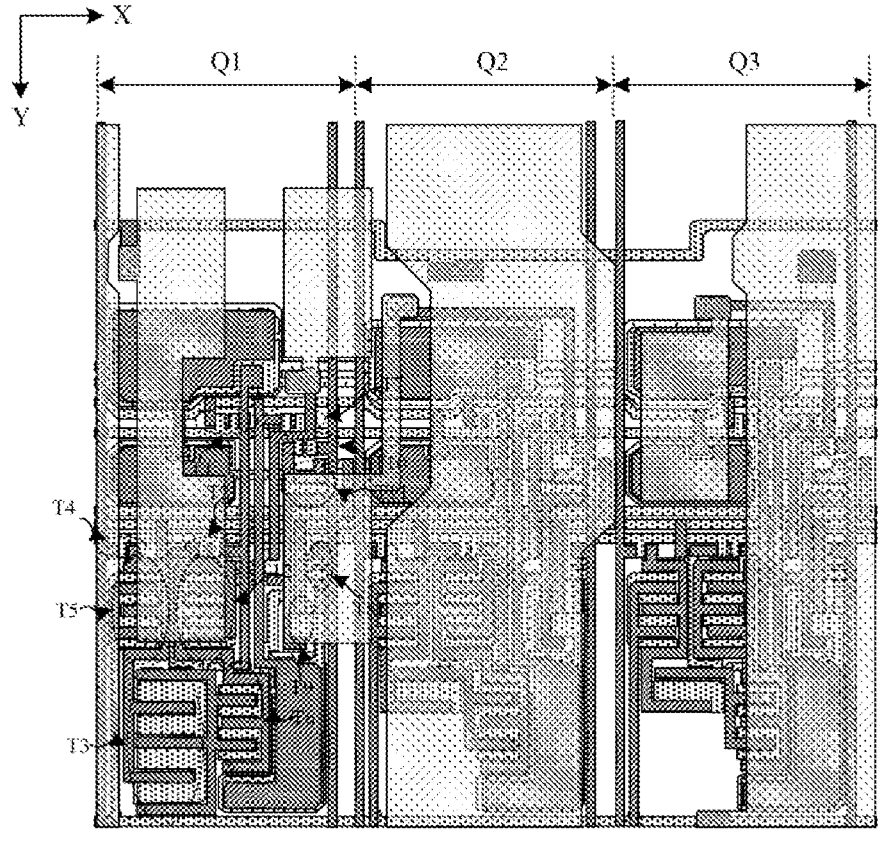
FIG. 14A and FIG. 14B are schematic diagrams of a display substrate after a pattern of a fourth conductive layer is formed according to the present disclosure.
Figure 14B:
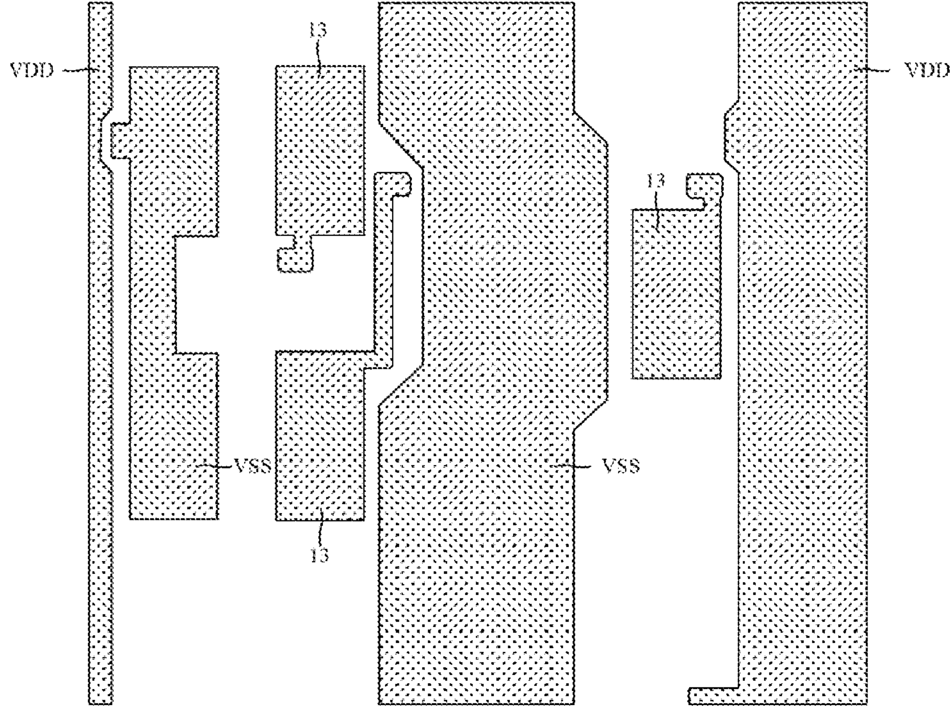

(18) A pattern of a fourth conductive layer is formed. In an exemplary embodiment, forming a pattern of a fourth conductive layer may include depositing a fourth conductive film on the base substrate on which the above-mentioned patterns are formed, patterning the fourth conductive film using a patterning process to form a pattern of the fourth conductive layer disposed on the fourth insulating layer, as shown in FIGS. 14A and 14B, FIG. 14B is a schematic plan view of the fourth conductive layer in FIG. 14A. In an exemplary embodiment, the fourth conductive layer may be referred to as a second source drain metal (SD2) layer.

In an exemplary embodiment, the pattern of the fourth conductive layer of each circuit unit includes at least an anode connection electrode 13.

In an exemplary embodiment, the anode connection electrode 13 may have a rectangular shape, the anode connection electrode 13 is connected to the anode connection block 12 through the sixty-fifth via V65, and the anode connection electrode 13 is configured to be bound and connected with the first electrode of the light emitting diode. Because the anode connection block 12 is connected to the nineteenth connection electrode CO19, the nineteenth connection electrode CO19 is connected to the twentieth connection electrode CO20 through the fifth connection electrode CO5, and the twentieth connection electrode CO20 is connected to the second region of the twelfth active layer through a via, therefore the connection between the anode connection electrode 13 and the second electrode of the seventh transistor T7 and the second electrode of the twelfth transistor T12 is achieved, and the pixel drive circuit can drive the light emitting diode to emit light.

In an exemplary embodiment, the pattern of the fourth conductive layer may include at least a high-voltage power supply line VDD, which may be referred to as a first power supply line, and a low voltage power supply line VSS, which may be referred to as a second power supply line.

In an exemplary embodiment, the high-voltage power supply line VDD may have a shape of a line extending along the second direction Y, and may be provided in the third circuit unit Q3. On the one hand, the high-voltage power supply line VDD is connected to the thirty-first connection electrode CO31 through the sixty-sixth via V66, and on the other hand, the high-voltage power supply line VDD is connected to the thirty-third connection electrode CO33 through the sixty-eighth via V68.

In an exemplary embodiment, because the thirty-first connection electrode CO31 is connected to the high-voltage connection line VDD-C through a via, the high-voltage connection line VDD-C extending along the first direction X and the high-voltage power supply line VDD extending along the second direction Y form a net-like connecting structure, which can not only minimize the resistance of a power supply transmission line, reduce the voltage drop of the power supply voltage, but also effectively improve the uniformity of the power supply voltage in the display substrate, effectively improve the uniformity in the signal plane, effectively improve the display uniformity, and improve the display attribute and the display quality.

In an exemplary embodiment, because the high-voltage connection line VDD-C is respectively connected to the sixteenth connection electrode CO16 of each circuit unit through a via, and the sixteenth connection electrode CO16 is connected to the first region of the fifth active layer through a via, it is achieved that the high-voltage power supply line VDD writes a first power supply signal to the first electrode of the fifth transistor T5 of each circuit unit.

In an exemplary embodiment, because the thirty-third connection electrode CO33 is connected to the power supply electrode 11 through the seventh connection electrode CO7, the power supply electrode 11 is connected to the third plate CF3 of an integral structure, and the third plate CF3 is connected to the ninth plate CF9 through the third connection electrode CO3, therefore the third plate CF3 and the ninth plate CF9 of the storage capacitor are made to have the potential of the high-voltage power supply line VDD. Because the sixth plate CF6 is connected to the twelfth connection electrode CO12 through a via, and the twelfth connection electrode CO12 is connected to the third top gate electrode Gate3-T through the via, thus the sixth plate CF6 has the potential of the gate electrode of the third transistor T3. Thus, the third plate CF3 having the potential of the high-voltage power supply line VDD and the sixth plate CF6 having the potential of the gate electrode of the third transistor T3 form one storage capacitor of the pixel drive circuit, and the sixth plate CF6 having the potential of the gate electrode of the third transistor T3 and the ninth plate CF9 having the potential of the high-voltage power supply line VDD form another storage capacitor of the pixel drive circuit.

In an exemplary embodiment, in the third circuit unit Q3, an orthographic projection of the high-voltage power supply line VDD on the base substrate overlaps at least partially an orthographic projection of the twelfth connection electrode CO12 on the base substrate. Because the high-voltage power supply line VDD has a constant potential, the high-voltage power supply line VDD can not only effectively shield the influence of data voltage jump and other signals on key nodes in the pixel drive circuit, avoid the influence of data voltage jump and other signals on the potential of the key nodes, effectively avoid crosstalk deterioration, and improve the display effect.

In an exemplary embodiment, the low-voltage power supply line VSS may have a shape of a line extending along the second direction Y and may be provided in the first circuit unit Q1 and the second circuit unit Q2, respectively, and the low-voltage power supply line VSS is connected to the thirty-second connection electrode CO32 through the sixty-seventh via V67.

In an exemplary embodiment, because the thirty-second connection electrode CO32 is connected to the low-voltage connection line VSS-C through a via, thus the low-voltage connection line VSS-C extending along the first direction X and the low-voltage power supply line VSS extending along the second direction Y form a net-like connecting structure, which can not only minimize the resistance of a power supply transmission line, reduce the voltage drop of the power supply voltage, but also effectively improve the uniformity of the power supply voltage in the display substrate, effectively improve the uniformity in the signal plane, effectively improve the display uniformity, and improve the display attribute and the display quality.

In an exemplary embodiment, in the second circuit unit Q2, an orthographic projection of the low-voltage power supply line VSS on the base substrate at least partially overlaps an orthographic projection of the twelfth connection electrode CO12 on the base substrate. Because the low-voltage power supply line VSS has a constant potential, the low-voltage power supply line VSS can not only effectively shield the influence of data voltage jump and other signals on key nodes in the pixel drive circuit, avoid the influence of data voltage jump and other signals on the potential of the key nodes, but also effectively avoid cross-talk deterioration, and improve the display effect.

Figure 15:
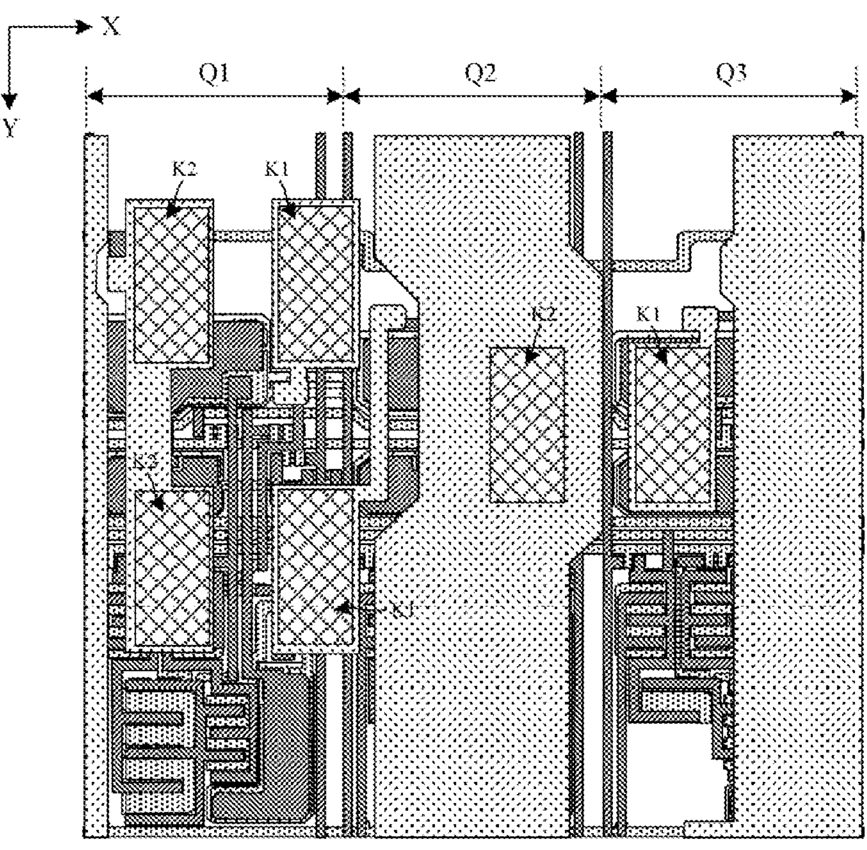
FIG. 15 is a schematic diagram of a display substrate after a pattern of a second planarization layer is formed according to the present disclosure.

(19) Patterns of a fifth insulating layer and a second planarization layer are formed. In an exemplary embodiment, forming patterns of a fifth insulating layer and a second planarization layer may include first depositing a fifth insulating film on the base substrate on which the above-mentioned patterns are formed, patterning the fifth insulating film through a patterning process, then coating a second planarization film, then depositing a sixth insulating film, patterning the fifth insulating film, the second planarization film and the sixth insulating film through a patterning process to form the fifth insulating layer covering the pattern of the fourth conductive layer, to form the second planarization layer disposed on a side of the fifth insulating layer away from the base substrate, and a sixth insulating layer disposed on a side of the second planarization layer away from the base substrate, a plurality of bonding holes are provided on the fifth insulating layer, the second planarization layer and the sixth insulating layer, as shown in FIG. 15.

In an exemplary embodiment, the plurality of bonding holes in each circuit unit include a first bonding hole K1 and a second bonding hole K2.

In an exemplary embodiment, the first bonding hole K1 may be in a shape of rectangular, an orthographic projection of the first bonding hole K1 on the base substrate is within a range of an orthographic projection of the anode connection electrode 13 on the base substrate, the sixth insulating film, the second planarization film and the fifth insulating film in the first bonding hole K1 are removed to expose a surface of the anode connection electrode 13, the region of the anode connection electrode 13 exposed by the first bonding hole K1 may serve as an anode pad, and the first bonding hole K1 is configured such that the first electrode of the light emitting diode is bound and connected with the anode connection electrode 13 through the bonding hole.

In an exemplary embodiment, the second bonding hole K2 may be in a shape of rectangular, an orthographic projection of the second bonding hole K2 on the base substrate is within a range of an orthographic projection of the low-voltage power supply line VSS on the base substrate, the sixth insulating film, the second planarization film and the fifth insulating film in the second bonding hole K2 are removed to expose a surface of the low-voltage power supply line VSS, the region of the low-voltage power supply line VSS exposed by the second bonding hole K2 may serve as a cathode pad, and the second bonding hole K2 is configured such that the second electrode of the light emitting diode is connected to the low-voltage power supply line VSS through the bonding hole.

So far, preparation of a drive circuit layer on the base substrate according to the present exemplary embodiment is completed. In a plane parallel to the display substrate, the drive circuit layer may include a plurality of circuit units, each of which may include a pixel drive circuit, and a first scan signal line, a second scan signal line, a light emitting signal line, a data signal line, a duration signal line, an initial signal line, a high-frequency signal line, and a high-voltage power supply line connected to the pixel drive circuit. In a plane perpendicular to the display substrate, the drive circuit layer may include at least a first conductive layer, a first insulating layer, a semiconductor layer, a second insulating layer, a second conductive layer, a third insulating layer, a third conductive layer, a first planarization layer, a fourth insulating layer, a fourth conductive layer, a fifth insulating layer and a second planarization layer arranged sequentially on the base substrate.

In an exemplary embodiment, the base substrate may be a flexible base substrate, or may be a rigid base substrate. The rigid base substrate may include, but be not limited to, one or more of glass and quartz. The flexible base substrate may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, the first conductive layer, the second conductive layer, the third conductive layer, and the fourth conductive layer may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, the third insulation layer, and the fourth insulation layer may be made of any one or more of Silicon Oxide (SiOx), Silicon Nitride (SiNx), and Silicon Oxynitride (SiON), and may be a single layer, a multi-layer, or a composite layer. The first planarization layer and the second planarization layer may be made of an organic material, such as resin. The semiconductor layer may be made of one or more materials, such as amorphous Indium Gallium Zinc Oxide (a-IGZO), Zinc Oxynitride (ZnON), Indium Zinc Tin Oxide (IZTO), amorphous Silicon (a-Si), polycrystalline Silicon (p-Si), hexathiophene, and polythiophene. That is, the present disclosure is applicable to a transistor manufactured based on an oxide technology, a silicon technology, and an organic matter technology. For example, the material of the semiconductor layer may be polycrystalline silicon (p-Si).

In an exemplary embodiment, a subsequent preparation process may include: firstly adding a bonding material (such as solder paste) into a plurality of first bonding holes and a plurality of second bonding holes using a glue dispenser, through the transfer and die bonding process, bonding and connecting the first electrodes of a plurality of light-emitting diodes with anode connection electrodes through the first bonding holes, and bonding and connecting the second electrodes of the plurality of light-emitting diodes with the low-voltage power supply line through the second bonding holes, and completing the connection between the light-emitting diodes and corresponding pixel drive circuits. Subsequently, a covering film is coated on the base substrate on which the above-mentioned structures are formed to form a covering layer, and the covering layer covers the plurality of light emitting diodes. In an exemplary embodiment, the plurality of light emitting diodes and the covering layer may form the light emitting structure layer.

As can be seen from the structure and preparation process of the display substrate described above, the display substrate provided by the exemplary embodiment of the present disclosure, by setting the width-length ratio of the third transistor in the first circuit unit greater than the width-length ratio of the third transistor in the second circuit unit and the third circuit unit, can be well adapted to the difference in the light output efficiency and yield of the red light emitting diode, the blue light emitting diode and the green light emitting diode, and can not only meet the current value required for the red light emitting diode, but also achieve more grayscales, avoiding the defects of the inadequacy of brightness or the inability to achieve more grayscale in existing structures.

By increasing the capacitance value of the storage capacitor in the first circuit unit, the present disclosure can effectively reduce the jump of the gate voltage of the third transistor, and can ensure the correct writing of the gate voltage. Research shows that, when the width-length ratios of the third transistor in different circuit units are different, the parasitic capacitance (such as gate-source capacitance Cgs and gate-drain capacitance Cgd) of the third transistor will increase with the increase of the width-length ratio, and the gate voltage of the third transistor will jump due to capacitive coupling is turned off in the gate electrode and the light emitting signal line is turned on, thereby affecting the correct writing of the gate voltage. Because the jump of the gate voltage is inversely proportional to the capacitance value of the storage capacitor, the jump of the gate voltage of the third transistor can be effectively reduced by increasing the capacitance value of the storage capacitor.

By adopting the first capacitor, the second capacitor and the storage capacitor in a parallel structure, the present disclosure minimizes the space occupied by the first capacitor, the second capacitor and the storage capacitor on the premise of ensuring the capacitance capacity, which is beneficial to achieving a high-resolution display. By forming the high-voltage power supply line and the low-voltage power supply line of a net connecting structure, the present disclosure can minimize the resistance of a power supply transmission line, reduce the voltage drop of the power supply voltage, effectively improve the uniformity of the power supply voltage in the display substrate, effectively improve the uniformity in the signal plane, effectively improve the display uniformity, and improve the display attribute and the display quality. The preparation process in the present disclosure may be compatible well with an existing preparation process, which is simple in process implementation, is easy to implement, and has a high production efficiency, a low production cost and a high yield.

Figure 16:
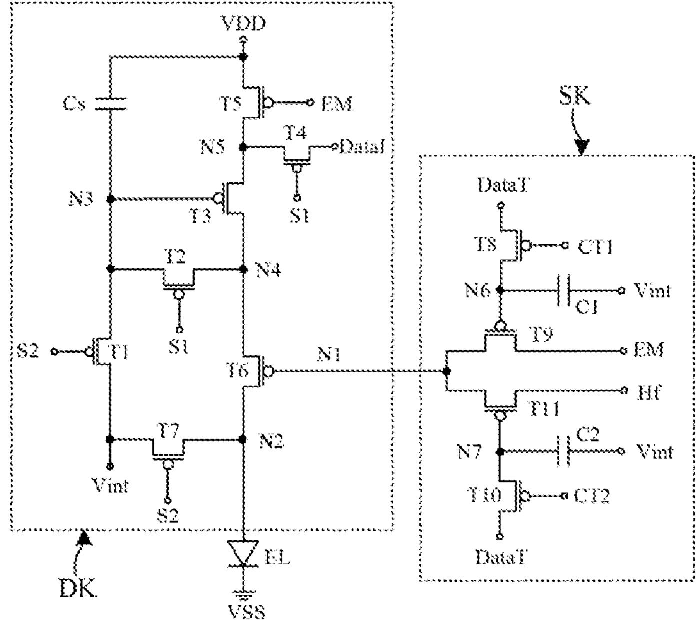
FIG. 16 is an equivalent circuit of another pixel drive circuit according to an exemplary embodiment of the present disclosure.

FIG. 16 is an equivalent circuit of another pixel drive circuit according to an exemplary embodiment of the present disclosure, illustrating a pixel drive circuit structure of 11T3C. In an exemplary embodiment, the pixel drive circuit according to the present exemplary embodiment may include at least a current control sub-circuit DK and a duration control sub-circuit SK. The current control sub-circuit DK may include at least a first transistor T1, a second transistor T2, a third transistor T3, a fourth transistor T4, a fifth transistor T5, a sixth transistor T6, a seventh transistor T7 and a storage capacitor Cs, and the duration control sub-circuit SK may include at least an eighth transistor T8, a ninth transistor T9, a tenth transistor T10, an eleventh transistor T11, a first capacitor C1 and a second capacitor C2. Unlike the pixel drive circuit shown in FIG. 3, the twelfth transistor T12 is not provided in the present embodiment and the duration control sub-circuit SK is connected to the gate electrode of the sixth transistor T6.

In an exemplary embodiment, the first node N1 of the present embodiment is respectively connected to the gate electrode of the sixth transistor T6, the second electrode of the ninth transistor T9 and the second electrode of the eleventh transistor T11, and the second node N2 is respectively connected to the second electrode of the sixth transistor T6, the second electrode of the seventh transistor T7 and the anode of the light emitting diode EL, and the other nodes have essentially the same structure as shown in FIG. 3.

In an exemplary embodiment, the gate electrode of the sixth transistor T6 is connected to the first node N1, the first electrode of the sixth transistor T6 is connected to the fourth node N4, and the second electrode of the sixth transistor T6 is connected to the second node N2. The connection relationships of the first transistor T1 to the fifth transistor T5, the seventh transistor T7, the eleventh transistor T11, the first capacitor C1, the second capacitor C2, and the storage capacitor Cs are substantially the same as structure shown in FIG. 3, which will not be repeated here.

Figure 17:
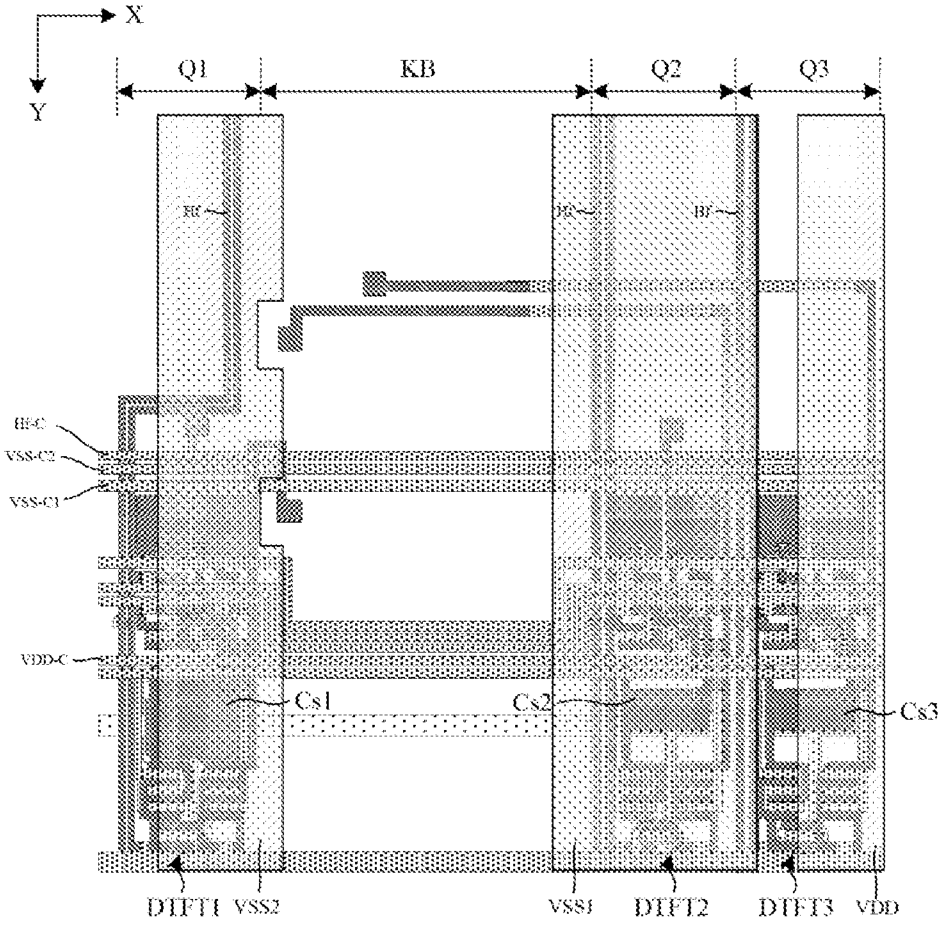
FIG. 17 is a schematic diagram of a structure of another display substrate according to an exemplary embodiment of the present disclosure.

FIG. 17 is a schematic diagram of a structure of another display substrate according to an exemplary embodiment of the present disclosure, illustrating a structure of three circuit units including the pixel drive circuit shown in FIG. 16. As shown in FIG. 17, the plurality of circuit units may include at least a first circuit unit Q1, a blank unit KB, a second circuit unit Q2, and a third circuit unit Q3 arranged sequentially along the first direction X, the blank unit KB is configured to dispose light emitting diodes and transmit light, no pixel drive circuit is not provided within the blank unit KB. The first pixel drive circuit in the first circuit unit Q1 is configured to be connected to a first light emitting diode, the second pixel drive circuit in the second circuit unit Q2 is configured to be connected to a second light emitting diode, and the third pixel drive circuit in the third circuit unit Q3 is configured to be connected to a third light emitting diode. The first light emitting diode may be a red light emitting diode, the second light emitting diode may be a green light emitting diode, and the third light emitting diode may be a blue light emitting diode.

In an exemplary embodiment, the first pixel drive circuit in the first circuit unit Q1 may include at least a first drive transistor DTFT1 and a first storage capacitor Cs1, the second pixel drive circuit in the second circuit unit Q2 may include at least a second drive transistor DTFT2 and a second storage capacitor Cs2, and the third pixel drive circuit in the third circuit unit Q3 may include at least a third drive transistor DTFT3 and a third storage capacitor Cs3. The width-length ratio (W/L) of the first drive transistor DTFT1 may be greater than the width-length ratio of the second drive transistor DTFT2 and the third drive transistor DTFT3, and the capacitance value of the first storage capacitor Cs1 may be greater than the capacitance value of the second storage capacitor Cs2 and the third storage capacitor Cs3.

In an exemplary embodiment, at least one circuit unit may include a high-frequency connection line Hf-C extending along the first direction X and a high-frequency signal line Hf extending along the second direction Y. The high-frequency signal line Hf may be connected to the high-frequency connection line Hf-C through a via to form a net-like connecting structure for transmitting a high-frequency signal.

In an exemplary embodiment, at least one circuit unit may include a high-voltage connection line VDD-C extending along the first direction X and a high-voltage power supply line VDD extending along the second direction Y. The high-voltage connection line VDD is connected to a corresponding pixel drive circuit, and the high-voltage power supply line VDD may be connected to the high-voltage connection line VDD-C through a via to form a net-like connecting structure for transmitting a high-voltage power supply signal.

In an exemplary embodiment, the low-voltage connection line may include at least a first low-voltage connection line VSS-C1 and a second low-voltage connection line VSS-C2, and the low-voltage power supply line may include at least a first low-voltage power supply line VSS1 and a second low-voltage power supply line VSS2.

In an exemplary embodiment, at least one circuit unit may include a first low-voltage connection line VSS-C1 extending along the first direction X and a first low-voltage power supply line VSS1 extending along the second direction Y, the first low-voltage power supply line VSS1 is connected to the first light emitting diode, and the first low-voltage power supply line VSS1 may be connected to the first low-voltage connection line VSS-C1 through a via to form a net-like connecting structure for transmitting a first low-voltage power supply signal.

In an exemplary embodiment, at least one circuit unit may include a second low-voltage connection line VSS-C2 extending along the first direction X and a second low-voltage power supply line VSS2 extending along the second direction Y, the second low-voltage power supply line VSS2 is connected to the second light emitting diode and the third light emitting diode, the second low-voltage power supply line VSS2 can be connected to the second low-voltage connection line VSS-C2 through a via to form a net-like connecting structure for transmitting a second low-voltage power supply signal.

Figure 18A:
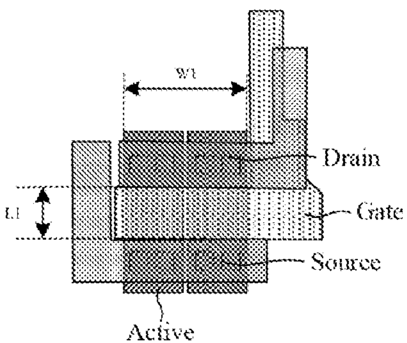
FIG. 18A is a schematic diagram of a structure of another first drive transistor according to the present disclosure.
Figure 18B:
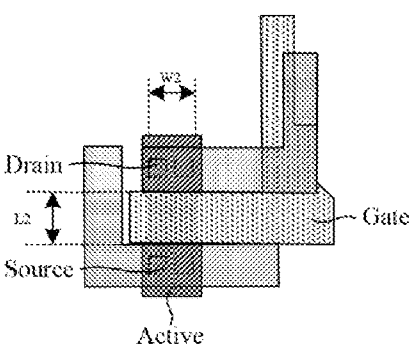
FIG. 18B is a schematic diagram of a structure of another second drive transistor according to the present disclosure.

FIG. 18A is a schematic diagram of a structure of another first drive transistor according to the present disclosure, and FIG. 18B is a schematic diagram of a structure of another second drive transistor according to the present disclosure. As shown in FIGS. 18A and 18B, the first drive transistor DTFT1 and the second drive transistor DTFT2 may each include an active layer (Active), a gate electrode (Gate), a first electrode (Source), and a second electrode (Drain), the first drive transistor DTFT1 has a first width-length ratio, the second drive transistor DTFT2 has a second width-length ratio, and the first width-length ratio may be greater than the second width-length ratio.

In an exemplary embodiment, the gate electrode (Gate), the first electrode (Source), and the second electrode (Drain) all have a shape of a strip extending along the first direction X, the active layers (Active) all have a shape of a strip extending along the second direction Y, the first drive transistor DTFT1 has a first channel length L1 and a first channel width W1, the second drive transistor DTFT2 has a second channel length L2 and a second channel width W2, the first channel length L1 and the second channel length L2 may be substantially the same, and the first channel width W1 may be greater than the second channel width W2.

In an exemplary embodiment, the ratio of the first channel width W1 to the second channel width W2 may be about 3.

In an exemplary embodiment, the shape and size of the gate electrode (Gate), the first electrode (Source) and the second electrode (Drain) of the first drive transistor DTFT1 and the second drive transistor DTFT2 may be substantially the same, and the width of the active layer (Active) of the first drive transistor DTFT1 may be greater than the width of the active layer (Active) of the second drive transistor DTFT2, and the width may be the size of the active layer (Active) in the first direction X.

In an exemplary embodiment, the second channel width of the second drive transistor DTFT2 may be substantially the same as the third channel width of the third drive transistor DTFT3, and the second channel length of the second drive transistor DTFT2 may be substantially the same as the third channel length of the third drive transistor DTFT3.

Figure 19A:
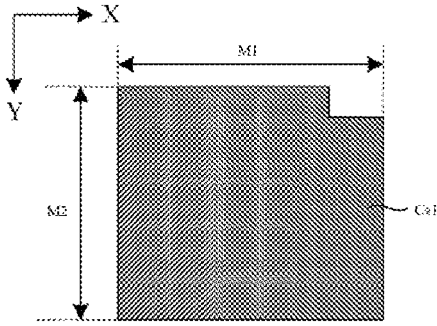
FIG. 19A is a schematic diagram of a structure of another first storage capacitor according to the present disclosure.
Figure 19B:
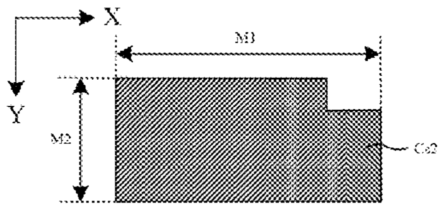
FIG. 19B is a schematic diagram of a structure of another second storage capacitor according to the present disclosure.

FIG. 19A is a schematic diagram of a structure of another first storage capacitor according to the present disclosure, and FIG. 19B is a schematic diagram of a structure of another second storage capacitor according to the present disclosure. As shown in FIGS. 19A and 19B, the first storage capacitor Cs1 has a first area, the second storage capacitor Cs2 has a second area, and the first area may be larger than the second area.

In an exemplary embodiment, the first length M1 of the first storage capacitor Cs1 may be substantially the same as the first length M1 of the second storage capacitor Cs2, and the second length M2 of the first storage capacitor Cs1 may be greater than the second length M2 of the second storage capacitor Cs2.

In an exemplary embodiment, the ratio of the second length M2 of the first storage capacitor Cs1 to the second length M2 of the second storage capacitor Cs2 may be about 1.8.

In an exemplary embodiment, the first length M1 of the second storage capacitor Cs2 may be substantially the same as the first length M1 of the third storage capacitor Cs3, and the second length M2 of the second storage capacitor Cs2 may be substantially the same as the second length M2 of the third storage capacitor Cs3.

In an exemplary embodiment, the preparation process of the drive circuit layer of the present embodiment may include the following operations.

Figure 20:
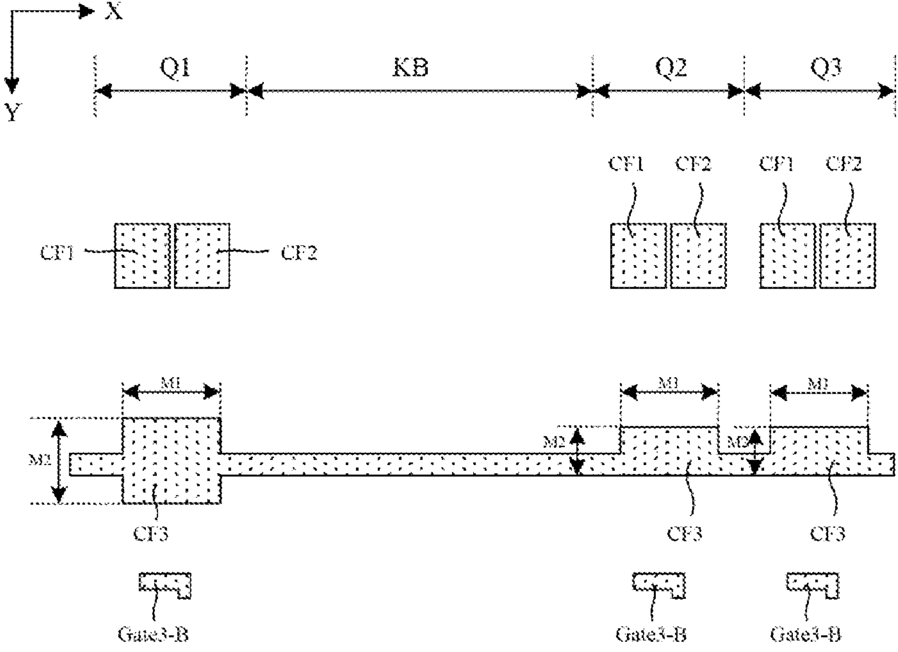
FIG. 20 is a schematic diagram of another display substrate after a pattern of a first conductive layer is formed according to the present disclosure.

(21) A pattern of a first conductive layer is formed. In an exemplary embodiment, forming a pattern of a first conductive layer may include depositing a first conductive film on the base substrate on which the above-mentioned patterns are formed, patterning the first conductive film through a patterning process to form a pattern of the first conductive layer disposed on the base substrate, as shown in FIG. 20.

In an exemplary embodiment, the pattern of the first conductive layer of each circuit unit may include at least a first plate CF1, a second plate CF2, a third plate CF3, and a third bottom gate electrode Gate3-B.

In an exemplary embodiment, the first, second and third plates CF1, CF2 and CF3 may be in a shape of rectangular, rectangle corners may be set with chamfer, the first and second plates CF1 and CF2 may be disposed on a side of the circuit unit in an opposite direction of the second direction Y, the third bottom gate electrode Gate3-B may be disposed on a side of the circuit unit in the second direction Y, and the third plate CF3 may be disposed between the first plate CF1 and the third bottom gate electrodes Gate3-B.

In an exemplary embodiment, the area of the third plate CF3 in the first circuit unit Q1 may be larger than the area of the third plate CF3 in the second circuit unit Q2, the area of the third plate CF3 in the first circuit unit Q1 may be larger than the area of the third plate CF3 in the third circuit unit Q3, and the position, shape and size of the third plate CF3 in the second circuit unit Q2 and the third circuit unit Q3 may be substantially the same.

In an exemplary embodiment, the first length M1 of the third plate CF3 in the first circuit unit Q1, the second circuit unit Q2, and the third circuit unit Q3 may be substantially the same, and the second length M2 of the third plate CF3 in the first circuit unit Q1 may be larger than the second length M2 of the third plate CF3 in the second circuit unit Q2 and the third circuit unit Q3, so that the area of the third plate CF3 in the first circuit unit Q1 is larger than the area of the third plate CF3 in the second circuit unit Q2 and the third circuit unit Q3.

In an exemplary embodiment, the ratio of the second length M2 of the third plate CF3 in the first circuit unit Q1 to the second length M2 of the third plate CF3 in the second circuit unit Q2 and the third circuit unit Q3 may be about 1 to 2. For example, the ratio can be about 1.8.

In an exemplary embodiment, the third bottom gate electrode Gate3-B may be shaped in "L", and the shape of the third bottom gate electrode Gate3-B in the first circuit unit Q1, the second circuit unit Q2, and the third circuit unit Q3 may be substantially the same.

In an exemplary embodiment, third plates CF3 in one unit row may be connected to each other by plate electrode connection lines, and a plurality of third plates CF3 and a plurality of plate electrode connection lines in one unit row may be of an interconnected integral structure.

Figure 21A:
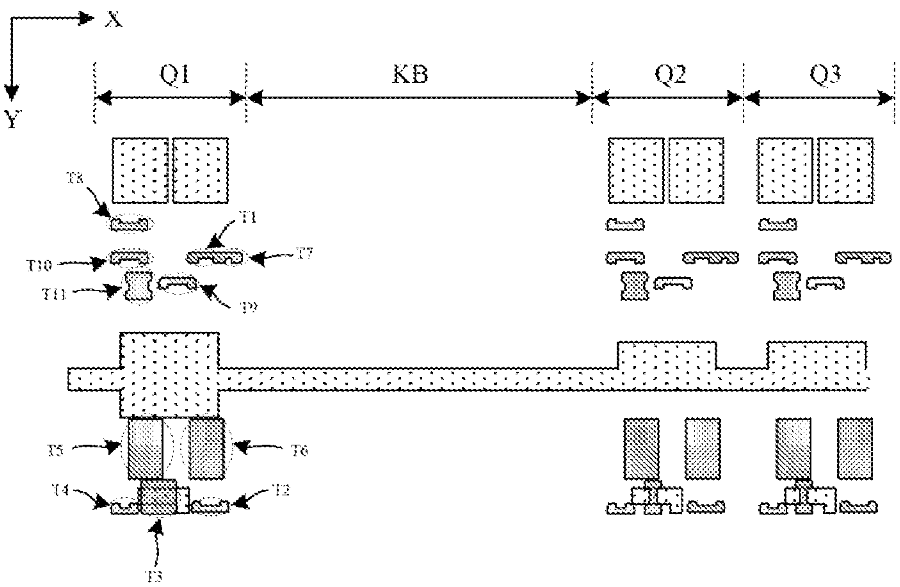
FIG. 21A and FIG. 21B are schematic diagrams of another display substrate after a pattern of a semiconductor layer is formed according to the present disclosure.
Figure 21B:
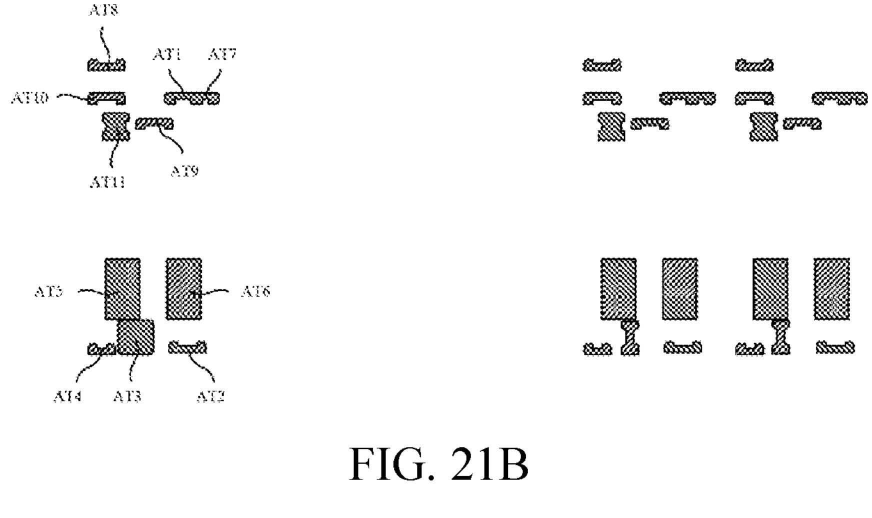

(22) A pattern of a semiconductor layer is formed. In an exemplary embodiment, forming a pattern of a semiconductor layer may include sequentially depositing a first insulating film and a first semiconductor film on the base substrate, patterning the first semiconductor film through a patterning process to form a first insulating layer covering the first conductive layer, and form a pattern of the semiconductor layer disposed on the first insulating layer, as shown in FIGS. 21A and 21B, FIG. 21B is a schematic plan view of the semiconductor layer in FIG. 21A.

In an exemplary embodiment, the pattern of the semiconductor layer of each circuit unit may include at least a first active layer AT1 of the first transistor T1 to an eleventh active layer AT11 of the eleventh transistor T11.

In an exemplary embodiment, the first active layer AT1, the second active layer AT2, the fourth active layer AT4, the seventh active layer AT7, the eighth active layer AT8, the ninth active layer AT9 and the tenth active layer AT10 may have a shape of a strip extending along the first direction X, the third active layer AT3 and the eleventh active layer AT11 may be in a shape of rectangular, and the fifth active layer AT5 and the sixth active layer AT6 may have a shape of a strip extending along the second direction Y.

In an exemplary embodiment, the first active layer AT1, the seventh active layer AT7 to the eleventh active layer AT118 may be located between the first plate CF1 and the third plate CF3. The eighth active layer AT8 may be located on a side of the first plate CF1 in the second direction Y, the tenth active layer AT10 may be located on a side of the eighth active layer AT8 in the second direction Y, the eleventh active layer AT11 may be located on a side of the tenth active layer AT10 in the second direction Y, the first active layer AT1 and the seventh active layer AT7 may be located on a side of the tenth active layer AT10 in the first direction X, the first active layer AT1 and the seventh active layer AT7 may be of an interconnected integral structure, and the ninth active layer AT9 may be located on a side of the eleventh active layer AT11 in the first direction X.

In an exemplary embodiment, the second active layer AT2 to the sixth active layer AT6 may be located on a side of the third plate CF3 in the second direction Y, an orthographic projection of the third active layer AT3 on the base substrate at least partially overlaps an orthographic projection of the third bottom gate electrode Gate3-B on the base substrate, the second active layer AT2 may be located on a side of the third active layer AT3 in the first direction X, the fourth active layer AT4 may be located on a side of the third active layer AT3 in an opposite direction of the first direction X, the fifth active layer AT5 and the sixth active layer AT6 may be located between the third plate CF3 and the third active layer AT3, and the sixth active layer AT6 may be located on a side of the fifth active layer AT5 in the first direction X.

In an exemplary embodiment, the width of the third active layer AT3 in the first circuit unit Q1 may be greater than the width of the third active layer AT3 in the second circuit unit Q2 and the third circuit unit Q3, and the width may be the size of the third active layer AT3 in the first direction X such that the width-length ratio of the drive transistor in the first circuit unit Q1 is greater than the width-length ratio of the drive transistor in the second circuit unit Q2 and the third circuit unit Q3.

Figure 22A:
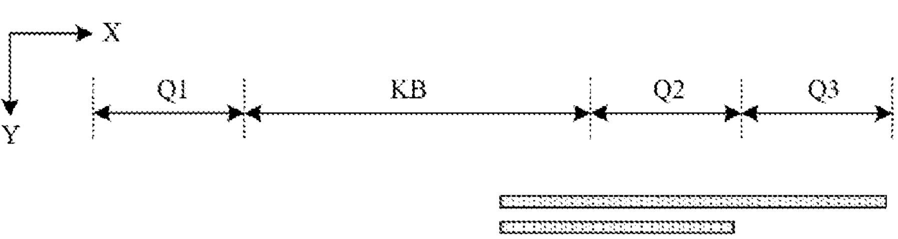
FIG. 22A and FIG. 22B are schematic diagrams of another display substrate after a pattern of a second conductive layer is formed according to the present disclosure.
Figure 22A:
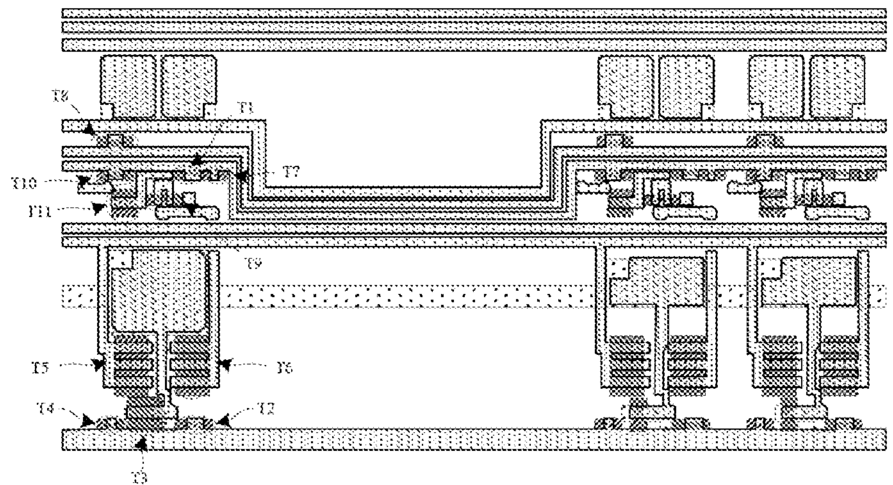
Figure 22B:
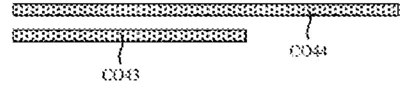
Figure 22B:
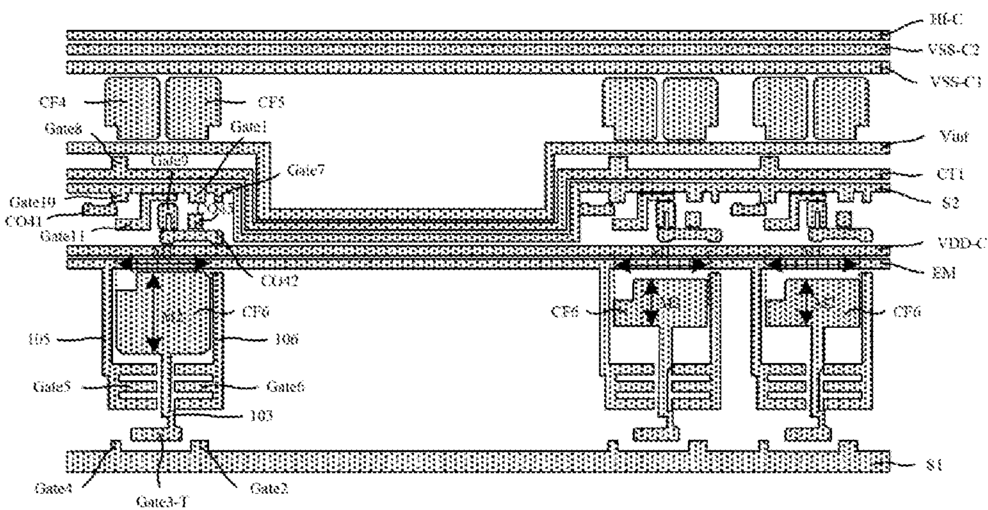

(23) A pattern of a second conductive layer is formed. In an exemplary embodiment, forming a pattern of a second conductive layer may include sequentially depositing a second insulating film and a second conductive film on the base substrate on which the above-mentioned patterns are formed, patterning the second conductive film using a patterning process to form a second insulating layer covering the semiconductor layer, and form a pattern of the second conductive layer disposed on the second insulating layer, as shown in FIGS. 22A and 22B, FIG. 22B is a schematic plan view of the second conductive layer in FIG. 22A.

In an exemplary embodiment, the pattern of the second conductive layer of each circuit unit includes at least a fourth plate CF4, a fifth plate CF5, a sixth plate CF6, a first scan signal line S1, a second scan signal line S2, a light emitting signal line EM, a first control line CT1, an initial signal line Vint, a high frequency connection line Hf-C, a high-voltage connection line VDD-C, a first low-voltage connection line VSS-C1, a second low-voltage connection line VSS-C2, a plurality of gate electrodes and a plurality of connection electrodes.

In an exemplary embodiment, the fourth, fifth, and sixth plates CF4, CF5, and CF6 may be in a shape of a rectangle in which a notch is provided at one corner. An orthographic projection of the fourth plate CF4 on the base substrate overlaps at least partially an orthographic projection of the first plate CF1 on the base substrate, the fourth plate CF4 serves as another plate of the first capacitor, the first plate CF1 and the fourth plate CF4 form a first capacitor of the pixel drive circuit. An orthographic projection of the fifth plate CF5 on the base substrate overlaps at least partially an orthographic projection of the second plate CF2 on the base substrate, the fifth plate CF5 serves as another plate of the second capacitor, and the second plate CF2 and the fifth plate CF5 form a second capacitor of the pixel drive circuit. An orthographic projection of the sixth plate CF6 on the base substrate at least partially overlaps an orthographic projection of the third plate CF3 on the base substrate, the sixth plate CF6 serves as another plate of the storage capacitor, and the third plate CF3 and the sixth plate CF6 form a storage capacitor of the pixel drive circuit.

In an exemplary embodiment, the position, shape and size of the sixth plate CF6 in the second circuit unit Q2 and the third circuit unit Q3 may be substantially the same, the area of the sixth plate CF6 in the first circuit unit Q1 may be larger than the area of the sixth plate CF6 in the second circuit unit Q2, and the area of the sixth plate CF6 in the first circuit unit Q1 may be larger than the area of the sixth plate CF6 in the third circuit unit Q3, so that the capacitance value of the storage capacitor in the first circuit unit Q1 is larger than the capacitance value of the storage capacitor in the second circuit unit Q2 and the third circuit unit Q3.

In an exemplary embodiment, the first length M1 of the sixth plate CF6 in the first circuit unit Q1, the second circuit unit Q2, and the third circuit unit Q3 may be substantially the same, and the second length M2 of the sixth plate CF6 in the first circuit unit Q1 may be larger than the second length M2 of the sixth plate CF6 in the second circuit unit Q2 and the third circuit unit Q3, so that the area of the sixth plate CF6 in the first circuit unit Q1 is larger than the area of the sixth plate CF6 in the second circuit unit Q2 and the third circuit unit Q3.

In an exemplary embodiment, the ratio of the second length M2 of the sixth plate CF6 in the first circuit unit Q1 to the second length M2 of the sixth plate CF6 in the second circuit unit Q2 and the third circuit unit Q3 may be about 1 to 2. For example, the ratio can be about 1.8.

In an exemplary embodiment, the first scan signal line S1, the second scan signal line S2, the light emitting signal line EM, the first control line CT1, the initial signal line Vint, the high-frequency connection line Hf-C, the high-voltage connection line VDD-C, the first low-voltage connection line VSS-C1, and the second low-voltage connection line VSS-C may have a shape of a straight line or a bending line with a main body portion extending in the first direction X. The first scan signal line S1 may be located on a side of the sixth plate CF6 in the second direction Y, the high frequency connection line Hf-C, the first low-voltage connection line VSS-C1 and the second low-voltage connection line VSS-C may be located on a side of the fourth plate CF4 and the fifth plate CF5 in an opposite direction of the second direction Y, and the second scan signal line S2, the light emitting signal line EM, the first control line CT1, the initial signal line Vint and the high-voltage connection line VDD-C may be located between the fourth plate CF4 and the sixth plate CF6.

In an exemplary embodiment, the first low-voltage connection line VSS-C1 may be located on a side of the fourth and fifth plates CF4 and CF5 in an opposite direction of the second direction Y, the second low-voltage connection line VSS-C may be located on a side of the first low-voltage connection line VSS-C1 away from the fourth and fifth plates CF4 and CF5, and the high-frequency connection line Hf-C may be located on a side of the second low-voltage connection line VSS-C away from the fourth and fifth plates CF4 and CF5.

In an exemplary embodiment, the high-voltage connection line VDD-C is configured to be connected with the high-voltage power supply line subsequently and is formed a net-like connecting structure with the high-voltage power supply line. The first low-voltage connection line VSS-C1 is configured to be connected with the first low-voltage power supply line formed subsequently to form a net-like connecting structure with the first low-voltage power supply line. The second low-voltage connection line VSS-C2 is configured to be connected with the second low-voltage power supply line formed subsequently to form a net-like connecting structure with the second low-voltage power supply line. The high-frequency connection line Hf-C is configured to be connected with the high-frequency signal line subsequently formed to form a net-like connecting structure with the high-frequency signal line.

In an exemplary embodiment, the initial signal line Vint may be located on a side of the fourth and fifth plates CF4 and CF5 in the second direction Y, the first control line CT1 may be located on a side of the initial signal line Vint in the second direction Y, the second scan signal line S2 may be located on a side of the first control line CT1 in the second direction Y, the high-voltage connection line VDD-C may be located on a side of the second scan signal line S2 in the second direction Y, and the light emitting signal line EM may be located on a side of the high-voltage connection line VDD-C in the second direction Y.

In an exemplary embodiment, the second scan signal line S2 may be reused as the second control line to control the tenth transistor T10 to be turned on and turned off.

In an exemplary embodiment, the plurality of gate electrodes of each circuit unit may include at least a first gate electrode Gate1, a second gate electrode Gate2, a third top gate electrode Gate3-T, a fourth gate electrode Gate4, a fifth gate electrode Gate5, a sixth gate electrode Gate6, a seventh gate electrode Gate7, an eighth gate electrode Gate8, a ninth gate electrode Gate9, a tenth gate electrode Gate10, and an eleventh gate electrode Gate11.

In an exemplary embodiment, the second gate electrode Gate2 and the fourth gate electrode Gate4 may be provided on a side of the first scan signal line S1 close to the sixth plate CF6. The second gate electrode Gate2 serves as a gate electrode of the second transistor T2, an orthographic projection of the second gate electrode Gate2 on the base substrate at least partially overlaps an orthographic projection of the second active layer on the base substrate, and the fourth gate electrode Gate4 serves as a gate electrode of the fourth transistor T4, an orthographic projection of the fourth gate electrode Gate4 on the base substrate at least partially overlaps an orthographic projection of the fourth active layer on the base substrate. In an exemplary embodiment, the first scan signal line S1, the second gate electrode Gate2, and the fourth gate electrode Gate4 may be of an interconnected integral structure.

In an exemplary embodiment, the first gate electrode Gate1, the seventh gate electrode Gate7, and the tenth gate electrode Gate10 may be disposed on a side of the second scan signal line S2 away from the initial signal line Vint. The first gate electrode Gate1 serves as a gate electrode of the first transistor T1, an orthographic projection of the first gate electrode Gate1 on the base substrate at least partially overlaps an orthographic projection of the first active layer on the base substrate, the seventh gate electrode Gate7 serves as a gate electrode of the seventh transistor T7, an orthographic projection of the seventh gate electrode Gate7 on the base substrate at least partially overlaps an orthographic projection of the seventh active layer on the base substrate, and the tenth gate electrode Gate10 serves as a gate electrode of the tenth transistor T10, an orthographic projection of the tenth gate electrode Gate10 on the base substrate at least partially overlaps an orthographic projection of the tenth active layer on the base substrate. In an exemplary embodiment, the second scan signal line S2, the first gate electrode Gate1, the seventh gate electrode Gate7, and the tenth gate electrode Gate10 may be of an interconnected integral structure.

In an exemplary embodiment, the eighth gate electrode Gate 8 may be provided on a side of the first control line CT1 close to the initial signal line Vint. The eighth gate electrode Gate 8 serves as a gate electrode of the eighth transistor T8, and an orthographic projection of the eighth gate electrode Gate 8 on the base substrate at least partially overlaps an orthographic projection of the eighth active layer on the base substrate. In an exemplary embodiment, the first control line CT1 and the eighth gate electrode Gate 8 may be of an interconnected integral structure.

In an exemplary embodiment, the third top gate electrode Gate3-T may serve as a top gate electrode of the third transistor T3, an orthographic projection of the third top gate electrode Gate3-T on the base substrate at least partially overlaps an orthographic projection of the third active layer on the base substrate, and an orthographic projection of the third top gate electrode Gate3-T on the base substrate at least partially overlaps an orthographic projection of the third bottom gate electrode Gate3-B on the base substrate.

In an exemplary embodiment, a side of the third top gate electrode Gate3-T close to the sixth plate CF6 is provided with a third gate block 103, the third gate block 103 may have a shape of a bending line extending along the second direction Y, a first end of the third gate block 103 is connected to the third top gate electrode Gate3-T, and a second end of the third gate block 103 is connected to the sixth plate CF6. In an exemplary embodiment, the third top gate electrode Gate3-T, the sixth plate CF6 and the third gate block 103 may be of an interconnected integral structure.

In an exemplary embodiment, the fifth gate electrode Gate5 may serve as a gate electrode of the fifth transistor T5, and an orthographic projection of the fifth gate electrode Gate5 on the base substrate at least partially overlaps an orthographic projection of the fifth active layer on the base substrate. The fifth gate electrode Gate5 may be located between the light emitting signal line EM and the third top gate electrode Gate3-T and located at a side of the third gate block 103 in an opposite direction of the first direction X, and the fifth gate electrode Gate5 may be comb-shaped.

In an exemplary embodiment, a side of the fifth gate electrode Gate5 close to the light emitting signal line EM is provided with a fifth gate block 105, which have a shape of a strip extending along the second direction Y, a first end of the fifth gate block 105 is connected to the fifth gate electrode Gate5, and a second end of the fifth gate block 105 is connected to the light emitting signal line EM, thereby achieving that the light emitting signal line EM can control the fifth transistor T5 to turned on or turned off. In an exemplary embodiment, the light emitting signal line EM, the fifth gate electrode Gate 5 and the fifth gate block 105 may be of an interconnected integral structure.

In an exemplary embodiment, the sixth gate electrode Gate6 may serve as a gate electrode of the sixth transistor T6, and an orthographic projection of the sixth gate electrode Gate6 on the base substrate at least partially overlaps an orthographic projection of the sixth active layer on the base substrate. The sixth gate electrode Gate6 may be located between the light emitting signal line EM and the third top gate electrode Gate3-T and located on a side of the third gate block 103 in the first direction X, and the sixth gate electrode Gate6 may be comb-shaped.

In an exemplary embodiment, a side of the sixth gate electrode Gate6 close to the light emitting signal line EM is provided with a sixth gate block 106, the sixth gate block 106 have a shape of a strip extending along the second direction Y, a first end of which is connected to the sixth gate electrode Gate6, a second end of which is close to the light emitting signal line EM, and the sixth gate block 106 is configured to be connected to the sixty-second connection electrode subsequently formed.

In an exemplary embodiment, the ninth gate electrode Gate9 may serve as a gate electrode of the ninth transistor T9, and an orthographic projection of the ninth gate electrode Gate9 on the base substrate at least partially overlaps an orthographic projection of the ninth active layer on the base substrate. The ninth gate electrode Gate 9 may be located between the second scan signal line S2 and the high-voltage connection line VDD-C, and the ninth gate electrode Gate 9 may have a shape of a strip extending along the second direction Y.

In an exemplary embodiment, the eleventh gate electrode Gate 11 may serve as a gate electrode of the eleventh transistor T11, and an orthographic projection of the eleventh gate electrode Gate 11 on the base substrate at least partially overlaps an orthographic projection of the eleventh active layer on the base substrate. The eleventh gate electrode Gate 11 may be between the second scan signal line S2 and the high-voltage connection line VDD-C, and the eleventh gate electrode Gate 11 may have a shape of a bending line extending along the second direction Y.

In an exemplary embodiment, the plurality of connection electrodes of each circuit unit includes at least a forty-first connection electrode CO41, a forty-second connection electrode CO42, a forty-third connection electrode CO43, a forty-fourth connection electrode CO44, and a forty-fifth connection electrode CO45.

In an exemplary embodiment, the forty-first connection electrode CO41 may have a shape of a strip extending along the first direction X and may be provided between the second scan signal line S2 and the high-voltage connection line VDD-C, and the forty-first connection electrode CO41 is configured to be connected with the high-frequency signal line and the sixty-third connection electrode which are subsequently formed.

In an exemplary embodiment, the forty-second connection electrode CO42 may have a shape of a line extending along the first direction X and may be provided between the second scan signal line S2 and the high-voltage connection line VDD-C, and the forty-second connection electrode CO42 is configured to be connected with the sixty-first connection electrode and the sixty-second connection electrode formed subsequently.

In an exemplary embodiment, the forty-third connection electrode CO43 may have a shape of a line extending along the first direction X and may be provided on a side of the high-frequency connection line Hf-C away from the fourth and fifth plates CF4 and CF5, and the forty-third connection electrode CO43 is configured to be connected with the anode connection block 12 of the second circuit unit Q2 and the fifty-second connection electrode of the second circuit unit Q2 which are subsequently formed.

In an exemplary embodiment, the forty-fourth connection electrode CO44 may have a shape of a line extending along the first direction X, and may be provided on a side of the forty-third connection electrode CO43 away from the high-frequency connection line Hf-C, and the forty-fourth connection electrode CO44 is configured to be connected with the anode connection block 12 of the third circuit unit Q3 and the fifty-second connection electrode of the third circuit unit Q3 which are subsequently formed.

In an exemplary embodiment, the forty-fifth connection electrode CO45 may be in a shape of rectangular and may be provided on a side of the forty-second connection electrode CO42 in an opposite direction of the second direction Y, and the forty-fifth connection electrode CO45 is configured to be connected with the sixty-fourth connection electrode formed subsequently.

In an exemplary embodiment, after the pattern of the second conductive layer is formed, the semiconductor layer may be subjected to a conductorization treatment by using the second conductive layer as a shield. A region of the semiconductor layer, which is shielded by the second conductive layer, forms channel regions of the first transistors T1 to the twelfth transistors T12, and a region of the semiconductor layer, which is not shielded by the first conductive layer, is made to be conductorized, that is, first regions and second regions of the first transistors T1 to the eleventh transistors T11 are all made to be conductorized.

Figure 23:
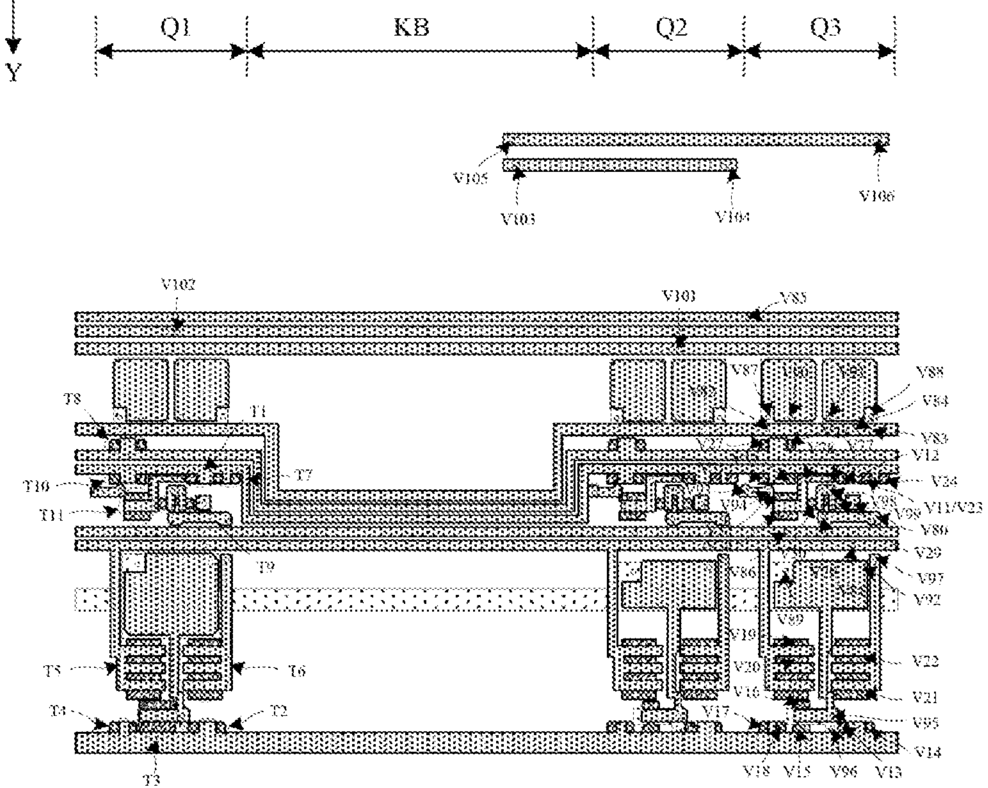
FIG. 23 is a schematic diagram of another display substrate after a pattern of a third insulating layer is formed according to the present disclosure.

(24) A pattern of a third insulation layer is formed. In an exemplary embodiment, forming a pattern of a third insulating layer may include depositing a third insulating film on the base substrate on which the above-mentioned patterns are formed, patterning the third insulating film using a patterning process to form the third insulating layer covering the second conductive layer, and a plurality of vias are provided on the third insulating layer, as shown in FIG. 23.

In an exemplary embodiment, the plurality of vias on the third insulating layer in each circuit unit includes at least an eleventh via V11 to a twenty-fourth via V24, a twenty-seventh via V27 to a thirty-fourth via V34, and a seventy-seventh via V77 to a ninety-ninth via V99. In an exemplary embodiment, the structures of the eleventh via V11 to the twenty-fourth via V24 and the twenty-seventh via V27 to the thirty-fourth via V34 are substantially the same as those of the foregoing embodiments, wherein the eleventh via V11 and the twenty-third via V23 are common vias.

In an exemplary embodiment, an orthographic projection of the seventy-seventh via V77 and the seventy-eighth via V78 on the base substrate is within a range of an orthographic projection of the eleventh gate electrode Gate 11 on the base substrate, the third insulating layer in the seventy-seventh and seventy-eighth via V77 and V78 is etched away to expose a surface of the eleventh gate electrode Gate 11, and the seventy-seventh and seventy-eighth via V77 and V78 are configured such that the fifty-ninth and sixtieth connection electrodes which are subsequently formed are connected to the eleventh gate electrode Gate 11, respectively, through the above vias.

In an exemplary embodiment, an orthographic projection of the seventy-ninth via V79 and the eightieth via V80 on the base substrate is within an orthographic projection of the forty-second connection electrode CO42 on the base substrate, the third insulating layer in the seventy-ninth via V79 and the eightieth via V80 is etched away to expose the surfaces of a first and second ends of the forty-second connection electrode CO42, respectively, and the seventy-ninth via V79 and eightieth via V80 are configured such that the sixty-first and sixty-second connection electrodes subsequently formed are connected to the forty-second connection electrode CO42, respectively, through the above-mentioned vias.

In an exemplary embodiment, an orthographic projection of the eighty-first via V81 on the base substrate is within a range of an orthographic projection of the light emitting signal line EM on the base substrate, the third insulating layer in the eighty-first via V81 is etched away to expose the surface of the light emitting signal line EM, and the eighty-first via V81 is configured such that the sixty-fourth connection electrode subsequently formed is connected to the light emitting signal line EM through the via respectively.

In an exemplary embodiment, an orthographic projection of the eighty-second via V82, eighty-third via V83 and eighty-fourth via V84 on the base substrate is respectively within the range of an orthographic projection of the initial signal line Vint on the base substrate, the third insulating layer in the eighty-second via V82, eighty-third via V83 and eighty-fourth via V84 are etched away to expose a surface of the initial signal line Vint, respectively, and the eighty-second via V82, eighty-third via V83 and eighty-fourth via V84 are configured such that the seventh plate, the eighth plate and the fifty-first connection electrode which are subsequently formed are connected to the initial signal line Vint, respectively, through the above-mentioned vias.

In an exemplary embodiment, an orthographic projection of the eighty-fifth via V85 on the base substrate is within a range of an orthographic projection of the high-frequency connection line Hf-C on the base substrate, the third insulating layer in the eighty-fifth via V85 is etched away to expose a surface of the high-frequency connection line Hf-C, and the eighty-fifth via V85 is configured such that the high-frequency signal line subsequently formed is connected to the high-frequency connection line Hf-C through the via.

In an exemplary embodiment, an orthographic projection of the eighty-sixth via V86 on the base substrate is within a range of an orthographic projection of the high-voltage connection line VDD-C on the base substrate, the third insulating layer in the eighty-sixth via V86 is etched away to expose a surface of the high-voltage connection line VDD-C, and the eighty-sixth via V86 is configured such that the ninth plate subsequently formed is connected to the high-voltage connection line VDD-C through the via.

In an exemplary embodiment, an orthographic projection of the eighty-seventh via V87 on the base substrate is within a range of an orthographic projection of the first plate CF1 on the base substrate, the third insulating layer, the second insulating layer and the first insulating layer in the eighty-seventh via V87 are etched away to expose a surface of the first plate CF1, and the eighty-seventh via V87 is configured such that the seventh plate subsequently formed is connected to the first plate CF1 through the via.

In an exemplary embodiment, an orthographic projection of the eighty-eighth via V88 on the base substrate is within a range of an orthographic projection of the second plate CF2 on the base substrate, the third insulating layer, the second insulating layer and the first insulating layer in the eighty-eighth via V88 are etched away to expose a surface of the second plate CF2, and the eighty-eighth via V88 is configured such that the eighth plate subsequently formed is connected to the second plate CF2 through the via.

In an exemplary embodiment, an orthographic projection of the eighty-ninth via V89 on the base substrate is within a range of an orthographic projection of the third plate CF3 on the base substrate, the third insulating layer, the second insulating layer and the first insulating layer in the eighty-ninth via V89 are etched away to expose a surface of the third plate CF3, and the eighty-ninth via V89 is configured such that the ninth plate subsequently formed is connected to the third plate CF3 through the via.

In an exemplary embodiment, an orthographic projection of the ninetieth via V90 on the base substrate is within a range of an orthographic projection of the fourth plate CF4 on the base substrate, the third insulating layer in the ninetieth via V90 is etched away to expose a surface of the fourth plate CF4, and the ninetieth via V90 is configured such that the fifty-eighth connection electrode subsequently formed is connected to the fourth plate CF4 through the via.

In an exemplary embodiment, an orthographic projection of the ninety-first via V91 on the base substrate is within a range of an orthographic projection of the fifth plate CF5 on the base substrate, the third insulating layer in the ninety-first via V91 is etched away to expose a surface of the fifth plate CF5, and the ninety-first via V91 is configured such that the fifty-ninth connection electrode subsequently formed is connected to the fifth plate CF5 through the via.

In an exemplary embodiment, an orthographic projection of the ninety-second via V92 on the base substrate is within a range of an orthographic projection of the sixth plate CF6 on the base substrate, the third insulating layer in the ninety-second via V92 is etched away to expose a surface of the sixth plate CF6, and the ninety-second via V92 is configured such that the fifty-seventh connection electrode subsequently formed is connected to the sixth plate CF6 through the via.

In an exemplary embodiment, an orthographic projection of the ninety-third via V93 on the base substrate is within a range of an orthographic projection of a first end of the forty-first connection electrode CO41 on the base substrate, the third insulating layer in the ninety-third via V93 is etched away to expose a surface of a first end of the forty-first connection electrode CO41, and the ninety-third via V93 is configured such that the high-frequency connection line subsequently formed is connected to the forty-first connection electrode CO41 through the via.

In an exemplary embodiment, an orthographic projection of the ninety-fourth via V94 on the base substrate is within a range of an orthographic projection of a second end of the forty-first connection electrode CO41 on the base substrate, the third insulating layer in the ninety-fourth via V94 is etched away to expose a surface of a second end of the forty-first connection electrode CO41, and the ninety-fourth via V94 is configured such that the sixty-third connection electrode subsequently formed is connected to a second end of the forty-first connection electrode CO41 through the via.

In an exemplary embodiment, an orthographic projection of the ninety-fifth via V95 on the base substrate is within a range of an orthographic projection of the third top gate electrode Gate3-T on the base substrate, the third insulating layer in the ninety-fifth via V95 is etched away to expose a surface of the third top gate electrode Gate3-T, and the ninety-fifth via V95 is configured such that the fifty-fifth connection electrode subsequently formed is connected to the third top gate electrode Gate3-T through the via.

In an exemplary embodiment, an orthographic projection of the ninety-sixth via V96 on the base substrate is within a range of an orthographic projection of the third bottom gate electrode Gate3-B on the base substrate, the third insulating layer, the second insulating layer and the first insulating layer in the ninety-sixth via V96 are etched away to expose a surface of the third bottom gate electrode Gate3-B, and the ninety-sixth via V96 is configured such that the fifty-fifth connection electrode subsequently formed is connected to the third bottom gate electrode Gate3-B through the via.

In an exemplary embodiment, an orthographic projection of the ninety-seventh via V97 on the base substrate is within a range of an orthographic projection of the sixth gate block 106 of the sixth gate electrode Gate 6 on the base substrate, the third insulating layer in the ninety-seventh via V97 is etched away to expose a surface of the sixth gate block 106, and the ninety-seventh via V97 is configured such that the sixty-second connection electrode subsequently formed is connected to the sixth gate electrode Gate 6 through the via.

In an exemplary embodiment, an orthographic projection of the ninety-eighth via V98 on the base substrate is within a range of an orthographic projection of the ninth gate electrode Gate 9 on the base substrate, the third insulating layer in the ninety-eighth via V98 is etched away to expose a surface of the ninth gate electrode Gate 9, and the ninety-eighth via V98 is configured such that the fifty-eighth connection electrode subsequently formed is connected to the ninth gate electrode Gate 9 through the via.

In an exemplary embodiment, an orthographic projection of the ninety-ninth via V99 on the base substrate is within a range of an orthographic projection of the forty-fifth connection electrode CO45 on the base substrate, the third insulating layer in the ninety-ninth via V99 is etched away to expose a surface of the forty-fifth connection electrode CO45, and the ninety-ninth via V99 is configured such that the sixty-fourth connection electrode subsequently formed is connected to the forty-fifth connection electrode CO45.

In an exemplary embodiment, the plurality of vias on the third insulating layer may further include a 101st via V101 to a 106th via V106.

In an exemplary embodiment, the 101st via V101 may be provided in the second circuit unit Q2, an orthographic projection of the 101st via V101 on the base substrate is within a range of an orthographic projection of the first low-voltage connection line VSS-C1 on the base substrate, the third insulating layer in the 101st via V101 is etched away to expose a surface of the first low-voltage connection line VSS-C1, and the 101st via V101 is configured such that the seventy-first connection electrode subsequently formed is connected to the first low-voltage connection line VSS-C1 through the via.

In an exemplary embodiment, the 102nd via V102 may be provided in the first circuit unit Q1, an orthographic projection of the 102nd via V102 on the base substrate is within a range of an orthographic projection of the second low-voltage connection line VSS-C2 on the base substrate, the third insulating layer in the 102nd via V102 is etched away to expose a surface of the second low-voltage connection line VSS-C2, and the 102nd via V102 is configured such that the seventy-second connection electrode subsequently formed is connected to the second low-voltage connection line VSS-C2 through the via.

In an exemplary embodiment, an orthographic projection of the 103rd via V103 on the base substrate is within a range of an orthographic projection of a first end of the forty-third connection electrode CO43 on the base substrate, the third insulating layer in the 103rd via V103 is etched away to expose a surface of a first end of the forty-third connection electrode CO43, and the 103rd via V103 is configured such that the anode connection block of the second circuit unit Q2 subsequently formed is connected to a first end of the forty-third connection electrode CO43 through the via.

In an exemplary embodiment, an orthographic projection of the 104th via V104 on the base substrate is within an orthographic projection of a second end of the forty-third connection electrode CO43 on the base substrate, the third insulating layer in the 104th via V104 is etched away to expose a surface of a second end of the forty-third connection electrode CO43, and the 104th via V104 is configured such that the fifty-second connection electrode of the second circuit unit Q2 subsequently formed is connected to a second end of the forty-third connection electrode CO43 through the via.

In an exemplary embodiment, an orthographic projection of the 105th via V105 on the base substrate is within a range of an orthographic projection of a first end of the forty-fourth connection electrode CO44 on the base substrate, the third insulating layer in the 105th via V105 is etched away to expose a surface of a first end of the forty-fourth connection electrode CO44, and the 105th via V105 is configured such that the anode connection block of the third circuit unit Q3 subsequently formed is connected to a first end of the forty-fourth connection electrode CO44 through the via.

In an exemplary embodiment, an orthographic projection of the 106th via V106 on the base substrate is within an orthographic projection of a second end of the forty-fourth connection electrode CO44 on the base substrate, the third insulating layer in the 106th via V106 is etched away to expose a surface of a second end of the forty-fourth connection electrode CO44, and the 106th via V106 is configured such that the fifty-second connection electrode of the third circuit unit Q3 subsequently formed is connected to a second end of the forty-fourth connection electrode CO44 through the via.

Figure 24A:
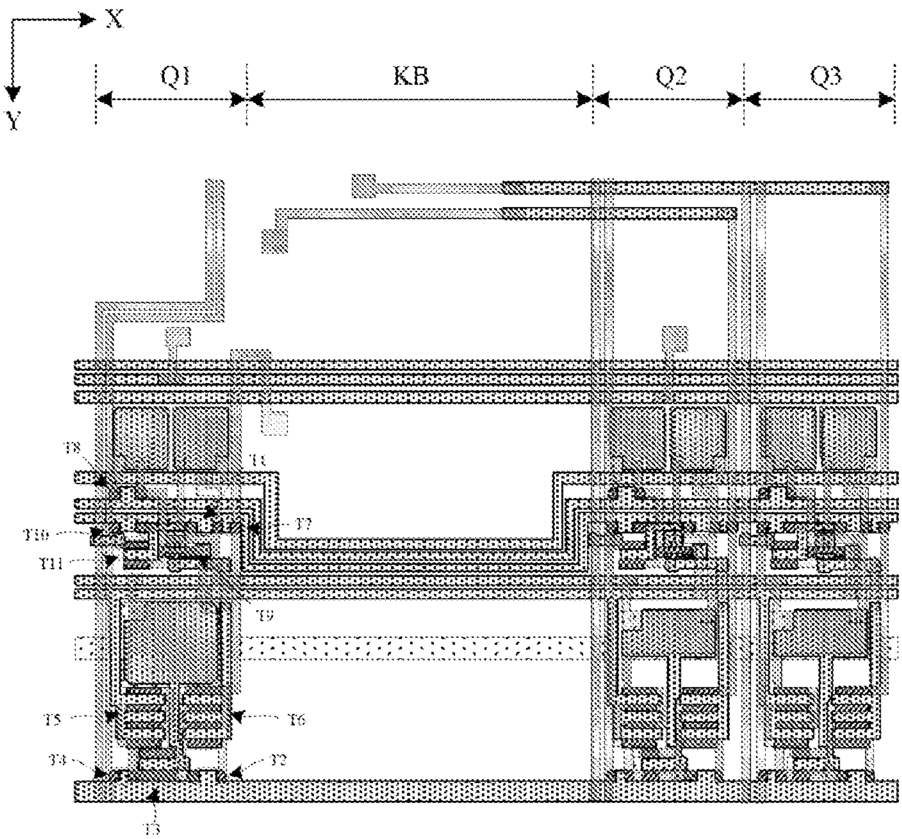
FIG. 24A and FIG. 24B are schematic diagrams of another display substrate after a pattern of a third conductive layer is formed according to the present disclosure.
Figure 24B:
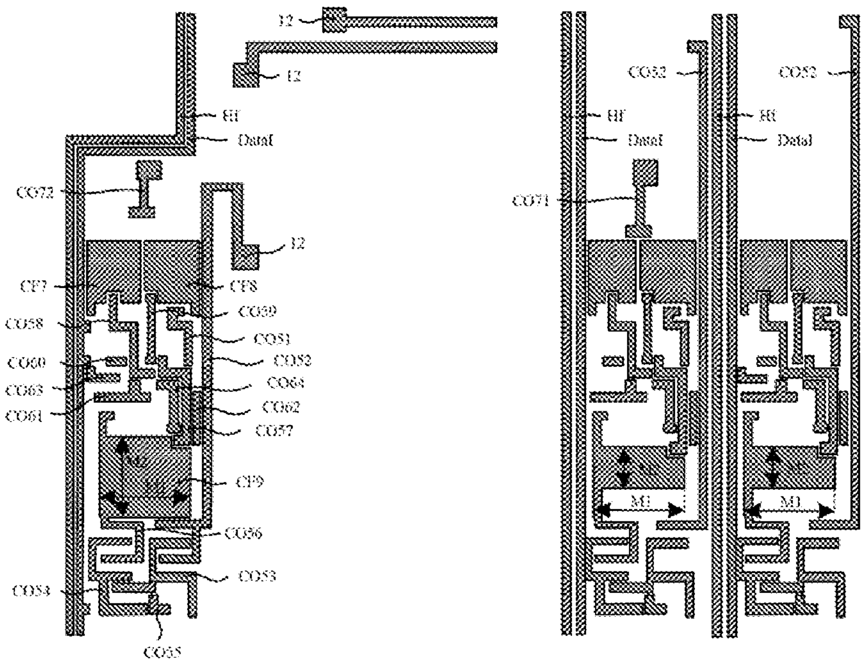

(25) A pattern of a third conductive layer is formed. In an exemplary embodiment, forming a pattern of a third conductive layer may include depositing a third conductive film on the base substrate on which the above-mentioned patterns are formed, patterning the third conductive film using a patterning process to form a pattern of the third conductive layer disposed on the third insulating layer, as shown in FIGS. 24A and 24B, FIG. 24B is a schematic plan view of the third conductive layer in FIG. 24A.

In an exemplary embodiment, the pattern of the third conductive layer of each circuit unit includes at least a data signal line DataI, a high-frequency signal line Hf, a seventh plate CF7, an eighth plate CF8, a ninth plate CF9, an anode connection block 12, a fifty-first connection electrode CO51 to a sixty-fourth connection electrode CO64.

In an exemplary embodiment, the data signal line DataI may have a shape of a line with a main body portion extending along the second direction Y and may be located on a side of the circuit unit in an opposite direction of the first direction X. The data signal line DataI is connected to the first region of the fourth active layer through the seventeenth via V17 on the one hand, connected to the first region of the eighth active layer through the twenty-seventh via V27 on the other hand, and connected to the first region of the tenth active layer through the thirty-first via V31 on the yet other hand, thereby enabling the data signal line DataI to write a data signal to the first electrode of the fourth transistor T4, the first electrode of the eighth transistor T8 and the first electrode of the tenth transistor T10, respectively.

In an exemplary embodiment, the data signal line DataI may be reused as a duration signal line DataT. Duration signals are supplied to the first electrode of the eighth transistor T8 and the first electrode of the tenth transistor T10, respectively, using the data signal line DataI.

In an exemplary embodiment, the high-frequency signal line Hf may have a shape of a line with a main body portion extending along the second direction Y, and may be located on a side of the data signal line DataI in an opposite direction of the first direction X. On the one hand, the high-frequency signal line Hf is connected to a first end of the forty-first connection electrode CO41 through the ninety-third via V93, and on the other hand, the high-frequency signal line Hf is connected to the high-frequency connection line Hf-C through the eighty-fifth via V85, so that the connection between the high-frequency connection line Hf-C extending along the first direction X and the high-frequency signal line Hf extending along the second direction Y is achieved, forming a net-like connecting structure for transmitting high-frequency signals.

In an exemplary embodiment, the seventh plate CF7 may be in a shape of rectangular, an orthographic projection of the seventh plate CF7 on the base substrate at least partially overlaps an orthographic projection of the fourth plate CF4 on the base substrate, on the one hand, the seventh plate CF7 is connected to the first plate CF1 through the eighty-seventh via V87, and the seventh plate CF7 is connected to the initial signal line Vint through the eighty-second via V82, on the other hand. The seventh plate CF7 may serve as another plate of the first capacitor, and the fourth plate CF4 and the seventh plate CF7 form another first capacitor of the pixel drive circuit. Because the seventh plate CF7 is connected to the first plate CF1 through a via, the first plate CF1 and the seventh plate CF7 have the same initial signal potential, so that the first plate CF1, the fourth plate CF4 and the third plate CF3 form a first capacitor of a parallel structure, the first plate CF1 and the fourth plate CF4 form a first capacitor of the pixel drive circuit, the fourth plate CF4 and the seventh plate CF7 form another first capacitor of the pixel drive circuit, and the two first capacitors are connected in parallel.

In an exemplary embodiment, the eighth plate CF8 may be in a shape of rectangular, an orthographic projection of the eighth plate CF8 on the base substrate at least partially overlaps an orthographic projection of the fifth plate CF5 on the base substrate, the eighth plate CF8 is connected to the second plate CF2 through the eighty-eighth via V88 on the one hand, and the eighth plate CF8 is connected to the initial signal line Vint through the eighty-third via V83 on the other hand. The eighth plate CF8 may serve as another plate of the second capacitor, and the fifth plate CF5 and the eighth plate CF8 form another second capacitor of the pixel drive circuit. Because the eighth plate CF8 is connected to the second plate CF2 through a via, the second plate CF2 and the eighth plate CF8 have the same initial signal potential, so that the second plate CF2, the fifth plate CF5 and the eighth plate CF8 form a second capacitor of a parallel structure, the second plate CF2 and the fifth plate CF5 form a second capacitor of the pixel drive circuit, the fifth plate CF5 and the eighth plate CF8 form another second capacitor of the pixel drive circuit, and the two second capacitors are connected in parallel.

In an exemplary embodiment, the ninth plate CF9 may be in a shape of rectangular, an orthographic projection of the ninth plate CF9 on the base substrate at least partially overlaps an orthographic projection of the sixth plate CF6 on the base substrate, the ninth plate CF9 is connected to the third plate CF3 through the eighty-ninth via V89 on the one hand, and the ninth plate CF9 is connected to the high-voltage connection line VDD-C through the eighty-sixth via V86 on the other hand. The ninth plate CF9 may serve as another plate of the storage capacitor, and the sixth plate CF6 and the ninth plate CF9 form another storage capacitor of the pixel drive circuit. Because the ninth plate CF9 is connected to the third plate CF3 through a via, the third plate CF3 and the ninth plate CF9 have the same first power supply potential, so that the third plate CF3, the sixth plate CF6 and the ninth plate CF9 form a storage capacitor of a parallel structure, the third plate CF3 and the sixth plate CF6 form one storage capacitor of the pixel drive circuit, and the sixth plate CF6 and the ninth plate CF9 form another storage capacitor of the pixel drive circuit, and the two storage capacitors are connected in parallel.

In an exemplary embodiment, the position, shape and size of the ninth plate CF9 in the second circuit unit Q2 and the third circuit unit Q3 may be substantially the same, but different from the shape and size of the ninth plate CF9 in the first circuit unit Q1.

In an exemplary embodiment, the area of the ninth plate CF9 in the first circuit unit Q1 may be larger than the area of the ninth plate CF9 in the second circuit unit Q2 and the third circuit unit Q3, so that the capacitance value of the storage capacitor in the first circuit unit Q1 is larger than the capacitance value of the storage capacitor in the second circuit unit Q2 and the third circuit unit Q3.

In an exemplary embodiment, the first length M1 of the ninth plate CF9 in the first circuit unit Q1, the second circuit unit Q2, and the third circuit unit Q3 may be substantially the same, and the second length M2 of the ninth plate CF9 in the first circuit unit Q1 may be larger than the second length M2 of the ninth plate CF9 in the second circuit unit Q2 and the third circuit unit Q3 so that the area of the ninth plate CF9 in the first circuit unit Q1 is larger than the area of the ninth plate CF9 in the second circuit unit Q2 and the third circuit unit Q3.

In an exemplary embodiment, the ratio of the second length M2 of the ninth plate CF9 in the first circuit unit Q1 to the second length M2 of the ninth plate CF9 in the second circuit unit Q2 and the third circuit unit Q3 may be about 1 to 2. For example, the ratio can be about 1.8.

In an exemplary embodiment, the fifty-first connection electrode CO51 may have a shape of a strip extending along the second direction Y, a first end of the fifty-first connection electrode CO51 is connected to the first region of the first active layer (also the first region of the seventh active layer) through the eleventh via V11, and a second end of the fifty-first connection electrode CO51 is connected to the initial signal line Vint through the eighty-fourth via V84, thereby achieving that the initial signal line Vint writes an initial signal to the first electrode of the first transistor T1 and the first electrode of the seventh transistor T7.

In an exemplary embodiment, the fifty-second connection electrode CO52 may have a shape of a strip extending along the second direction Y, a first end of the fifty-second connection electrode CO52 is connected to the second region of the sixth active layer through the twenty-second via V22, and a second end of the fifty-second connection electrode CO52 is connected to the second region of the seventh active layer through the twenty-fourth via V24, so the fifty-second connection electrode CO52 makes the second electrode of the sixth transistor T6 and the second electrode of the seventh transistor T7 have the same potential (i.e., the second node N2 of the pixel drive circuit).

In an exemplary embodiment, the anode connection block 12 of the first circuit unit Q1 may be provided on a side of the fifty-second connection electrode CO52 of the first circuit unit Q1 away from the ninth plate CF9, and connected to the fifty-second connection electrode CO52 of the first circuit unit Q1 through a connection line, thereby achieving the connection between the anode connection block 12 and the fifty-second connection electrode CO52 in the first circuit unit Q1.

In an exemplary embodiment, the anode connection block 12 of the second circuit unit Q2 may be provided on a side of the forty-third connection electrode CO43 in an opposite direction of the first direction X, the anode connection block 12 is connected to a first end of the forty-third connection electrode CO43 through the 103rd via V103, and the fifty-second connection electrode CO52 of the second circuit unit Q2 is connected to a second end of the forty-third connection electrode CO43 through the 104th via V104, thereby achieving the connection between the anode connection block 12 and the fifty-second connection electrode CO52 in the second circuit unit Q2.

In an exemplary embodiment, the anode connection block 12 of the third circuit unit Q3 may be provided on a side of the forty-fourth connection electrode CO44 in an opposite direction of the first direction X, the anode connection block 12 is connected to a first end of the forty-fourth connection electrode CO44 through the 105th via V105, and the fifty-second connection electrode CO52 of the third circuit unit Q3 is connected to a second end of the forty-fourth connection electrode CO44 through the 106th via V106, thereby achieving the connection between the anode connection block 12 and the fifty-second connection electrode CO52 in the third circuit unit Q3.

In an exemplary embodiment, the fifty-third connection electrode CO53 has a shape of a bending line, a first end of the fifty-third connection electrode CO53 is connected to the second region of the second active layer through the fourteenth via V14, a second end of the fifty-third connection electrode CO53 is connected to the second region of the third active layer through the sixteenth via V16, a portion between the first and second ends of the fifty-third connection electrode CO53 is connected to the first region of the sixth active layer through the twenty-first via V21, and the fifty-third connection electrode CO53 makes the second electrode of the second transistor T2, the second electrode of the third transistor T3 and the first electrode of the sixth transistor T6 have the same potential (i.e., the fourth node N4 of the pixel drive circuit).

In an exemplary embodiment, the fifty-fourth connection electrode CO54 may have a shape of a bending line, a first end of the fifty-fourth connection electrode CO54 is connected to a first region of the third active layer through the fifteenth via V15, a second end of the fifty-fourth connection electrode CO54 is connected to a second region of the fifth active layer through the twentieth via V20, a portion between the first and second ends of the fifty-fourth connection electrode CO54 is connected to the second region of the fourth active layer through the eighteenth via V18, and the fifty-fourth connection electrode CO54 makes the first electrode of the third transistor T3, the second electrode of the fourth transistor T4 and the second electrode of the fifth transistor T5 have the same potential (i.e., the fifth node N5 of the pixel drive circuit).

In an exemplary embodiment, the fifty-fifth connection electrode CO55 may have a shape of a bending line, a first end of the fifty-fifth connection electrode CO55 is connected to the first region of the second active layer through the thirteenth via V13, a second end of the fifty-fifth connection electrode CO55 is connected to the third top gate electrode Gate3-T through the ninety-fifth via V95, and a portion between the first end and a second end of the fifty-fifth connection electrode CO55 is connected to the third bottom gate electrode Gate3-B through the ninety-sixth via V96. In an exemplary embodiment, the fifty-fifth connection electrode CO55 enables the interconnection between the third top gate electrode Gate3-T and the third bottom gate electrode Gate3-B, and the interconnection between the first electrode of the second transistor T2 and the gate electrode of the third transistor T3.

In an exemplary embodiment, the fifty-sixth connection electrode CO56 may have a shape of a bending line, a first end of the fifty-sixth connection electrode CO56 is connected to the first region of the fifth active layer through the nineteenth via V19, a second end of the fifty-sixth connection electrode CO56 is connected to the ninth plate CF9, and the fifty-sixth connection electrode CO56 makes the first electrode of the fifth transistor T5 and the ninth plate CF9 have the same potential.

In an exemplary embodiment, the fifty-sixth connection electrode CO56 and the ninth plate CF9 may be of an interconnected integral structure.

In an exemplary embodiment, the fifty-seventh connection electrode CO57 may have a shape of a bending line extending along the second direction Y, a first end of the fifty-seventh connection electrode CO57 is connected to the second region of the first active layer through the twelfth via V12, a second end of the fifty-seventh connection electrode CO57 is connected to the sixth plate CF6 through the ninety-second via V92, and the fifty-seventh connection electrode CO57 makes the second electrode of the first transistor T1 and the sixth plate CF6 have the same potential. Because the third top gate electrode Gate3-T, the sixth plate CF6 and the third gate block 103 may be of an interconnected integral structure, the second electrode of the first transistor T1 is connected to the sixth plate CF6, and the first electrode of the second transistor T2 is connected to the gate electrode of the third transistor T3, thus the fifty-fifth connection electrode CO55 and the fifty-seventh connection electrode CO57 make the second electrode of the first transistor T1, the first electrode of the second transistor T2, the gate electrode of the third transistor T3 and the sixth plate CF6 have the same potential (i.e., the third node N3 of the pixel drive circuit).

In an exemplary embodiment, the fifty-eighth connection electrode CO58 may have a shape of a bending line extending along the second direction Y, a first end of the fifty-eighth connection electrode CO58 is connected to the ninth gate electrode Gate9 through the ninety-eighth via V98, a second end of the fifty-eighth connection electrode CO58 is connected to the fourth plate CF4 through the ninety via V90, a portion between the first end and a second end of the fifty-eighth connection electrode CO58 is connected to the second region of the eighth active layer through the twenty-eighth via V28, and the fifty-eighth connection electrode CO58 makes the second electrode of the eighth transistor T8, the gate electrode of the ninth transistor T9 and the fourth plate CF4 have the same potential (i.e., the sixth node N6 of the pixel drive circuit).

In an exemplary embodiment, the fifty-ninth connection electrode CO59 may have a shape of a strip extending along the second direction Y, a first end of the fifty-ninth connection electrode CO59 is connected to the eleventh gate electrode Gate 11 through the seventy-seventh via V77, a second end of the fifty-ninth connection electrode CO59 is connected to the fifth plate CF5 through the ninety-first via V91, and the fifty-ninth connection electrode CO59 makes the gate electrode of the eleventh transistor T11 and the fifth plate CF5 have the same potential.

In an exemplary embodiment, the sixtieth connection electrode CO60 may have a shape of a strip extending along the first direction X, a first end of the sixtieth connection electrode CO60 is connected to the second region of the tenth active layer through the thirty-second via V32, a second end of the sixtieth connection electrode CO60 is connected to the eleventh gate electrode Gate 11 through the seventy-eighth via V78, and the sixtieth connection electrode CO60 makes the gate electrode of the eleventh transistor T11 and the second electrode of the tenth transistor T10 have the same potential. Because the gate electrode of the eleventh transistor T11 is connected to the fifth plate CF5 and the second electrode of the tenth transistor T10, respectively, thus the fifty-ninth connection electrode CO59 and the sixtieth connection electrode CO60 make the second electrode of the tenth transistor T10, the gate electrode of the eleventh transistor T11 and the fifth plate CF5 have the same potential (i.e., the seventh node N7 of the pixel drive circuit).

In an exemplary embodiment, the sixty-first connection electrode CO61 may have a shape of a strip extending along the first direction X, a first end of the sixty-first connection electrode CO61 is connected to the second region of the eleventh active layer through the thirty-fourth via V34, a second end of the sixty-first connection electrode CO61 is connected to a first end of the forty-second connection electrode CO42 through the seventy-ninth via V79, a portion between the first end and the second end of the sixty-first connection electrode CO61 is connected to the second region of the ninth active layer through the thirtieth via V30, and the sixty-first connection electrode CO61 enables the interconnection between the second electrode of the ninth transistor T9 and the second electrode of the eleventh transistor T11.

In an exemplary embodiment, the sixty-second connection electrode CO62 may have a shape of a strip extending along the second direction Y, a first end of the sixty-second connection electrode CO62 is connected to a second end of the forty-second connection electrode CO42 through the eightieth via V80, and a second end of the sixty-second connection electrode CO62 is connected to the sixth gate block 106 through the ninety-seventh via V97. Because the sixth gate block 106 is connected to the sixth gate electrode Gate6, and the sixty-first connection electrode CO61 and the sixty-second connection electrode CO62 are connected through the forty-second connection electrode CO42, thus the sixty-first connection electrode CO61 and the sixty-second connection electrode CO62 make the sixth gate electrode Gate6, the second electrode of the ninth transistor T9 and the second electrode of the eleventh transistor T11 have the same potential (i.e., the first node N1 of the pixel drive circuit).

In an exemplary embodiment, the sixty-third connection electrode CO63 may be shaped in "L", a first end of the sixty-third connection electrode CO63 is connected to the first region of the eleventh active layer through the thirty-third via V33, and a second end of the sixty-third connection electrode CO63 is connected to a second end of the forty-first connection electrode CO41 through the ninety-fourth via V94. Because a first end of the forty-first connection electrode CO41 is connected to the high-frequency signal line Hf through a via, writing of a high-frequency signal to the first electrode of the eleventh transistor T11 is achieved.

In an exemplary embodiment, the sixty-fourth connection electrode CO64 may be shaped in "L", a first end of the sixty-fourth connection electrode CO64 is connected to the first region of the ninth active layer through the twenty-ninth via V29, a second end of the sixty-fourth connection electrode CO64 is connected to the light emitting signal line EM through the eighty-first via V81, and the region between the first end and the second end of the sixty-fourth connection electrode CO64 is connected to the forty-fifth connection electrode CO45 through the ninety-ninth via V99, thereby achieving writing of a light emitting signal to the first electrode of the ninth transistor T9.

In an exemplary embodiment, the third conductive layer may further include a seventy-first connection electrode CO71 and a seventy-second connection electrode CO72.

In an exemplary embodiment, the seventy-first connection electrode CO71 may have a shape of a strip extending along the second direction Y, the seventy-first connection electrode CO71 may be provided in the second circuit unit Q2, one end of the seventy-first connection electrode CO71 is connected to the first low-voltage connection line VSS-C1 through the 101st via V101, and the seventy-first connection electrode CO71 is configured to be connected to the first power supply low-voltage line formed subsequently.

In an exemplary embodiment, the seventy-second connection electrode CO72 may have a shape of a strip extending along the second direction Y, the seventy-second connection electrode CO72 may be provided in the first circuit unit Q1, one end of the seventy-second connection electrode CO72 is connected to the second low-voltage connection line VSS-C2 through the 102nd via V102, and the seventy-second connection electrode CO72 is configured to be connected to the second low-voltage power supply line formed subsequently.

Figure 25:
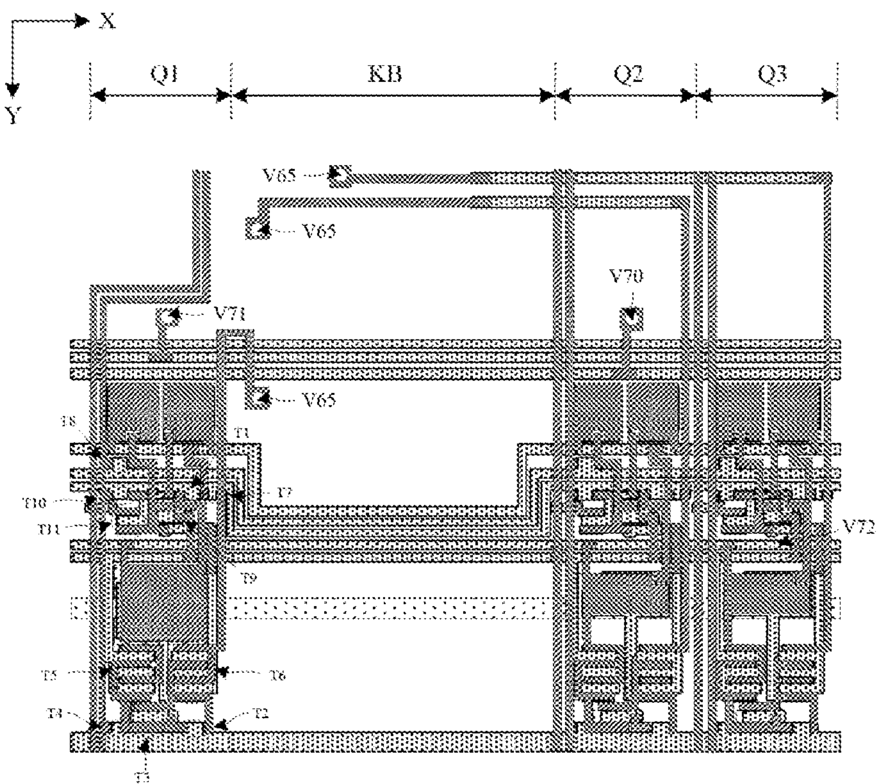
FIG. 25 is a schematic diagram of another display substrate after a pattern of a first planarization layer is formed according to the present disclosure.

(26) Patterns of a fourth insulation layer and a first planarization layer are formed. In an exemplary embodiment, forming patterns of a fourth insulating layer and a first planarization layer may include first coating a first planarization film on the base substrate on which the above-mentioned patterns are formed, patterning the first planarization film using a patterning process, then depositing a fourth insulating film, patterning the fourth insulating film using a patterning process to form the first planarization layer covering a pattern of the third conductive layer and the fourth insulating layer disposed on a side of the first planarization layer away from the base substrate, wherein a plurality of vias are disposed on the fourth insulating layer and the first planarization layer, as shown in FIG. 25.

In an exemplary embodiment, the plurality of vias may include at least a sixty-fifth via V65, a seventieth via V70, a seventy-first via V71, and a seventy-second via V72.

In an exemplary embodiment, the sixty-fifth via V65 may be provided in each circuit unit, an orthographic projection of the sixty-fifth via V65 on the base substrate is within a range of an orthographic projection of the anode connection block 12 on the base substrate, the fourth insulating film and the first planarization film in the sixty-fifth via V65 are removed to expose a surface of the anode connection block 12, and the sixty-fifth via V65 is configured such that the anode connection electrode subsequently formed is connected to the anode connection block 12 through the via.

In an exemplary embodiment, an orthographic projection of the seventieth via V70 on the base substrate is within a range of an orthographic projection of the seventy-first connection electrode CO71 on the base substrate, the fourth insulating film and the first planarization film in the seventieth via V70 are removed to expose a surface of the seventy-first connection electrode CO71, and the seventieth via V70 is configured such that the first low-voltage power supply line subsequently formed is connected to the seventy-first connection electrode CO71 through the via.

In an exemplary embodiment, an orthographic projection of the seventy-first via V71 on the base substrate is within a range of an orthographic projection of the seventy-second connection electrode CO72 on the base substrate, the fourth insulating film and the first planarization film in the seventy-first via V71 are removed to expose a surface of the seventy-second connection electrode CO72, and the seventy-first via V71 is configured such that the second low-voltage power supply line formed subsequently is connected to the seventy-second connection electrode CO72 through the via.

In an exemplary embodiment, an orthographic projection of the seventy-second via V72 on the base substrate is within a range of an orthographic projection of the high-voltage connection line VDD-C on the base substrate, the fourth insulating film, the first planarization film and the third insulating layer in the seventy-second via V72 are removed to expose a surface of the high-voltage connection line VDD-C, and the seventy-second via V72 is configured such that the high-voltage power supply line subsequently formed is connected to the high-voltage connection line VDD-C through the via.

Figure 26A:
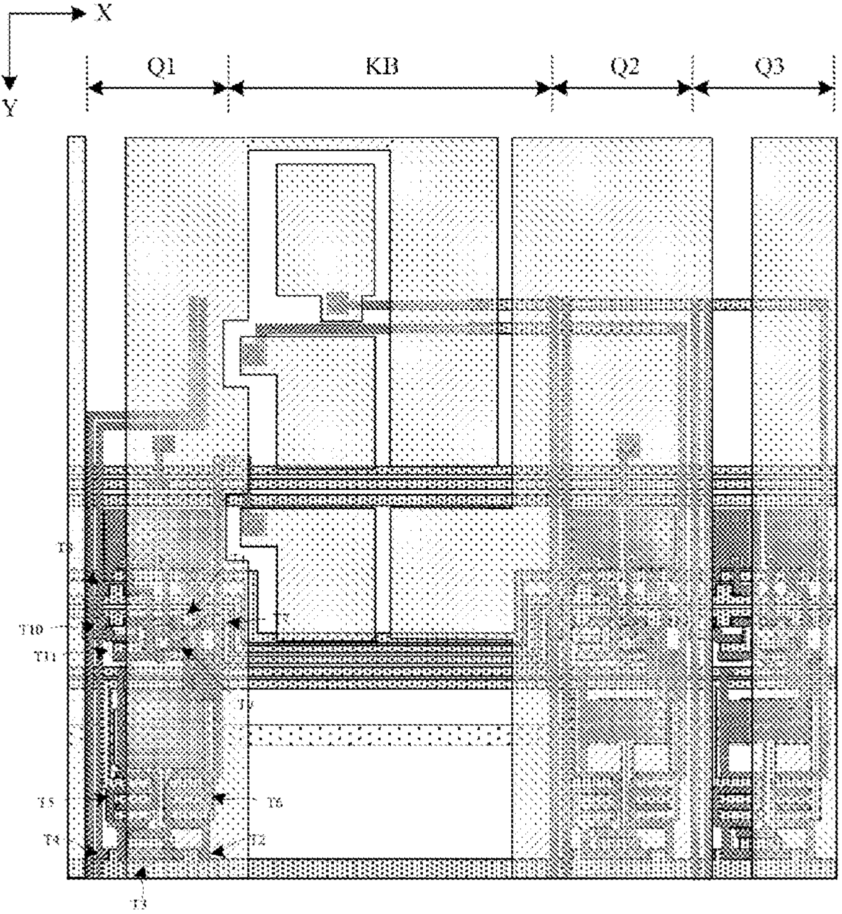
FIG. 26A and FIG. 26B are schematic diagrams of another display substrate after a pattern of a fourth conductive layer is formed according to the present disclosure.
Figure 26B:
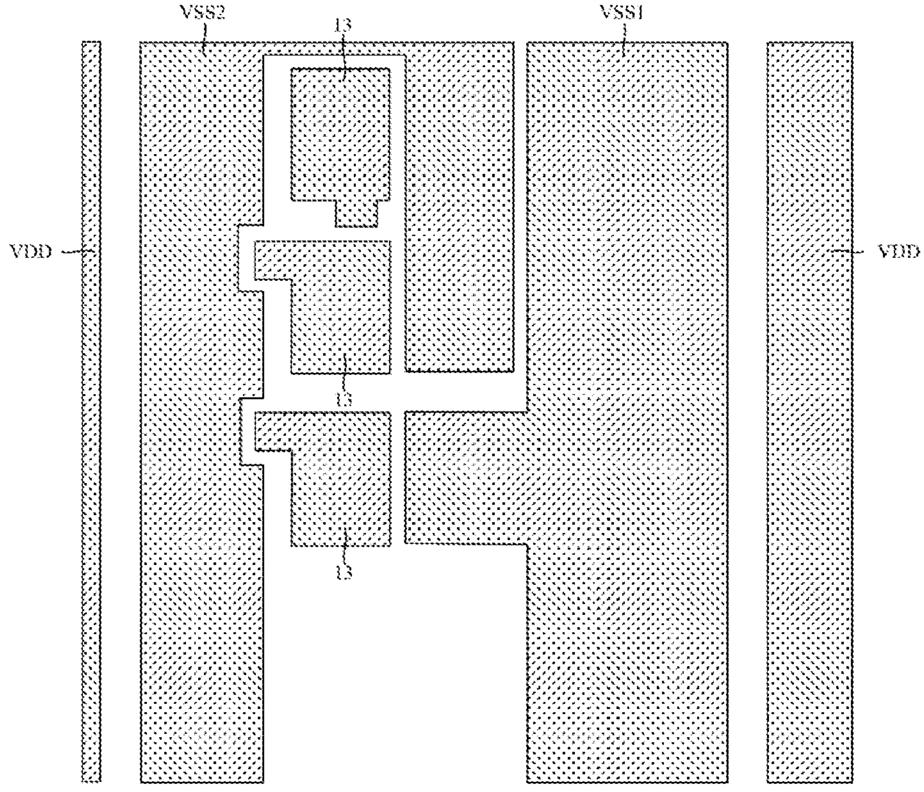

(27) A pattern of a fourth conductive layer is formed. In an exemplary embodiment, forming a pattern of a fourth conductive layer may include depositing a fourth conductive film on the base substrate on which the above-mentioned patterns are formed, patterning the fourth conductive film using a patterning process to form a pattern of the fourth conductive layer disposed on the fourth insulating layer, as shown in FIGS. 26A and 26B, FIG. 26B is a schematic plan view of the fourth conductive layer in FIG. 26A.

In an exemplary embodiment, the pattern of the fourth conductive layer may include at least an anode connection electrode 13, a high-voltage power supply line VDD, a first low-voltage power supply line VSS1, and a second low-voltage power supply line VSS2.

In an exemplary embodiment, the anode connection electrode 13 may be in a shape of rectangular, the anode connection electrode 13 is connected to the anode connection block 12 through the sixty-fifth via V65, and the anode connection electrode 13 is configured to be bound and connected with the first electrode of the light emitting diode.

In an exemplary embodiment, the high-voltage power supply line VDD may have a shape of a line extending along the second direction Y, and the high-voltage power supply line VDD is connected to the high-voltage connection line VDD-C through the seventy-second via V72, so that the connection between the high-voltage connection line VDD-C extending along the first direction X and the high-voltage power supply line VDD extending along the second direction Y is achieved, forming a net-like connecting structure for transmitting high-voltage power supply signals.

In an exemplary embodiment, the first low-voltage power supply line VSS1 may have a shape of a line extending along the second direction Y, and the first low-voltage power supply line VSS1 is connected to the seventy-first connection electrode CO71 through the seventieth via V70. Because the seventy-first connection electrode CO71 is connected to the first low-voltage connection line VSS-C1 through a via, the connection between the first low-voltage connection line VSS-C1 extending along the first direction X and the first low-voltage power supply line VSS1 extending along the second direction Y is achieved, forming a net-like connecting structure for transmitting a first low-voltage power supply signal.

In an exemplary embodiment, the second low-voltage power supply line VSS2 may have a shape of a line extending along the second direction Y, and the second low-voltage power supply line VSS2 is connected to the seventy-second connection electrode CO72 through the seventy-first via V71. Because the seventy-second connection electrode CO72 is connected to the second low-voltage connection line VSS-C2 through a via, the connection between the second low-voltage connection line VSS-C2 extending along the first direction X and the second low-voltage power supply line VSS2 extending along the second direction Y is achieved, forming a net-like connecting structure for transmitting the second low-voltage power supply signal.

Figure 26C:
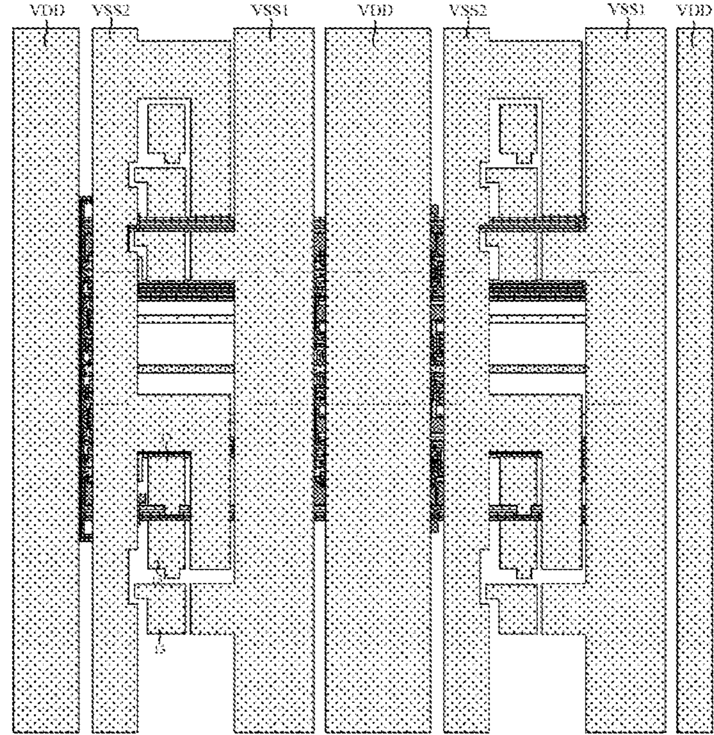
FIG. 26C is a schematic diagram of a power supply wiring according to an exemplary embodiment of the present disclosure.

FIG. 26C is a schematic diagram of a power supply wiring according to an exemplary embodiment of the present disclosure, illustrating a configuration of a high-voltage power supply line and a low-voltage power supply line in a plurality of circuit units. As shown in FIG. 26C, the high-voltage power supply line VDD, the first low-voltage power supply line VSS1, and the second low-voltage power supply line VSS2 may have a shape of a line extending along the second direction Y, and the first low-voltage power supply line VSS1 and the second low-voltage power supply line VSS2 are disposed between adjacent high-voltage power supply lines VDD, and a plurality of anode connection electrodes 13 may be disposed between the first low-voltage power supply line VSS1 and the second low-voltage power supply line VSS2.

In an exemplary embodiment, a side of the first low-voltage power supply line VSS1 close to the second low-voltage power supply line VSS2 is provided with a first pad block configured to be connected with the second electrode of the first light emitting diode. A side of the second low-voltage power supply line VSS2 close to the first low-voltage power supply line VSS1 is provided with a second pad block configured to be connected with the second electrode of the second light emitting diode and the third light emitting diode.

In an exemplary embodiment, the low-voltage power supply line may include a first low-voltage power supply line, a second low-voltage power supply line, and a third low-voltage power supply line, the three low-voltage power supply lines provide low-voltage power supply signals to the first light emitting diode, the second light emitting diode, and the third light emitting diode, respectively, to minimize power consumption.

Figure 27:
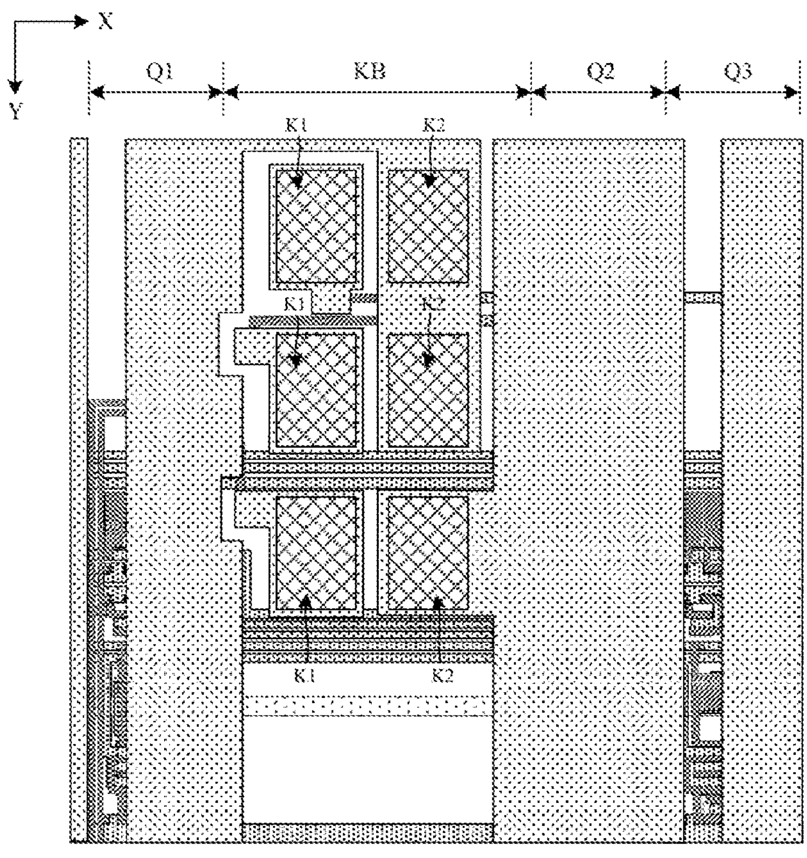
FIG. 27 is a schematic diagram of another display substrate after a pattern of a second planarization layer is formed according to the present disclosure.

(28) Patterns of a fifth insulating layer and a second planarization layer are formed. In an exemplary embodiment, forming patterns of a fifth insulating layer and a second planarization layer may include first depositing a fifth insulating film on the base substrate on which the above-mentioned patterns are formed, then coating a second planarization film, then depositing a sixth insulating film, patterning the fifth insulating film, the second planarization film, and the sixth insulating film using a patterning process to form the fifth insulating layer covering the pattern of the fourth conductive layer, the second planarization layer disposed on a side of the fifth insulating layer away from the base substrate, and a sixth insulating layer disposed on a side of the second planarization layer away from the base substrate, a plurality of bonding holes are disposed on the fifth insulating layer, the second planarization layer, and the sixth insulating layer, as shown in FIG. 27.

In an exemplary embodiment, the plurality of bonding holes include at least a plurality of first bonding holes K1 and a plurality of second bonding holes K2, the plurality of first binding holes K1 and the plurality of second binding holes K2 are all located in a region where the blank unit KB is located.

In an exemplary embodiment, the first bonding hole K1 may be in a shape of rectangular, an orthographic projection of the first bonding hole K1 on the base substrate is within a range of an orthographic projection of the anode connection electrode 13 on the base substrate, the sixth insulating film, the second planarization film and the fifth insulating film in the first bonding hole K1 are removed to expose a surface of the anode connection electrode 13, the region of the anode connection electrode 13 exposed by the first bonding hole K1 may serve as an anode pad, and the first bonding hole K1 is configured such that the first electrode of the light emitting diode is bound and connected with the anode connection electrode 13 through the bonding hole.

In an exemplary embodiment, the second bonding hole K2 may be in a shape of rectangular. An orthographic projection of the second bonding hole K2 of the first circuit unit Q1 on the base substrate is within a range of an orthographic projection of the first low-voltage power supply line VSS1 on the base substrate. The sixth insulating film, the second planarization film and the fifth insulating film in the second bonding hole K2 are removed to expose a surface of the first low-voltage power supply line VSS1. The region of the first low-voltage power supply line VSS1 exposed by the second bonding hole K2 can serve as a cathode pad for connecting the first light emitting diode. The second bonding hole K2 is configured such that the second electrode of the first light emitting diode is connected to the first low-voltage power supply line VSS1 through the bonding hole. An orthographic projection of the second bonding hole K2 of the second circuit unit Q2 and the third circuit unit Q3 on the base substrate is within an orthographic projection of the second low-voltage power supply line VSS2 on the base substrate. The sixth insulating film, the second planarization film and the fifth insulating film in the second bonding hole K2 are removed to expose a surface of the second low-voltage power supply line VSS2. The region of the second low-voltage power supply line VSS2 exposed by the second bonding hole K2 can serve as a cathode pad connecting the second light emitting diode and the third light emitting diode. The second bonding hole K2 is configured such that the second electrodes of the second light emitting diode and the third light emitting diode are connected to the second low-voltage power supply line VSS2 through the bonding hole respectively.

So far, preparation of a drive circuit layer on the base substrate according to the present exemplary embodiment is completed.

By setting the width-length ratio of the third transistor in the first circuit unit to be greater than the width-length ratio of the third transistor in the second circuit unit and the third circuit unit, and setting the capacitance value of the storage capacitor in the first circuit unit to be larger than the capacitance value of the storage capacitor in the second circuit unit and the third circuit unit, the display substrate provided by the exemplary embodiment of the present disclosure can not only meet the current value required for the red light emitting diode, achieve more grayscales, avoid the defects of the inadequacy of brightness or the inability to achieve more grayscale in existing structures, but also effectively reduce the jump of the gate voltage of the third transistor, and ensure the correct writing of the gate voltage.

By adopting the first capacitor, the second capacitor and the storage capacitor in a parallel structure, the present disclosure minimizes the space occupied by the first capacitor, the second capacitor and the storage capacitor on the premise of ensuring the capacitance capacity, which is beneficial to achieving a high-resolution display. By forming a high-frequency signal line of a network connecting structure, the present disclosure can reduce the resistance of the high-frequency signal line to the maximum extent, reduce the voltage drop of the high-frequency signal, effectively improve the uniformity of the power supply voltage in the display substrate, and effectively improve the uniformity in the signal plane. By forming the high-voltage power supply line and the low-voltage power supply line of a net connecting structure, the present disclosure can minimize the resistance of a power supply transmission line, reduce the voltage drop of the power supply voltage, effectively improve the uniformity of the power supply voltage in the display substrate, effectively improve the uniformity in the signal plane, effectively improve the display uniformity, and improve the display attribute and the display quality.

By adding a first low-voltage power supply line and a second low-voltage power supply line, the present disclosure can effectively reduce power consumption and minimize power consumption. Research indicates that there is a difference in the voltage between the two ends of each of R chip, G chip and B chip when driving the light-emitting diode to emit light. For example, when the output brightness is the same, the voltage required across R chip is about 2V lower than the voltage required across the B chip. If the voltage of the low-voltage power supply is designed according to the cross-voltage requirement for B chip, the cross-voltage for R chip will exceed the cross-voltage requirement, thus increasing the power consumption. By designing the low-voltage power supply of the R chip and the G/B chip independently, using a first low-voltage power supply line to provide a first low-voltage power supply signal for the R chip and using a second low-voltage power supply line to provide a second low-voltage power supply signal for the G/B chip, and separately controlling the low-voltage power supply voltages of different chips respectively, the present disclosure can effectively reduce the power consumption and minimize the power consumption under the condition of ensuring the normal driving of the pixel drive circuit. Experimental verification shows that, compared to the structure in which the display substrate adopts one low-voltage power supply line, the present disclosure can reduce the overall power consumption by more than 12% by adopting two low-voltage power supply lines, setting the low-voltage power supply voltage of the first low-voltage power supply line to be 6.6 V, and the low-voltage power supply voltage of the second low-voltage power supply line to be 4.6 V.

Figure 28:
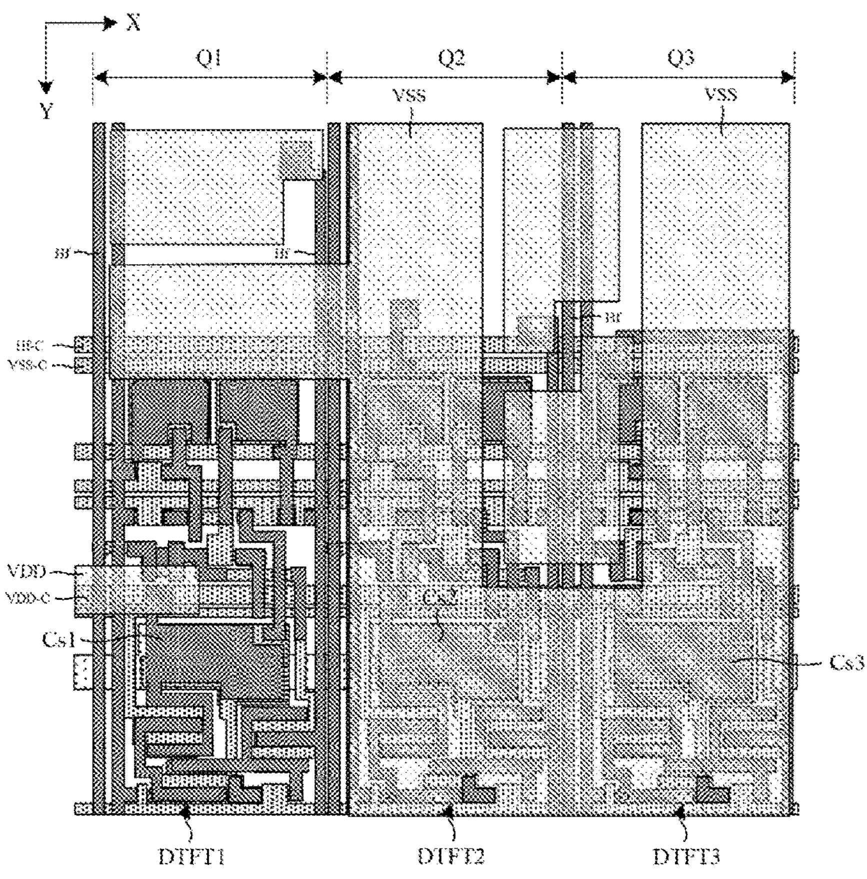
FIG. 28 is a schematic diagram of a structure of another display substrate according to an exemplary embodiment of the present disclosure.

FIG. 28 is a schematic diagram of a structure of another display substrate according to an exemplary embodiment of the present disclosure, illustrating a structure of three circuit units including the pixel drive circuit shown in FIG. 16. As shown in FIG. 28, the plurality of circuit units may include at least a first circuit unit Q1, a second circuit unit Q2, and a third circuit unit Q3 arranged sequentially along the first direction X. The first pixel drive circuit in the first circuit unit Q1 is configured to be connected to the first light emitting diode, the second pixel drive circuit in the second circuit unit Q2 is configured to be connected to the second light emitting diode, and the third pixel drive circuit in the third circuit unit Q3 is configured to be connected to the third light emitting diode. The first light emitting diode may be a red light emitting diode, the second light emitting diode may be a green light emitting diode, and the third light emitting diode may be a blue light emitting diode.

In an exemplary embodiment, the width-length ratio of the first drive transistor DTFT1 may be greater than the width-length ratio of the second drive transistor DTFT2 and the third drive transistor DTFT3, and the capacitance value of the first storage capacitor Cs1 may be substantially the same as that of the second storage capacitor Cs2 and the third storage capacitor Cs3.

In an exemplary embodiment, at least one circuit unit may include a high-frequency connection line Hf-C extending along the first direction X and a high-frequency signal line Hf extending along the second direction Y. The high-frequency signal line Hf may be connected to the high-frequency connection line Hf-C through a via to form a net-like connecting structure for transmitting a high-frequency signal.

In an exemplary embodiment, at least one circuit unit may include a high-voltage connection line VDD-C extending along the first direction X and a high-voltage power supply line VDD extending along the second direction Y. The high-voltage connection line VDD is connected to a corresponding pixel drive circuit, and the high-voltage power supply line VDD may be connected to the high-voltage connection line VDD-C through a via to form a net-like connecting structure for transmitting a high-voltage power supply signal.

In an exemplary embodiment, at least one circuit unit may include a low-voltage connection line VSS-C extending along the first direction X and a low-voltage power supply line VSS extending along the second direction Y. The low-voltage power supply line VSS may be connected to the low-voltage connection line VSS-C through a via to form a net-like connecting structure for transmitting a low-voltage power supply signal.

In an exemplary embodiment, the structure of the drive transistor of the present embodiment may be substantially the same as that of the drive transistor shown in FIG. 17, and the structure of the storage capacitor of the present embodiment may be substantially the same as that of the storage capacitor shown in FIG. 17, except that the areas of the first storage capacitor Cs1, the second storage capacitor Cs2, and the third storage capacitor Cs3 may be substantially the same.

In an exemplary embodiment, the preparation process of the drive circuit layer of the present embodiment may include the following operations.

Figure 29:
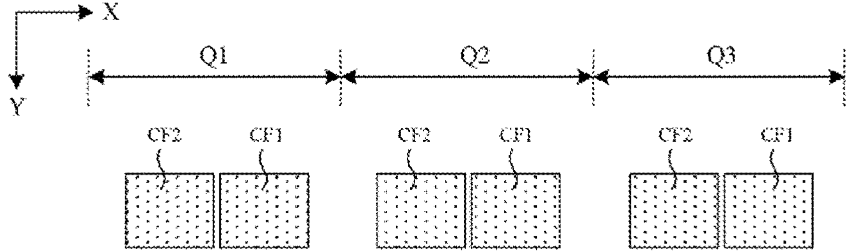
FIG. 29 is a schematic diagram of yet another display substrate after a pattern of a first conductive layer is formed according to the present disclosure.
Figure 29:
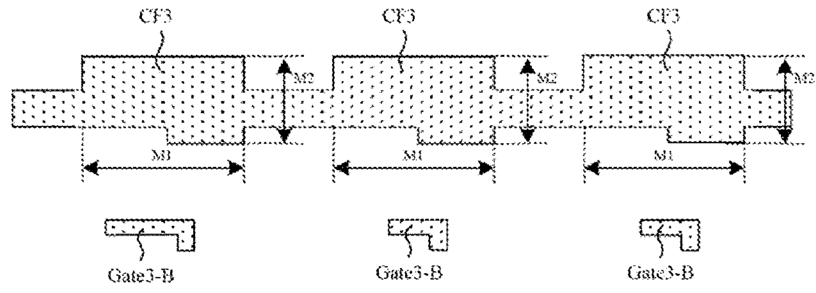

(31) A pattern of a first conductive layer is formed. The pattern of the first conductive layer of each circuit unit may include at least a first plate CF1, a second plate CF2, a third plate CF3, and a third bottom gate electrode Gate3-B, as shown in FIG. 29.

In an exemplary embodiment, the first plate CF1, second plate CF2 and third plates CF3 may be in a shape of rectangular, rectangle corners may be set with chamfer, the first plate CF1 and second plate CF2 may be disposed on a side of the circuit unit in an opposite direction of the second direction Y, the third bottom gate electrode Gate3-B may be disposed on a side of the circuit unit in the second direction Y, and the third plate CF3 may be disposed between the first plate CF1 and the third bottom gate electrode Gate3-B. Different from the structure shown in FIG. 20, the first plate CF1 is disposed on a side of the second plate CF2 in the first direction X.

In an exemplary embodiment, the position and shape of the third plate CF3 in the three circuit units may be substantially the same, the first length M1 and the second length M2 of the third plate CF3 in the three circuit units may be substantially the same, and the area of the third plate CF3 in the three circuit units may be substantially the same.

In an exemplary embodiment, the position, shape and size of the third bottom gate electrode Gate3-B may be substantially the same as the structure shown in FIG. 20.

Figure 30:
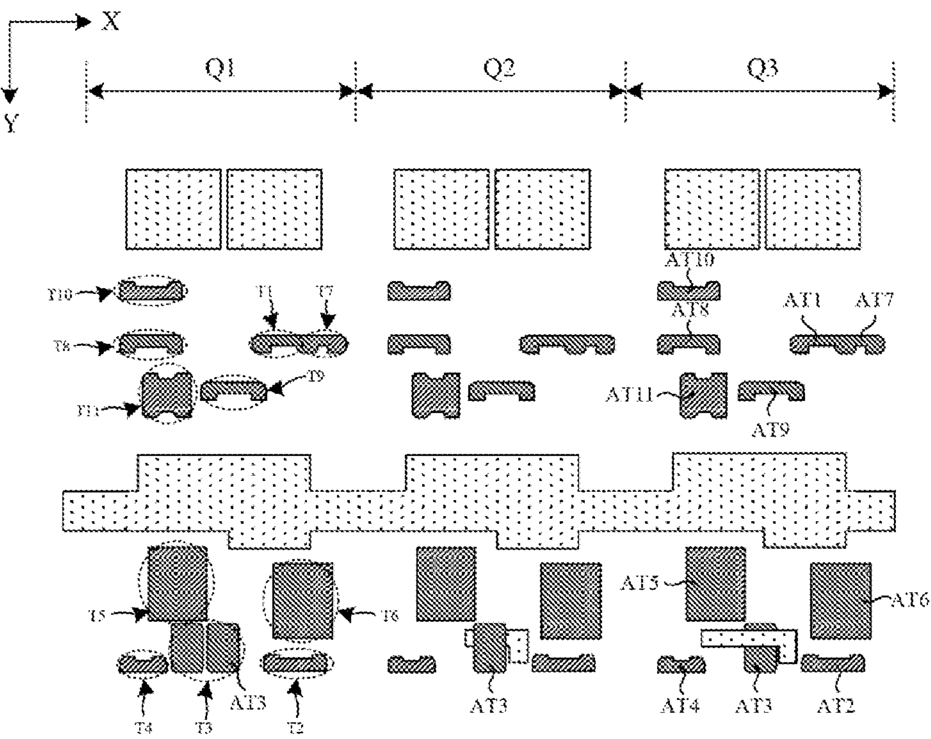
FIG. 30 is a schematic diagram of yet another display substrate after a pattern of a semiconductor layer is formed according to the present disclosure.

(32) A pattern of a semiconductor layer is formed. The pattern of the semiconductor layer of each circuit unit may include at least a first active layer AT1 of the first transistor T1 to an eleventh active layer AT11 of the eleventh transistor T11, as shown in FIG. 30.

In an exemplary embodiment, the positions and shapes of the first active layer AT1 to the eleventh active layer AT11 may be substantially the same as the structures shown in FIGS. 21A and 21B, except that the tenth active layer AT10 may be located on a side of the second plate CF2 in the second direction Y, and the eighth active layer AT8 may be located on a side of the tenth active layer AT10 in the second direction Y.

Figure 31:
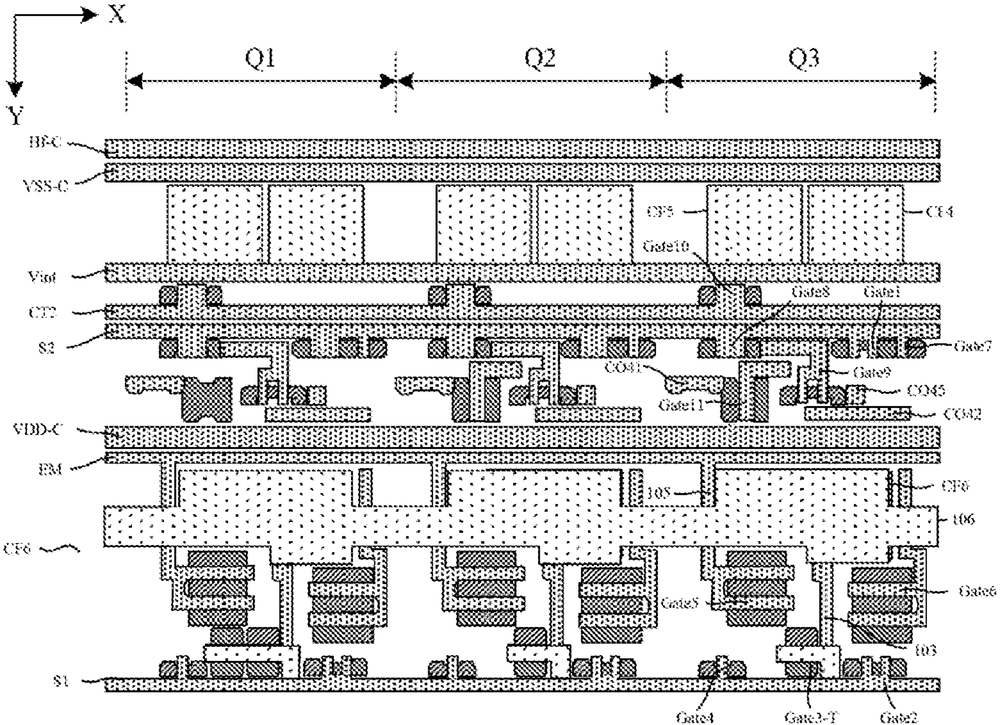
FIG. 31 is a schematic diagram of yet another display substrate after a pattern of a second conductive layer is formed according to the present disclosure.

(33) A pattern of a second conductive layer is formed. The pattern of the second conductive layer of each circuit unit includes at least a fourth plate CF4, a fifth plate CF5, a sixth plate CF6, a first scan signal line S1, a second scan signal line S2, a light emitting signal line EM, a second control line CT2, an initial signal line Vint, a high frequency connection line Hf-C, a high-voltage connection line VDD-C, a low-voltage connection line VSS-C, a plurality of gate electrodes and a plurality of connection electrodes, as shown in FIG. 31.

In an exemplary embodiment, the positions of the fourth plate CF4, fifth plate CF5 and sixth plate CF6 may be substantially the same as the structures shown in FIGS. 22A and 22B, except that the fourth plate CF4 is disposed on a side of the fifth plate CF5 in the first direction X, and the position, shape and size of the sixth plate CF6 in the first circuit unit Q1, the second circuit unit Q2 and the third circuit unit Q3 may be substantially the same.

In an exemplary embodiment, the positions and shapes of the first scan signal line S1, the second scan signal line S2, the light emitting signal line EM, the second control line CT2, the initial signal line Vint, the high frequency connection line Hf-C, the high-voltage connection line VDD-C, and the low-voltage connection line VSS-C may be substantially the same as those shown in FIGS. 22A and 22B, except that only one low-voltage connection line VSS-C is provided in the present embodiment, and the second scan signal line S2 is reused as the first control line to control the eighth transistor T8 to be turned on and turned off.

In an exemplary embodiment, the plurality of gate electrodes of each circuit unit may include at least a first gate electrode Gate1, a second gate electrode Gate2, a third top gate electrode Gate3-T, a fourth gate electrode Gate4, a fifth gate electrode Gate5, a sixth gate electrode Gate6, a seventh gate electrode Gate7, an eighth gate electrode Gate8, a ninth gate electrode Gate9, a tenth gate electrode Gate10, and an eleventh gate electrode Gate11.

In an exemplary embodiment, the plurality of connection electrodes of each circuit unit includes at least a forty-first connection electrode CO41, a forty-second connection electrode CO42, and a forty-fifth connection electrode CO45, and the positions and shapes of the forty-first connection electrode CO41, the forty-second connection electrode CO42, and the forty-fifth connection electrode CO45 may be substantially the same as the structures shown in FIGS. 22A and 22B.

Figure 32:
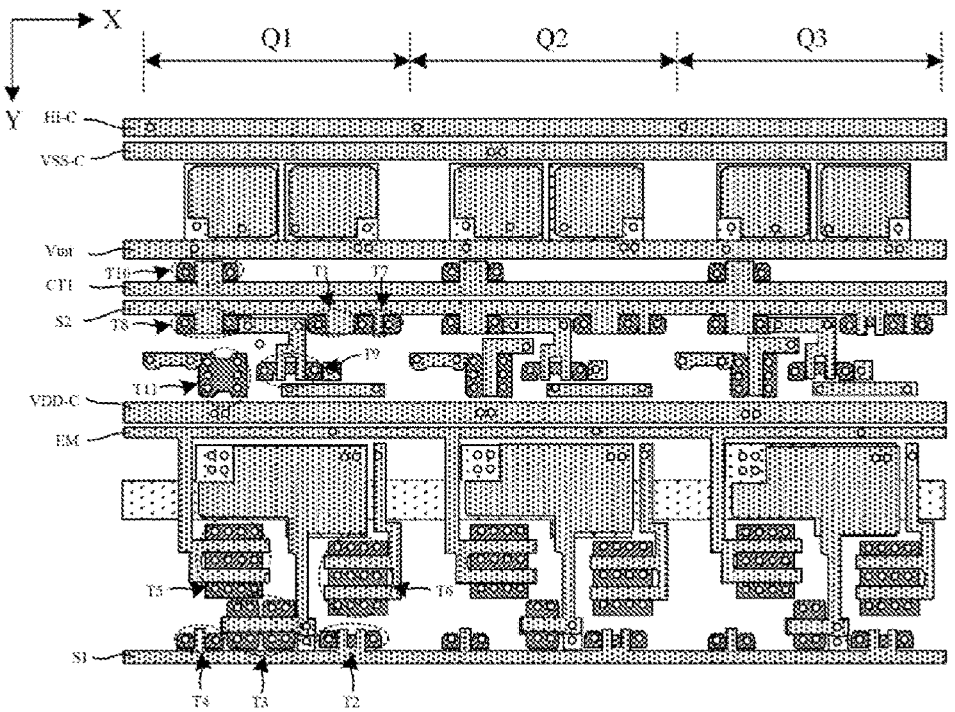
FIG. 32 is a schematic diagram of yet another display substrate after a pattern of a third insulating layer is formed according to the present disclosure.

(34) A pattern of a third insulation layer is formed. A plurality of vias are provided on the third insulating layer in each circuit unit, as shown in FIG. 32.

In an exemplary embodiment, the positions and functions of the plurality of vias may be substantially the same as the structure shown in FIG. 23, except that because the forty-third connection electrode and the forty-fourth connection electrode are not provided, and the shapes of the ninth gate electrode Gate 9 and the eleventh gate electrode Gate 11 are different, thus the positions of corresponding vias are different, which will not be repeated here.

Figure 33:
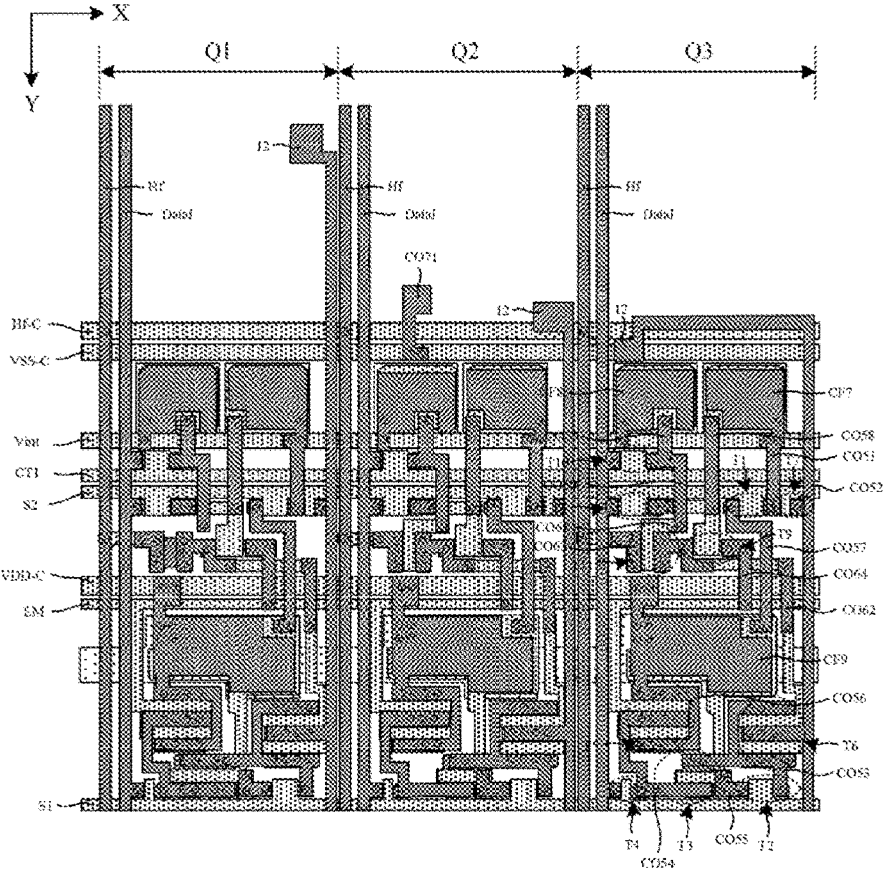
FIG. 33 is a schematic diagram of yet another display substrate after a pattern of a third conductive layer is formed according to the present disclosure.

(35) A pattern of a third conductive layer is formed. The pattern of the third conductive layer includes at least a data signal line DataI, a high-frequency signal line Hf, a seventh plate CF7, an eighth plate CF8, a ninth plate CF9, an anode connection block 12, and a plurality of connection electrodes, as shown in FIG. 33.

In an exemplary embodiment, the positions, shapes, and connection structures of the data signal lines DataI, the high-frequency signal lines Hf, the seventh plate CF7, eighth plate CF8, and ninth plate CF9 may be substantially the same as those shown in FIGS. 24A and 24B, except that the seventh plate CF7 is disposed on a side of the eighth plate CF8 in the first direction X, and the size and area of the ninth plate CF9 in the first circuit unit Q1, second circuit unit Q2, and third circuit unit Q3 may be substantially the same.

In an exemplary embodiment, the plurality of connection electrodes may include at least a fifty-first connection electrode CO51, a fifty-second connection electrode CO52, a fifty-third connection electrode CO53, a fifty-fourth connection electrode CO54, a fifty-fifth connection electrode CO55, a fifty-sixth connection electrode CO56, a fifty-seventh connection electrode CO57, a fifty-eighth connection electrode CO58, a fifty-ninth connection electrode CO59, a sixty-first connection electrode CO60, a sixty-first connection electrode CO61, a sixty-second connection electrode CO62, a sixty-third connection electrode CO63, and a sixty-fourth connection electrode CO64. The position, shape, and connection structure of the above-mentioned connection electrodes may be substantially the same as those shown in FIGS. 24A and 24B, except that the fifty-first connection electrode CO51 is connected to the seventh plate CF7 through a via, the fifty-eighth connection electrode CO58 is connected to the eleventh gate electrode Gate 11, the fifty-ninth connection electrode CO59 is connected to the ninth gate electrode Gate 9, and the like, which will not be described here.

In an exemplary embodiment, the anode connection block 12 and the fifty-second connection electrode CO52 of each circuit unit are of an interconnected integral structure.

In an exemplary embodiment, the third conductive layer may further include a seventy-first connection electrode CO71. The seventy-first connection electrode CO71 may have a shape of a strip extending along the second direction Y, the seventy-first connection electrode CO71 may be provided in the second circuit unit Q2, one end of the seventy-first connection electrode CO71 is connected to the low-voltage connection line VSS-C through a via, and the seventy-first connection electrode CO71 is configured to be connected to the power supply low-voltage line formed subsequently.

Figure 34:
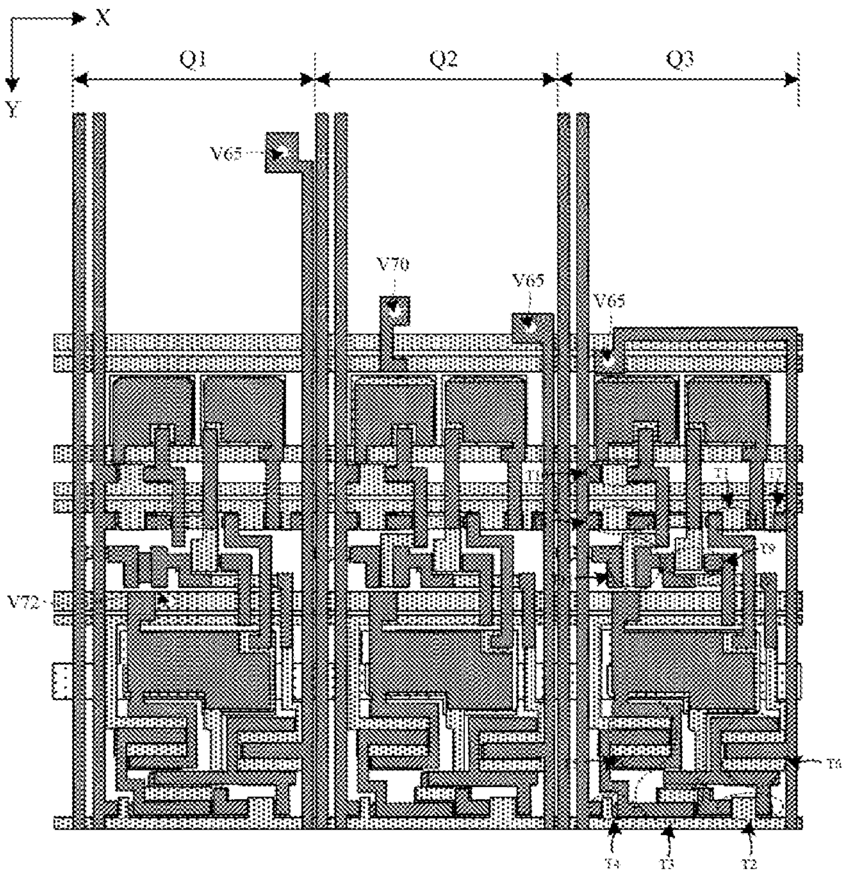
FIG. 34 is a schematic diagram of yet another display substrate after a pattern of a first planarization layer is formed according to the present disclosure.

(36) Patterns of a fourth insulation layer and a first planarization layer are formed. A plurality of vias are provided on the fourth insulating layer and the first planarization layer in each circuit unit, as shown in FIG. 34.

In an exemplary embodiment, the plurality of vias may include at least a sixty-fifth via V65, a seventieth via V70, and a seventy-second via V72, and the positions and functions of the plurality of vias may be substantially the same as the structure shown in FIG. 25.

Figure 35A:
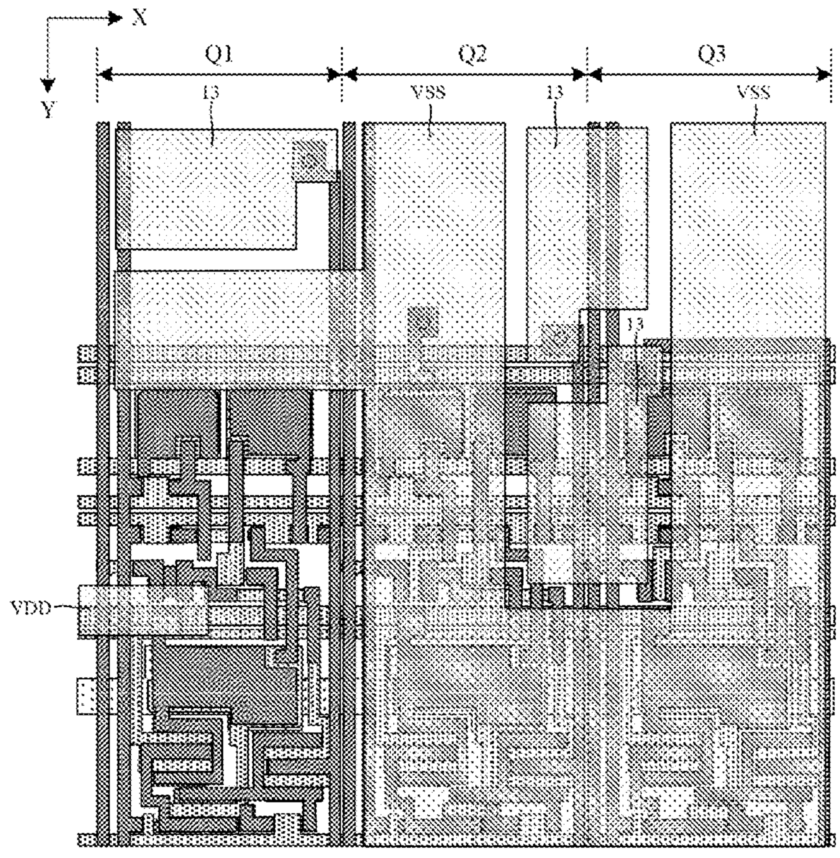
FIG. 35A is a schematic diagram of yet another display substrate after a pattern of a fourth conductive layer is formed according to the present disclosure.
Figure 35B:
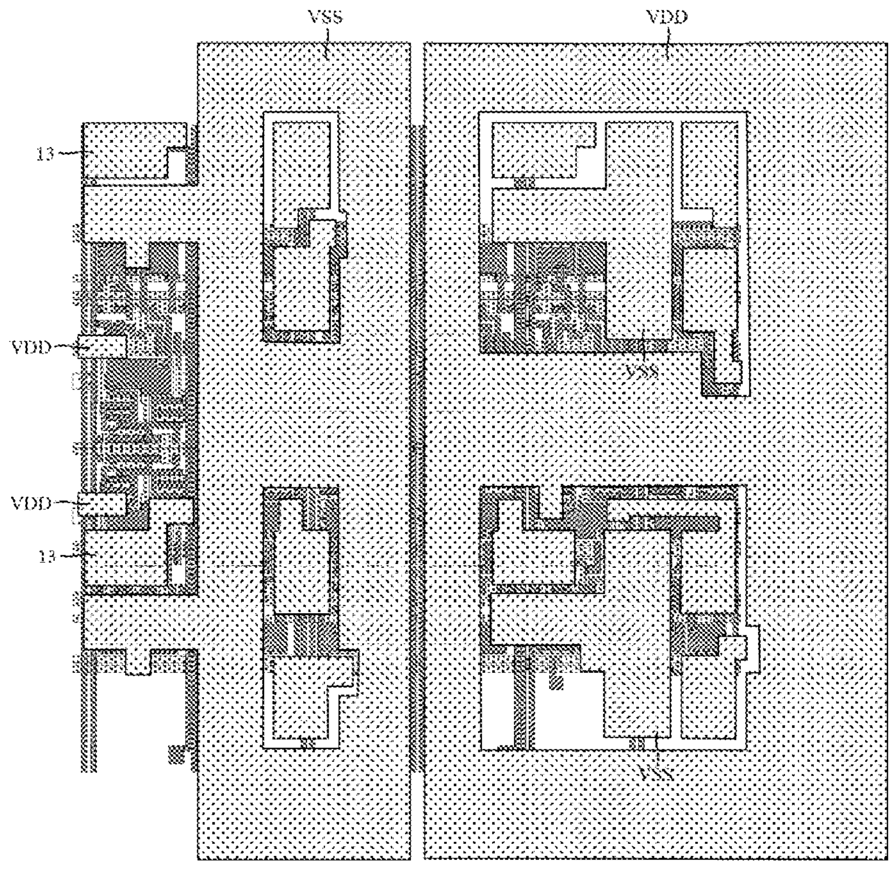
FIG. 35B is a schematic diagram of another power supply wiring according to an exemplary embodiment of the present disclosure.

(37) A pattern of a fourth conductive layer is formed. The pattern of the fourth conductive layer may include at least an anode connection electrode 13, a high-voltage power supply line VDD, and a low-voltage power supply line VSS, as shown in FIGS. 35A and 35B, FIG. 35B is a schematic diagram of another power supply wiring of an exemplary embodiment of the present disclosure, illustrating structures of high-voltage power supply lines and low-voltage power supply lines in a plurality of circuit units.

In an exemplary embodiment, the high-voltage power supply line VDD and the low-voltage power supply line VSS may have a shape of a line extending along the second direction Y, the high-voltage connection line VDD-C extending along the first direction X is connected with the high-voltage power supply line VDD extending along the second direction Y through a via to form a net-like connecting structure for transmitting a high-voltage power supply signal, and the low-voltage connection line VSS-C extending along the first direction X is connected with the low-voltage power supply line VSS extending along the second direction Y through a via to form a net-like connecting structure for transmitting a low voltage power supply signal.

A high-voltage opening and a low-voltage opening are respectively provided on the high-voltage power supply line VDD and the low-voltage power supply line VSS, a “T”-shaped low-voltage power supply line and three anode connection electrodes 13 may be provided in the high-voltage opening, two anode connection electrodes 13 may be provided in the low-voltage opening, and the low-voltage power supply line is configured to be connected with the second electrode of the light emitting diode. A side of the low-voltage power supply line VSS close to the high-voltage power supply line VDD is provided with a pad block configured to be connected with the second electrode of the light emitting diode.

In an exemplary embodiment, the position, shape and connection structure of the anode connection electrode 13 may be substantially the same as structures shown in FIGS. 26A and 26B and will not be repeated here.

Figure 36:
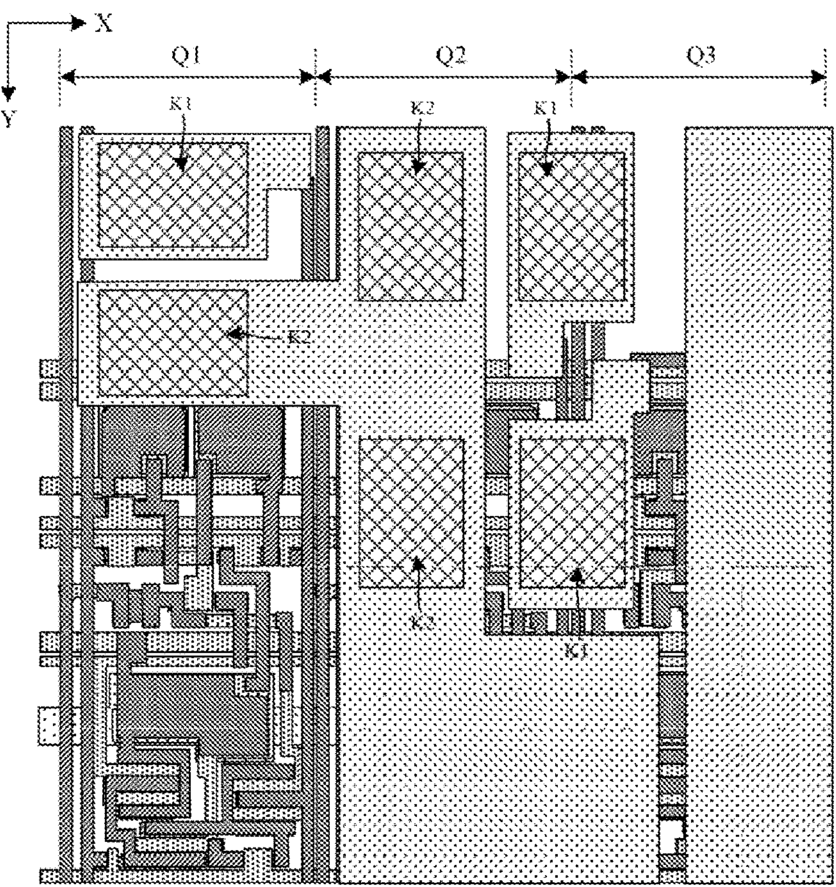
FIG. 36 is a schematic diagram of yet another display substrate after a pattern of a second planarization layer is formed according to the present disclosure.

(38) Patterns of a fifth insulating layer and a second planarization layer are formed. A first bonding hole K1 and a second bonding hole K2 are provided on the fifth insulating layer, the second planarization layer and the sixth insulating layer in each circuit unit, as shown in FIG. 36.

In an exemplary embodiment, the position and function of the bonding holes may be substantially the same as the structure shown in FIG. 27.

So far, preparation of a drive circuit layer on the base substrate according to the present exemplary embodiment is completed.

By setting the width-length ratio of the third transistor in the first circuit unit to be greater than the width-length ratio of the third transistor in the second circuit unit and the third circuit unit, the display substrate provided by the exemplary embodiment of the present disclosure can meet the current value required for the red light emitting diode, achieve more grayscales, avoid the defects of the inadequacy of brightness or the inability to achieve more grayscale in existing structures.

By adopting the first capacitor, the second capacitor and the storage capacitor in a parallel structure, the present disclosure minimizes the space occupied by the first capacitor, the second capacitor and the storage capacitor on the premise of ensuring the capacitance capacity, which is beneficial to achieving a high-resolution display. By forming a high-frequency signal line of a network connecting structure, the present disclosure can reduce the resistance of the high-frequency signal line to the maximum extent, reduce the voltage drop of the high-frequency signal, effectively improve the uniformity of the power supply voltage in the display substrate, and effectively improve the uniformity in the signal plane. By forming the high-voltage power supply line and the low-voltage power supply line of a net connecting structure, the present disclosure can minimize the resistance of a power supply transmission line, reduce the voltage drop of the power supply voltage, effectively improve the uniformity of the power supply voltage in the display substrate, effectively improve the uniformity in the signal plane, effectively improve the display uniformity, and improve the display attribute and the display quality.

In an exemplary embodiment, the preparation process of the display substrate requires a plurality of detections, and one important detection is a picture detection using a detection circuit CT, also known as CT detection. CT detection is performed by inputting a detection signal to the display substrate so that light-emitting diodes emit light, and checking whether each light-emitting diode is in good condition using a defect detection apparatus to confirm whether the display substrate has defects.

Figure 37:
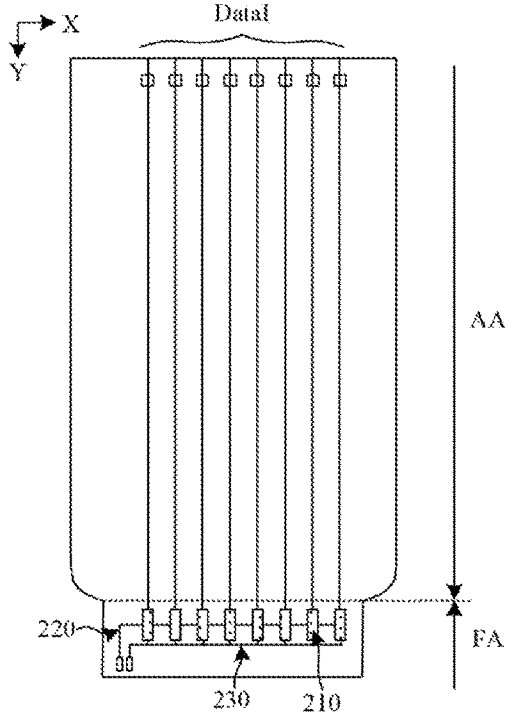
FIG. 37 is a schematic diagram of CT detection on a display substrate.

FIG. 37 is a schematic diagram of CT detection on a display substrate. As shown in FIG. 37, the display substrate may include a display region AA and a bonding region FA located on a side of the display region AA, the display region AA may include a plurality of circuit units which may include at least a pixel drive circuit and a plurality of light emitting units which may include at least a light emitting diode, the light emitting diode may be connected to the pixel drive circuit of the corresponding circuit unit. The display region AA may further include a plurality of data signal lines DataI each connected to a plurality of pixel drive circuits in one unit column.

In an exemplary embodiment, the bonding region FA may include a detection circuit which may include at least a plurality of detection units 210, at least one control line 220 and at least one detection line 230. The plurality of detection units 210 may be sequentially arranged at set intervals along the first direction X. And the positions of the plurality of detection units 210 may correspond one by one with the positions of the plurality of data signal lines DataI in the display region AA. Each of the detection units 210 may include a control terminal, an input terminal and an output terminal, one end of the control line 220 is connected correspondingly to a pin in a bonding pin region, and the other end of the control line 220 may be connected correspondingly to the control terminals of the plurality of detection units 210, and the control line 220 is configured to control on or off of the plurality of detection units 210. One end of the detection line 230 is correspondingly connected to a pin in the bonding pin region, the other end of the detection line 230 may be correspondingly connected to the input terminals of the plurality of detection units 210, and the output terminals of the plurality of detection units 210 may be correspondingly connected to a plurality of data signal lines DataI of the display region AA. The detection unit 210 is configured to output the signal output from the detection line 230 to the data signal line DataI of the display region AA to achieve CT detection of the display substrate under the control of the control line 220.

Figure 38:
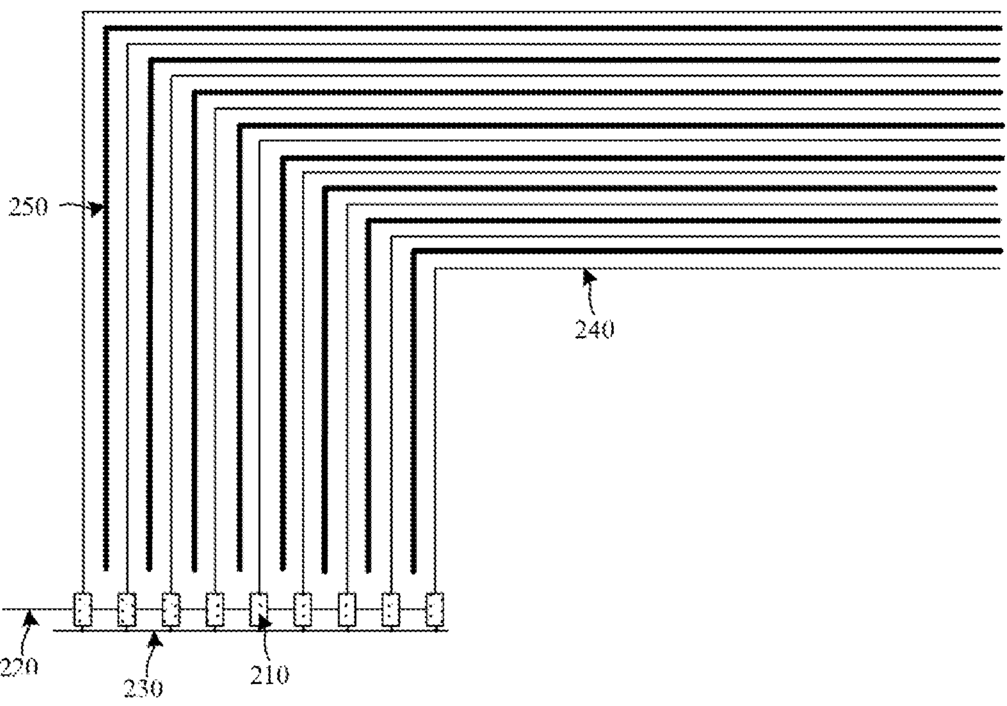
FIG. 38 is a schematic diagram of a structure of a detection circuit according to an exemplary embodiment of the present disclosure.

FIG. 38 is a schematic diagram of a structure of a detection circuit according to an exemplary embodiment of the present disclosure. As shown in FIG. 38, the detection circuit may include at least a plurality of detection units 210, a control line 220 and a detection line 230, the output terminals of the plurality of detection units 210 may be correspondingly connected to a plurality of data signal lines DataI of the display region through a plurality of transmission lines 240, the plurality of transmission lines 240 may have a shape of a bending line extending toward the display region, and the spacing between adjacent transmission lines 240 may be substantially the same.

In an exemplary embodiment, a shielding line 250 may be disposed between at least one transmission line 240 and an adjacent transmission line 240, and the shielding line 250 may be substantially identical in shape to the transmission line 240.

In an exemplary embodiment, the transmission line 240 and the shielding line 250 may be disposed in the same layer and formed synchronously through the same patterning process.

In an exemplary embodiment, the distance between an edge of the shielding line 250 on a side close to the transmission line 240 and an edge of the transmission line 240 on a side close to the shielding line 250 may be about 10 μm to 20 μm. For example, the distance between an edge of the shielding line 250 on a side close to the transmission line 240 and an edge of the transmission line 240 on a side close to the shielding line 250 may be about 15 μm.

In an exemplary embodiment, the shielding line 250 may be connected to a constant voltage signal line or a ground signal line and the shielding line 250 is configured to reduce data voltage jump of the transmission line 240 due to the coupling capacitance.

In an exemplary embodiment, the constant voltage signal line may be a high-voltage power supply line or may be a low voltage power supply line or may be an initial signal line.

Figure 39:
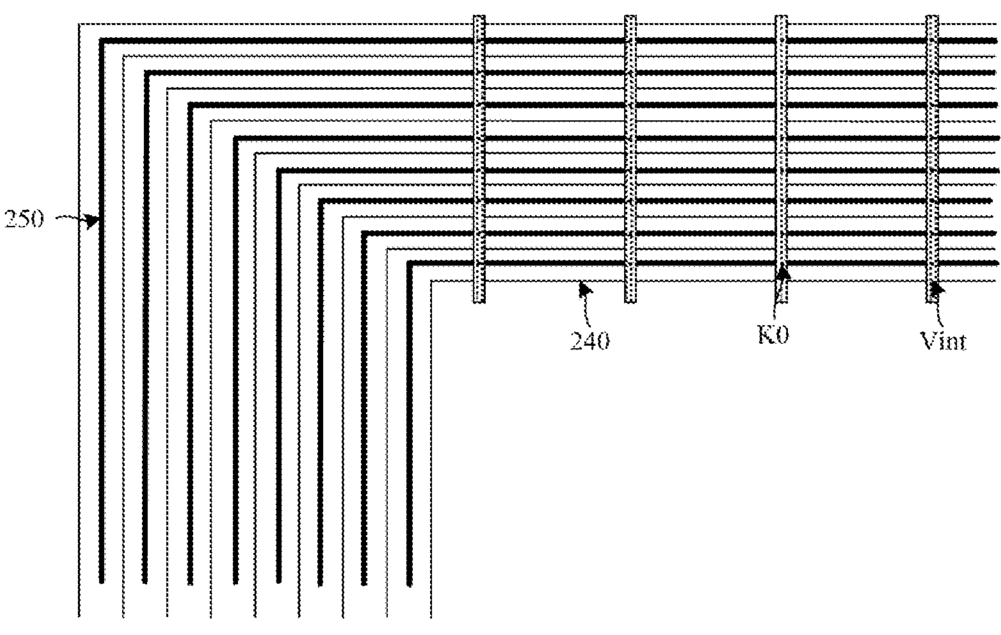
FIG. 39 is a schematic diagram of a connection between a shielding line and a constant voltage signal line according to an exemplary embodiment of the present disclosure.

FIG. 39 is a schematic diagram of a connection between a shielding line and a constant voltage signal line according to an exemplary embodiment of the present disclosure. As shown in FIG. 39, the constant voltage signal line may be an initial signal line Vint, and the shielding line 250 and the initial signal line Vint may be disposed in different conductive layers, and the shielding line 250 may be connected to the initial signal line Vint through a via K0.

In an exemplary embodiment, the initial signal line Vint may be connected to a plurality of shielding lines 250 through a plurality of vias K0, respectively, to provide a constant voltage signal for the plurality of shielding lines 250.

In an exemplary embodiment, the quantity of the initial signal line Vint may be plural to improve connection reliability.

By providing shielding lines between transmission lines of the detection circuit, the present disclosure can effectively shield coupling capacitance between adjacent transmission lines and reduce data voltage jump. Research indicates that when the detection circuit carries out CT detection, due to the presence of coupling capacitance between adjacent transmission lines, the coupling capacitance will lead to data voltage jump, resulting in testing errors. In the present disclosure, shielding lines are provided between transmission lines of the detection circuit, the shielding lines are connected with the constant voltage signal line, and the shielding lines with constant voltage can effectively shield the coupling capacitance between the adjacent transmission lines, thus the data voltage jump is effectively reduced, which not only improves the accuracy of the test data, but also does not need additional signals, and does not have an impact on the data voltage.

It should be noted that structures and preparation processes shown in the exemplary embodiments of the present disclosure are merely exemplary descriptions, and corresponding structures may be changed and patterning processes may be increased or decreased according to actual needs, and the embodiment of the present disclosure is not specifically limited herein.

The display substrate provided by the exemplary embodiments of the present disclosure can be applied to any LED driving pixel circuit, including P-type PAM, P-type PAM+PWM, N-type PAM, N-type PAM+PWM, LTPO-type PAM and PAM+PWM circuits, etc.

An embodiment of the present disclosure further provides a preparation method for a display substrate to prepare the aforementioned display substrate. In an exemplary implementation, the method may include the following steps.

Forming a drive circuit layer on a base substrate, the drive circuit layer comprises a plurality of circuit units comprising at least a first circuit unit, a second circuit unit and a third circuit unit, the first circuit unit comprises a first pixel drive circuit comprising at least a first drive transistor, the second circuit unit comprises a second pixel drive circuit comprising at least a second drive transistor, the third circuit unit comprises a third pixel drive circuit comprising at least a third drive transistor; a channel width of the first drive transistor is larger than that of the second drive transistor or the third drive transistor, and a channel length of the first drive transistor is the same as that of the second drive transistor or the third drive transistor.

An exemplary embodiment of the present disclosure further provides a display apparatus, which includes the display substrate of the foregoing embodiments. The display apparatus may be any product or component with a display function, such as a mobile phone, a tablet computer, a television, a display, a laptop computer, a digital photo frame, or a navigator.

The drawings of the present disclosure only involve structures involved in the present disclosure, and other structures may be referred to conventional designs. The embodiments of the present disclosure and features in the embodiments may be combined with each other to obtain new embodiments if there is no conflict. Those of ordinary skills in the art should understand that modifications or equivalent replacements may be made on the technical solutions of the present disclosure without departing from the spirit and scope of the technical solutions of the present disclosure, and shall all fall within the scope of the claims of the present disclosure.

The invention claimed is:

1. A display substrate, comprising:

a drive circuit layer disposed on a base substrate, wherein the drive circuit layer comprises a plurality of circuit units, the plurality of circuit units comprise at least a first circuit unit, a second circuit unit and a third circuit unit, the first circuit unit comprises a first pixel drive circuit comprising at least a first drive transistor, the second circuit unit comprises a second pixel drive circuit comprising at least a second drive transistor, the third circuit unit comprises a third pixel drive circuit comprising at least a third drive transistor; a channel width of the first drive transistor is larger than a channel width of the second drive transistor or the third drive transistor, and a channel length of the first drive transistor is the same as a channel length of the second drive transistor or the third drive transistor;

wherein the first pixel drive circuit further comprises a first storage capacitor, the second pixel drive circuit further comprises a second storage capacitor, and the third pixel drive circuit further comprises a third storage capacitor; a capacitance value of the first storage capacitor is greater than or equal to a capacitance value of the second storage capacitor or the third storage capacitor;

wherein an area of an orthographic projection of the first storage capacitor on the base substrate is larger than an area of an orthographic projection of the second storage capacitor or the third storage capacitor on the base substrate; and wherein a first length of the orthographic projection of the first storage capacitor on the base substrate is the same as a first length of the orthographic projection of the second storage capacitor or the third storage capacitor on the base substrate, a second length of the orthographic projection of the first storage capacitor on the base substrate is greater than or equal to a second length of the orthographic projection of the second storage capacitor or the third storage capacitor on the base substrate, the first length is a dimension in a first direction, the second length is a dimension in a second direction, and the first direction is intersected with the second direction.

2. The display substrate according to claim 1, wherein a ratio of the channel width of the first drive transistor to the channel width of the second drive transistor or the third drive transistor is 2 to 6.

3. The display substrate according to claim 1, wherein the channel width of the second drive transistor is the same as the channel width of the third drive transistor, and the channel length of the second drive transistor is the same as the channel length of the third drive transistor.

4. The display substrate according to claim 1, wherein a ratio of the second length of the orthographic projection of the first storage capacitor on the base substrate to the second length of the orthographic projection of the second storage capacitor or the third storage capacitor on the base substrate is 1 to 2.

5. The display substrate according to claim 1, wherein the first length of the orthographic projection of the second storage capacitor on the base substrate is the same as the first length of the orthographic projection of the third storage capacitor on the base substrate, and the second length of the orthographic projection of the second storage capacitor on the base substrate is the same as the second length of the orthographic projection of the third storage capacitor on the base substrate.

6. The display substrate according to claim 1, wherein the display substrate further comprises a light emitting structure layer disposed on a side of the drive circuit layer away from the base substrate, the light emitting structure layer comprises a plurality of light emitting units, the plurality of light emitting units comprise at least a red light emitting diode emitting red light, a green light emitting diode emitting green light, and a blue light emitting diode emitting blue light, the red light emitting diode is connected to the first pixel drive circuit, the green light emitting diode is connected to the second pixel drive circuit, and the blue light emitting diode is connected to the third pixel drive circuit.

7. The display substrate according to claim 1, wherein at least one circuit unit of the plurality of circuit units comprises a high-voltage connection line extending along the first direction and a high-voltage power supply line extending along the second direction, the high-voltage power supply line is connected to the high-voltage connection line through a via to form a net-like connecting structure for transmitting a high-voltage power supply signal.

8. The display substrate according to claim 1, wherein at least one circuit unit of the plurality of circuit units comprises a low-voltage connection line extending along the first direction and a low-voltage power supply line extending along the second direction, the low-voltage power supply line is connected to the low-voltage connection line through a via to form a net-like connecting structure for transmitting a low-voltage power supply signal.

9. The display substrate according to claim 8, wherein the low-voltage power supply line comprises a first low-voltage power supply line connected to a red light emitting diode and a second low-voltage power supply line connected to a green light emitting diode and a blue light emitting diode.

10. The display substrate according to claim 9, wherein at least one circuit unit comprises a first low-voltage connection line extending along the first direction, and the first low-voltage power supply line is connected to the first low-voltage connection line through a via to form a net-like connecting structure for transmitting a first low-voltage power supply signal.

11. The display substrate according to claim 9, wherein at least one circuit unit comprises a second low-voltage connection line extending along the first direction, and the second low-voltage power supply line is connected to the second low-voltage connection line through a via to form a net-like connecting structure for transmitting a second low-voltage power supply signal.

12. The display substrate according to claim 1, wherein at least one circuit unit of the plurality of circuit units comprises a high-frequency connection line extending in the first direction and a high-frequency signal line extending in the second direction, the high-frequency signal line is connected to the high-frequency connection line through a via to form a net-like connecting structure for transmitting a high-frequency signal.

13. The display substrate according to claim 1, wherein the display substrate further comprises a test circuit and a plurality of data signal lines connected to the pixel drive circuit, the detection circuit comprises at least a plurality of detection units and a plurality of transmission lines, the plurality of detection units are correspondingly connected to the plurality of data signal lines through the plurality of transmission lines, and a shielding line is provided between at least one transmission line and an adjacent transmission line, the shielding line is connected to a constant voltage signal line or a ground signal line.

14. The display substrate according to claim 13, wherein the distance between the at least one transmission line and the shielding line adjacent to the transmission line is 10 μm to 20 μm.

15. The display substrate according to claim 13, wherein the transmission line and the shielding line are disposed on a same layer.

16. A display apparatus comprising the display substrate according to claim 1.

17. A preparation method for a display substrate, comprising:

forming a drive circuit layer on a base substrate, wherein the drive circuit layer comprises a plurality of circuit units, the plurality of circuit units comprises at least a first circuit unit, a second circuit unit and a third circuit unit, the first circuit unit comprises a first pixel drive circuit comprising at least a first drive transistor, the second circuit unit comprises a second pixel drive circuit comprising at least a second drive transistor, the third circuit unit comprises a third pixel drive circuit comprising at least a third drive transistor; a channel width of the first drive transistor is larger than a channel width of the second drive transistor or the third drive transistor, and a channel length of the first drive transistor is the same as a channel length of the second drive transistor or the third drive transistor, wherein the first pixel drive circuit further comprises a first storage capacitor, the second pixel drive circuit further comprises a second storage capacitor, and the third pixel drive circuit further comprises a third storage capacitor; a capacitance value of the first storage capacitor is greater than or equal to a capacitance value of the second storage capacitor or the third storage capacitor;

wherein an area of an orthographic projection of the first storage capacitor on the base substrate is larger than an area of an orthographic projection of the second storage capacitor or the third storage capacitor on the base substrate; and wherein a first length of the orthographic projection of the first storage capacitor on the base substrate is the same as a first length of the orthographic projection of the second storage capacitor or the third storage capacitor on the base substrate, a second length of the orthographic projection of the first storage capacitor on the base substrate is greater than or equal to a second length of the orthographic projection of the second storage capacitor or the third storage capacitor on the base substrate, the first length is a dimension in a first direction, the second length is a dimension in a second direction, and the first direction is intersected with the second direction.

* * * * *